US012813005B2

(12) United States Patent
Yu et al.

(10) Patent No.: US 12,813,005 B2
(45) Date of Patent: Nov. 24, 2026

(54) PHOTOELECTRODES AND METHODS OF MAKING AND USE THEREOF

(71) Applicant: BOARD OF REGENTS, THE UNIVERSITY OF TEXAS SYSTEM, Austin, TX (US)

(72) Inventors: Edward T. Yu, Austin, TX (US); Soonil Lee, Austin, TX (US); Li Ji, Austin, TX (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 427 days.

(21) Appl. No.: 18/286,175

(22) PCT Filed: Apr. 18, 2022

(86) PCT No.: PCT/US2022/025206
§ 371 (c)(1),
(2) Date: Oct. 9, 2023

(87) PCT Pub. No.: WO2022/235423
PCT Pub. Date: Nov. 10, 2022

(65) Prior Publication Data

US 2024/0194802 A1 Jun. 13, 2024

Related U.S. Application Data

(60) Provisional application No. 63/176,628, filed on Apr. 19, 2021.

(51) Int. Cl.

| | |
|---|---|
| ***H10F 77/20*** | (2025.01) |
| ***H10F 71/00*** | (2025.01) |
| ***H10K 30/40*** | (2023.01) |

(52) U.S. Cl.
CPC ......... *H10F 77/206* (2025.01); *H10F 71/128* (2025.01); *H10K 30/40* (2023.02)

(58) Field of Classification Search
CPC ..... H10F 77/206; H10F 71/128; H10K 30/40; C25B 1/55; C25B 11/02; C25B 11/069;
(Continued)

(56) References Cited

U.S. PATENT DOCUMENTS 6,437,362 B2 * 8/2002 Suzuki ................ H10F 30/2255 257/E31.064
2006/0065301 A1 * 3/2006 Miyoshi ............... H01G 9/2031 136/263

(Continued)

FOREIGN PATENT DOCUMENTS

WO WO-2020135739 A1 * 7/2020 ............. H10K 85/50

OTHER PUBLICATIONS

Aroonratsameruang et al. Structure-property relationships in redox-derivatized metal-insulator-semiconductor (MIS) photoanodes. J Phys Chem C, 2020, 124(47), 25907-25916.

(Continued)

*Primary Examiner* — S M M Sohel Imtiaz
(74) *Attorney, Agent, or Firm* — Meunier Carlin & Curfman LLC

(57) ABSTRACT

Disclosed herein are photoelectrodes and methods of making and use thereof. For example, disclosed herein are photo-electrodes comprising: a light absorbing layer; an insulator layer disposed on the light absorbing layer, wherein the insulator layer has an average thickness of 20 nanometers (nm) or more; and a set of protrusions, wherein each protrusion penetrates through the insulator layer to the light absorbing layer, such that each protrusion is in physical and electrical contact with the light absorbing layer; and a plurality of particles disposed on the insulator layer, wherein
(Continued)

a least a portion of the plurality of particles are in physical and electrical contact with at least a portion of the set of protrusions; and wherein the plurality of particles and optionally the set of protrusions comprise a catalyst material.

19 Claims, 19 Drawing Sheets

(58) Field of Classification Search
CPC . C25B 11/081; H01M 4/9041; H01M 4/9075; H01M 4/8657
See application file for complete search history.

(56) References Cited

U.S. PATENT DOCUMENTS

2010/0133111 A1 * 6/2010 Nocera ............... H01M 14/005 205/633
2012/0112120 A1 * 5/2012 Nurmi .................... C09K 3/185 252/70
2012/0267240 A1 * 10/2012 Ke ....................... H01G 9/2059 204/290.01
2014/0360883 A1 * 12/2014 Deguchi .................. B01J 27/24 204/290.01
2015/0083605 A1 * 3/2015 Tamura .................... B01J 27/24 204/242
2015/0179353 A1 * 6/2015 Suzuka ................ H01G 9/2059 136/263
2024/0154046 A1 * 5/2024 Okuda .................... H10F 77/14

OTHER PUBLICATIONS

Bagdzevicius et al. Interface-type resistive switching in perovskite materials, J Electroceram, 2017, 39, 157-184.
Bierhals et al. Improved understanding of thermally activated structural changes in Al/$SiO_x$/p-Si tunnel diodes by means of infrared spectroscopy. J Appl. Phys. 1998, 83(3), 1371.
Chuang et al. Annealed polycrystalline $TiO_2$ interlayer of the n-Si. $TiO_2$/Ni photoanode for efficient photoelectrochemical water splitting. ACS Appl. Energy Mater, 2020, 3(4), 3902-3908.
Digdaya et al. Interfacial engineering of metal-insulator-semiconductor junctions for efficient and stable photoelectrochemical water oxidation. Nature Communications, 2017, 8, 15968.
Godfrey et al. High-temperature lifetesting of Al/SiOx/p-Si contacts for MIS solar cells. Appl. Phys Lett. 1979, 34, 860.
Grauvogl et al. The truncated-pyramid MIS inversion-layer solar cell: a comprehensive analysis. Progress in Photovoltaics: Research and Applications, 1999, 6(1).
Green, M.A. & Blakers, A.W. Advantages of metal-insulator-semiconductor structures for silicon solar cells. Solar Cells 8, 3-16 (1983).
Guo et al. Facile integration between Si and catalyst for high-performance photoanodes by a multifunctional bridging layer. Nano Letters, 2018, 18(2), 1516-1521.
Hemmerling et al. Quantifying losses and assessing the photovoltage limits in metal-insulator-semiconductor water splitting systems. Advanced Energy materials, 2020, 10(12), https://doi.org/10.1002/aenm.201903354.
Hernley et al. Modeling the impact of metallic plasmonic resonantors on the solar conversion efficiencies of semiconductor photoelectrodes: when does introducing buried plasmonic nanostructures make sense? J Phys Chem C, 2018, 122(42), 24279-24286.
Hill et al. An electrodeposited inhomogeneous metal-insulator-semiconductor junction for efficient photoelectrochemical water oxidation. Nature Materials, 2015, 14, 1150-1155.
Ho, A.W.Y. & Wenham, S.R. Buried contact solar cells with innovative rear localized contacts. Progress in Photovoltaics: Research and Applications 12, 297-308 (2004).
Hu et al Amorphous $TiO_2$ coatings stabilize Si, GaAs, and GaP photoanodes for efficient water oxidation, Science, 2014, 344, 1005.
Huang et al. A porous Ni—O/Ni/Si photoanode for stable and efficient photoelectrochemical water splitting. Chemical Communications, 2019, 3, 377-380.
Ji et al. A silicon-based photocathode for water reduction with an epitaxial $SrTiO_3$ protection layer and a nanostructured catalyst. Nature Nanotechnology, 2015, 10, 84-90.
Ji et al. Localized dielectric breakdown and antireflection coating in metal-oxide-semiconductor photoelectrodes. Nature Mater, 2017, 16, 127.
Jiang, C., Moniz, S.J.A., Wang, A., Zhang, T. & Tang, J. Photoelectrochemical devices for solar water splitting—materials and challenges. Chemical Society Reviews 46, 4645-4660 (2017).
Jung et al. Remarkable improvements in the performance and stability of Si photoanodes adopting nanocrystalline $NiO_x$ electrocatalyst and stoichiometric $SiO_2$ protection. Applied Surface Science, 2019, 493, 1150-1158.
Kenney et al. High-performance silicon photoanodes with ultrathin nickel films for water oxidation. Science, 2013, 342(6160), 836-840.
Kuang Y et al. Ultrastable low-bias water splitting photoanodes via photocorrosion inhibition and in situ catalyst regeneration. *Nat. Energy* 2, 16191 (2016).
Kumar et al. Quantum dot activated indium gallium nitride on silicon as photoanode for solar hydrogen generation. Communications Chemistry, 2019, 2, 4.
Laskowski et al. Junction behavior of n-Si photoanodes protected by thin Ni elucidated from dual working electrode photoelectrochemistry. Energy and Environmental Science, 2017, 10(2), 570-579.
Laskowski et al. Nanoscale semiconductor/catalyst interfaces in photoelectrochemistry. Nature Materials, 2020, 19, 69-76.
Lee et al. Electrodeposited heterogeneous nickel-based catalysts on silicon for efficient sunlight-assisted water splitting. Cell Reports Physical Science, 2020, 1(10), 100219.
Lee et al. Tailored $NiO_x$/Ni cocatalysts on silicon for highly efficient water splitting photoanodes via pulsed electrodeposition. ACS Catalysis, 2018, 8(8), 7261-7269.
Li et al. A hierarchical dual-phase photoetching template route to assembling functional layers on Si photoanode with tunable nanostructures for efficient water splitting. Applied Catalysis B: Environmental, 2019, 259, 118115.
Li et al. Enhancing the photovoltage of Ni/n-Si photoanode for water oxidation through a rapid thermal process. ACS Appl. Mater Interfaces, 2018, 10, 8594-8598.
Li et al. Metal silicidation in conjunction with dopant segregation: A promising strategy for fabricating high-performance silicon-based photoanodes. ACS Appl. Mater. Interfaces, 2020, 12(35), 39092-39097.
Liu et al. Bifacial passication of n-silicon metal-insulator-semiconductor photoelectrodes for efficient oxygen and hydrogen evolution reactions. Energy Environ. Sci. 2020, 13, 221-228.
Loget et al. Dispersed Ni nanoparticles stabilize silicon photoanodes for efficient and inexpensive sunlight-assisted water oxidation. ACS Energy Letters, 2017, 2, 569.
Loget et al. Tailoring the photoelectrochemistry of catalytic metal-insulator-semiconductor (MIS) ohotoanodes by a dissolution method. Nature Commun, 2019, 10, 3522.
Loget et al. Water oxidation with inhomogeneous metal-silicon interfaces. Current Opinion in Colloid and Interface Science. 2019, 39, 40-50.
Luo et al. Multifunctional nickel film protected n-type silicon photoanode with high photovoltage for efficient and stable oxygen evolution reaction. Small Methods, 2019, 3(10), 1900212.
Maity NP et al. Voltage and oxide thickness dependent tunneling current density and tunnel resistivity model: Application to high-k material $HfO_2$ based MOS devices. Superlattices and Microstructures 111, 628-641 (2017).
McDowell et al. The influence of structure and processing on the behavior of $TiO_2$ protective layers for stabilization of n-Si/$TiO_2$/Ni photoanodes for water oxidation. ACS Appl. Mater. Interfaces, 2015, 7(28), 15189-15199.

(56) References Cited

OTHER PUBLICATIONS

Mikolasek et al. Silicon based MIS photoanode for water oxidation: A comparison of $RuO_2$ and Ni Schottky contacts. Applied Surface Science, 2018, 461, 48-53.
Nagata et al. Observation of filament formation process of Cu/$HfO_2$/Pt ReRAm structure by hard X-ray photoelectron spectroscopy under bias operation, J mat Res, 2012, 27, 869-878.
Oh et al. Dissociating water at n-Si photoanodes partially covered with Fe catalysts. Advanced Energy materials, 2019, 10(3).
Oh et al. Elucidating the performance and unexpected stability of partially coated water-splitting silicon photoanodes. Energy and Environmental Science. 2019, 11, 2590-2599.
Over et al. Atmic-scale structure and catalytic reactivity of the $RuO_2$ (110) surface, Science, 2000, 287, 1474-1476.
Peng et al. Electrode dependence of resistive-switching in Mn-doped ZnO: filamentary vs. interfacial mechanism, Applied Phys Lett, 2010, 96(19) 19-21.
Quinn et al. Guidelines for optimizing the performance of metal-insulator-semiconductor (MIS) photoelectrocatalytic systems by tuning the insulator thickness; ACS Energy Letters, 2019, 4, 2632-2638.
Scheuermann et al. Design principles for maximizing photovoltage in metal-oxide-protected water-splitting photoanodes, Nature Mater, 2016, 15, 99.
Scheuermann et al. Effects of catalyst material and atomic layer deposited $TiO_2$ oxide thickness on the water oxidation performance of metal-insulator-silicon anodes. Energy and Environmental Science, 2013, 6, 2487-2496.
Scheuermann et al. Titanium oxide crystallization and interface defect passivation for high performance insulator-protected Schottky junction MIS photoanodes. ACS Appl. Mater. Interfaces. 2016, 8(23), 14596-14603.
Shan CX et al. Corrosion resistance of $TiO_2$ films grown on stainless steel by atomic layer deposition. Surface and Coatings Technology 202, 2399-2402 (2008).
Sun et al. Performance and failure modes of Si anodes patterned with thin-film Ni catalyst islands for water oxidation. Sustainable Energy Fuels, 2018, 2, 983-998.
Sun et al. Stable solar-driven water oxidation to $O_2$(g) by Ni-oxide-coated silicon photoanodes. J Phys Chem Lett. 2016, 6(4), 592-598.
Tompkins, F. C. (1960). Superficial Chemistry and Solid Imperfections. Nature, 186 (4718), 3-6. doi:10.1038/186003a0.
Wang et al. Titanium-defected undoped anatase $TiO_2$ with p-type conductivity, room-temperature ferromagnetism, and remarkable photocatalytic performance, JACS, 2015, 137, 2975-83.
Warren et al. Identifying champion nanostructures for solar water-splitting. Nature materials, 2013, 12, 842-849.
Xu et al. Silicon photoanodes partially covered by Ni@Ni$(OH)_2$ core-shell particles for photoelectrochemical water oxidation. ChemSusChem, 2017, 10, 1-8.
Ying et al. Enhancing the efficiency and stability of $NiO_x$-based silicon photoanode via interfacial engineering. ACS Applied Energy Materials, 2019, 2, 6883-6890.
Yu et al. NiFe alloy protected silicon photoanode for efficient water splitting. Advanced Energy materials, 2016, 7(6).
Yun et al. Aqueous ionic effect on electrochemical breakdown of Si-dielectric-electrolyte interface. Scientific Reports, 2020, 10, 16795.
Zhao et al. Enabling silicon photoanodes for efficient solar water splitting by electroless-deposited nickel. Nano Research, 2018, 11(6), 3499-3508.
Zheng et al. Crystalline $TiO_2$ protective layer with graded oxygen defects for efficient and stable silicon-based photocathode, Nat. Comm. 2018, 9, 3572.
Zheng et al. Defect engineering of the protection layer for photoelectrochemical devices. EnergyChem, 2020, 2(4), 100039.
Zhou et al. Manipulating metal-oxygen local atomic structures in single-junction p-Si/$WO_3$ photocathodes for efficient solar hydrogen generation. Nano Research, 2020, https://doi.org/10.1007/s12274-020-3223-9.
International Search Report and Written Opinion received in PCT/US2022/025206 mailed Feb. 3, 2023.

* cited by examiner

PHOTOELECTRODES AND METHODS OF MAKING AND USE THEREOF

CROSS-REFERENCE TO RELATED APPLICATIONS

This application is a U.S. National Stage application filed under 35 U.S.C. § 371 of PCT/US2022/025206 filed Apr. 18, 2022, which claims the benefit of priority to U.S. Provisional Application No. 63/176,628, filed Apr. 19, 2021, each of which is hereby incorporated herein by reference in its entirety.

STATEMENT OF GOVERNMENT SUPPORT

This invention was made with government support under Grant Nos. CBET1702944, DMR1720595, CBET2109842, and ECCS2025227 awarded by the National Science Foundation. The government has certain rights in the invention.

BACKGROUND

Solar powered water splitting and other photoelectrochemical reactions offer routes to the generation of hydrogen or other high-value chemicals using renewable energy sources. Commercially viable technologies for solar water splitting and fuel generation have been hampered by cost and the tendency of efficient solar absorbing materials to degrade in the presence of water splitting or fuel generation reactions. Metal-insulator-semiconductor (MIS) photoelectrodes for solar water splitting and fuel generation offer a route to addressing the latter issue by covering the semiconductor with a chemically stable protective layer, but these layers are typically electrically insulating and block the flow of photogenerated electrons and/or holes to the surface of the device at which the water splitting or fuel generation reactions take place. Successfully addressing these issues would provide a foundation for the development of a clean, economically viable technology for generation of hydrogen and other high-value chemicals for energy storage, transport, and chemical synthesis applications. The devices, methods, and systems discussed herein address these and other needs.

SUMMARY

In accordance with the purposes of the disclosed devices, methods, and systems as embodied and broadly described herein, the disclosed subject matter relates to photoelectrodes, such as metal-insulator-semiconductor photoelectrodes, and methods of making and use thereof.

Additional advantages of the disclosed devices, systems, and methods will be set forth in part in the description which follows, and in part will be obvious from the description. The advantages of the disclosed devices, systems, and methods will be realized and attained by means of the elements and combinations particularly pointed out in the appended claims. It is to be understood that both the foregoing general description and the following detailed description are exemplary and explanatory only and are not restrictive of the disclosed systems and methods, as claimed.

The details of one or more embodiments of the invention are set forth in the accompanying drawings and the description below. Other features, objects, and advantages of the invention will be apparent from the description and drawings, and from the claims.

BRIEF DESCRIPTION OF THE FIGURES

The accompanying figures, which are incorporated in and constitute a part of this specification, illustrate several aspects of the disclosure, and together with the description, serve to explain the principles of the disclosure.

DETAILED DESCRIPTION

Figure 1:
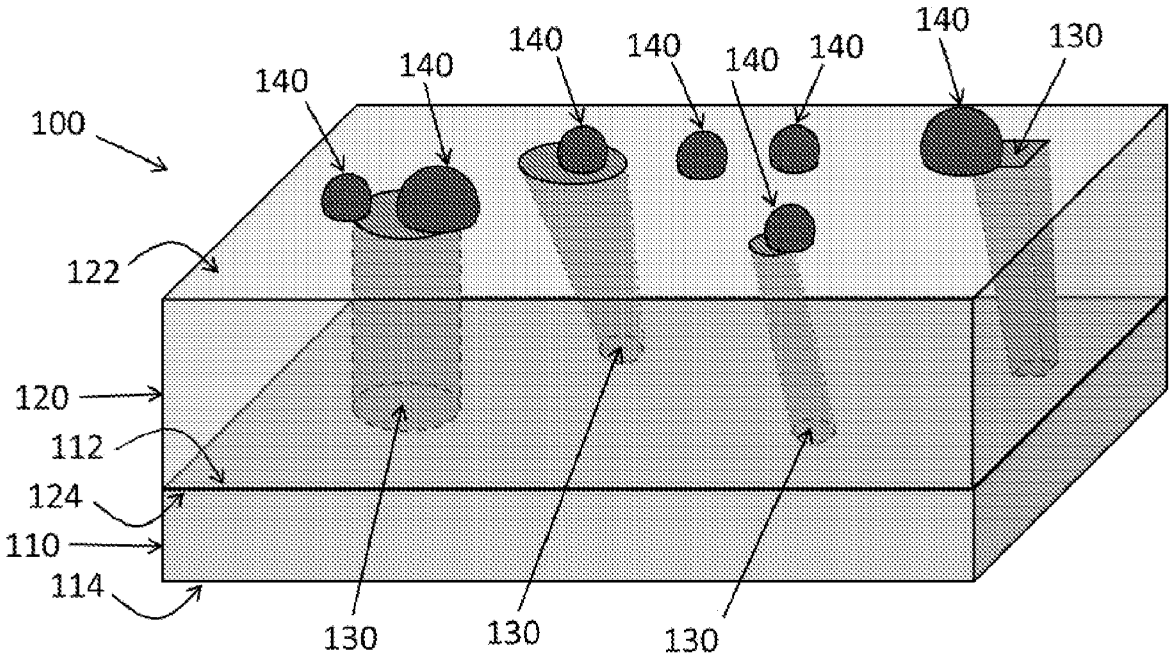
FIG. 1 is a schematic view of an example photoelectrode as disclosed herein according to one implementation.

The devices, methods, and systems described herein may be understood more readily by reference to the following detailed description of specific aspects of the disclosed subject matter and the Examples included therein.

Before the present devices, methods, and systems are disclosed and described, it is to be understood that the aspects described below are not limited to specific synthetic methods or specific reagents, as such may, of course, vary. It is also to be understood that the terminology used herein is for the purpose of describing particular aspects only and is not intended to be limiting.

Also, throughout this specification, various publications are referenced. The disclosures of these publications in their entireties are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon.

In this specification and in the claims that follow, reference will be made to a number of terms, which shall be defined to have the following meanings.

Throughout the description and claims of this specification the word "comprise" and other forms of the word, such as "comprising" and "comprises," means including but not limited to, and is not intended to exclude, for example, other additives, components, integers, or steps.

As used in the description and the appended claims, the singular forms "a," "an," and "the" include plural referents unless the context clearly dictates otherwise. Thus, for example, reference to "a composition" includes mixtures of two or more such compositions, reference to "an agent" includes mixtures of two or more such agents, reference to "the component" includes mixtures of two or more such components, and the like.

"Optional" or "optionally" means that the subsequently described event or circumstance can or cannot occur, and that the description includes instances where the event or circumstance occurs and instances where it does not.

Ranges can be expressed herein as from "about" one particular value, and/or to "about" another particular value. By "about" is meant within 5% of the value, e.g., within 4, 3, 2, or 1% of the value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

"Exemplary" means "an example of" and is not intended to convey an indication of a preferred or ideal embodiment. "Such as" is not used in a restrictive sense, but for explanatory purposes.

It is understood that throughout this specification the identifiers "first" and "second" are used solely to aid in distinguishing the various components and steps of the disclosed subject matter. The identifiers "first" and "second" are not intended to imply any particular order, amount, preference, or importance to the components or steps modified by these terms.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

Photoelectrodes

Disclosed herein are photoelectrodes. Referring now to FIG. 1, disclosed herein are photoelectrodes 100 comprising a light absorbing layer 110; an insulator layer 120 disposed on the light absorbing layer 110; a set of protrusions 130, wherein each protrusion penetrates through the insulator layer 120 to the light absorbing layer 110, such that each protrusion 130 is in physical and electrical contact with the light absorbing layer 110; and a plurality of particles 140 disposed on the insulator layer, wherein at least a portion of the plurality of particles 140 are in physical and electrical contact with at least a portion of the set of protrusions; wherein the plurality of particles 140 and optionally the set of protrusions 130 comprise a catalyst material (e.g., wherein the plurality of particles 140 comprise the catalyst material or wherein the plurality of particles 140 and the set of protrusions 130 comprise the catalyst material).

The light absorbing layer 110 can comprise any material consistent with the methods, devices, and systems disclosed herein. In some examples, the light absorbing layer 110 comprises a semiconductor and/or other light absorber (e.g., molecular absorber, light trapping structure, etc.). For example, the light absorbing layer 110 can comprise silicon, gallium arsenide, AlGaAs, InP, InGaP, InAlP, AlP, InGaAsN, InGaAs, GaN, InGaN, AlInGaN, AlGaN, SiGe, SiC, CdTe, CdSe, ZnO, ZnSe, ZnTe, CdZnTe, $SnS_2$, $Zn_3P_2$, $ZnP_2$, $Zn_3As_2$, $TiO_2$, hybrid organic-inorganic perovskite compounds, copper oxides, $SrTiO_3$, $MoS_2$, GaSe, SnS, $CuInGaSe_2$, a-Si:H (hydrogenated amorphous silicon), bismuth vanadate ($BiVO_4$), iron oxide ($Fe_2O_3$), or a combination thereof. In some examples, the light absorbing layer 110 comprises silicon.

The light absorbing layer 110 has a top surface 112 and a bottom surface 114 opposite and spaced apart from the top surface 112. In some examples, the top surface 112 and the bottom surface 114 of the light absorbing layer 110 are substantially parallel to each other.

The light absorbing layer 110 has an average thickness, the average thickness being the average dimension from the top surface 112 to the bottom surface 114. The average thickness of the light absorbing layer 110 can, for example, be 100 nanometers (nm) or more (e.g., 125 nm or more, 150 nm or more, 175 nm or more, 200 nm or more, 225 nm or more, 250 nm or more, 300 nm or more, 350 nm or more, 400 nm or more, 450 nm or more, 500 nm or more, 600 nm or more, 700 nm or more, 800 nm or more, 900 nm or more, 1 micrometer (micron, μm) or more, 2 μm or more, 3 μm or more, 4 μm or more, 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 175 μm or more, 200 μm or more, 225 μm or more, 250 μm or more, 300 μm or more, 350 μm or more, 400 μm or more, or 450 μm or more). In some examples, the average thickness of the light absorbing layer 110 can be 500 micrometers (micron, μm) or less (e.g., 450 μm or less, 400 μm or less, 350 μm or less, 300 μm or less, 250 μm or less, 225 μm or less, 200 μm or less, 175 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, 5 μm or less, 4 μm or less, 3 μm or less, 2 μm or less, 1 μm or less, 900 nm or less, 800 nm or less, 700 nm or less, 600 nm or less, 500 nm or less, 450 nm or less, 400 nm or less, 350 nm or less, 300 nm or less, 250 nm or less, 225 nm or less, 200 nm or less, 175 nm or less, 150 nm or less, or 125 nm or less). The average thickness of the light absorbing layer 110 can range from any of the minimum values described above to any of the maximum values described above. For example, the average thickness of the light absorbing layer can be from 100 nm to 500 μm (e.g., from 100 nm to 1 μm, from 1 μm to 10 μm, from 10 μm to 500 μm, from 100 nm to 400 μm, from 150 nm to 500 μm, or from 150 nm to 400 μm).

The top surface 112 and the bottom surface 114 of the light absorbing layer 110 can, independently, be any shape. In some examples, the top surface 112 and the bottom surface 114 of the light absorbing layer 110 can, independently, be substantially circular, ovate, ovoid, elliptic, triangular, rectangular, polygonal, etc. In some examples, the top surface 112 and the bottom surface 114 of the light absorbing layer 110 can be substantially the same shape. In some examples, the top surface 112 and the bottom surface 114 of the light absorbing layer 110 can be substantially rectangular, as shown in FIG. 1. In some examples, the top surface 112 and/or the bottom surface 114 of the light absorbing layer 110 can have a texture or roughness.

The light absorbing layer 110 has an average lateral dimension (e.g., diameter when the light absorbing layer 110 is circular; diagonal when the light absorbing layer 110 is substantially rectangular, etc.) of 1 micrometer (micron, μm) or more (e.g., 2 μm or more, 3 μm or more, 4 μm or more, 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.25 mm or more, 1.5 mm or more, 2 mm or more, 2.5 mm or more, 3 mm or more, 4 mm or more, 5 mm or more, 10 mm or more, 15 mm or more, 20 mm or more, 25 mm or more, 30 mm or more, 40 mm or more, 50 mm or more, 75 mm or more, 100 mm or more, 125 mm or more, 150 mm or more, 200 mm or more, 250 mm or more, 300 mm or more, 400 mm or more, 500 mm or more, 750 mm or more, 1 meter (m) or more, 2 m or more, 3 m or more, 4 m or more, or 5 m or more). In some examples, the average lateral dimension of the light absorbing layer 110 is 10 meters (m) or less (e.g., 9 m or less, 8 m or less, 7 m or less, 6 m or less, 5 m or less, 4 m or less, 3 m or less, 2 m or less, 1 m or less, 750 mm or less, 500 mm or less, 400 mm or less, 300 mm or less, 250 mm or less, 200 mm or less, 150 mm or less, 125 mm or less, 100 mm or less, 75 mm or less, 50 mm or less, 40 mm or less, 30 mm or less, 25 mm or less, 20 mm or less, 15 mm or less, 10 mm or less, 5 mm or less, 4 mm or less, 3 mm or less, 2.5 mm or less, 2 mm or less, 1.5 mm or less, 1.25 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, 5 μm or less, 4 μm or less, 3 μm or less, or 2 μm or less). The average lateral dimension of the light absorbing layer 110 can range from any of the minimum values described above to any of the maximum values described above. For example, the average lateral dimension of the light absorbing layer 110 can be from 1 μm to 10 m (e.g., from 1 μm to 1 mm, from 1 mm to 10 m, from 1 μm to 100 μm, from 100 μm to 10 mm, from 10 mm to 10 m, from 1 μm to 10 μm, from 10 μm to 100 μm, from 100 μm to 1 mm, from 1 mm to 10 mm, from 10 mm to 100 mm, from 100 mm to 1 m, from 1 m to 10 m, from 1 μm to 1 m, from 1 μm to 100 mm, from 1 μm to 50 mm, from 1 μm to 10 mm, from 10 μm to 300 mm, from 100 μm to 300 mm, from 1 mm to 300 mm, from 25 mm to 300 mm, or from 1 centimeter (cm) to 30 cm).

In some examples, the light absorbing layer 110 can further comprise a doped region, the doped region including a dopant. The dopant can, for example, comprise an n-type dopant or a p-type dopant. For example, the light absorbing layer can comprise a doped region such that the light absorbing layer comprises a buried pn junction.

In some examples, the doped region comprises doped silicon. In some examples the doped region comprises $p^+$ doped silicon. In some examples, the doped region comprises boron doped silicon. In some examples, the light absorbing layer comprises Si with a buried pn junction.

The doped region can, for example, comprise a doped layer. In some examples, the doped layer can have an average thickness of 10 nanometers (nm) or more (e.g., 15 nm or more, 20 nm or more, 25 nm or more, 30 nm or more, 40 nm or more, 50 nm or more, 75 nm or more, 100 nm or more, 125 nm or more, 150 nm or more, 175 nm or more, 200 nm or more, 225 nm or more, 250 nm or more, 300 nm or more, 350 nm or more, 400 nm or more, 450 nm or more, 500 nm or more, 600 nm or more, 700 nm or more, 800 nm or more, 900 nm or more, 1 micrometer (micron, μm) or more, 2 μm or more, 3 μm or more, 4 μm or more, 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 175 μm or more, 200 μm or more, 225 μm or more, 250 μm or more, 300 μm or more, 350 μm or more, 400 μm or more, or 450 μm or more). In some examples, the average thickness of the doped layer can be 500 micrometers (micron, μm) or less (e.g., 450 μm or less, 400 μm or less, 350 μm or less, 300 μm or less, 250 μm or less, 225 μm or less, 200 μm or less, 175 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, 5 μm or less, 4 μm or less, 3 μm or less, 2 μm or less, 1 μm or less, 900 nm or less, 800 nm or less, 700 nm or less, 600 nm or less, 500 nm or less, 450 nm or less, 400 nm or less, 350 nm or less, 300 nm or less, 250 nm or less, 225 nm or less, 200 nm or less, 175 nm or less, 150 nm or less, 125 nm or less, 100 nm or less, 75 nm or less, 50 nm or less, 40 nm or less, 30 nm or less, 25 nm or less, 20 nm or less, or 15 nm or less). The average thickness of the doped layer can range from any of the minimum values described above to any of the maximum values described above. For example, the average thickness of the doped layer can be from 10 nm to 500 μm (e.g., from 10 nm to 1 μm, from 10 μm to 500 μm, from 10 nm to 100 nm, from 100 nm to 1 μm, from 1 μm to 10 μm, from 10 μm to 500 μm, from 10 nm to 400 μm, from 50 nm to 500 μm, or from 50 nm to 400 μm).

The insulator layer 120 can comprise any material consistent with the methods, devices, and systems disclosed herein. For example, the insulator layer 120 can comprise $SiO_2$, $TiO_2$, silicon nitride, silicon oxynitride, aluminum oxide, strontium titanate, tungsten oxide ($WO_3$), aluminum nitride, boron nitride, aluminum gallium nitride, or a combination thereof. In some examples, the insulator layer 120 comprises $SiO_2$.

The insulator layer 120 has a top surface 122 and a bottom surface 124 opposite and spaced apart from the top surface 122. The bottom surface 124 of the insulator layer 120 is disposed on the top surface 112 of the light absorbing layer 110. In some examples, the top surface 122 and the bottom surface 124 of the insulator layer 120 are substantially parallel to each other.

The insulator layer 120 has an average thickness, the average thickness being the average dimension from the top surface 122 to the bottom surface 124. The average thickness of the insulator layer can, for example, be 2 nm or more (e.g., 3 nm or more, 4 nm or more, 5 nm or more, 10 nm or more, 15 nm or more, 20 nm or more, 25 nm or more, 30 nm or more, 35 nm or more, 40 nm or more, 45 nm or more, 50 nm or more, 55 nm or more, 60 nm or more, 65 nm or more, 70 nm or more, 75 nm or more, 80 nm or more, 85 nm or more, 90 nm or more, 95 nm or more, 100 nm or more, 110 nm or more, 120 nm or more, 130 nm or more, 140 nm or more, 150 nm or more, 175 nm or more, 200 nm or more, 225 nm or more, 250 nm or more, 300 nm or more, 350 nm or more, 400 nm or more, 450 nm or more, 500 nm or more, 600 nm or more, 700 nm or more, 800 nm or more, or 900 nm or more). In some examples, the average thickness of the insulator layer can be 1 μm or less (e.g., 900 nm or less, 800 nm or less, 700 nm or less, 600 nm or less, 500 nm or less, 450 nm or less, 400 nm or less, 350 nm or less, 300 nm or less, 250 nm or less, 225 nm or less, 200 nm or less, 175 nm or less, 150 nm or less, 140 nm or less, 130 nm or less, 120 nm or less, 110 nm or less, 100 nm or less, 95 nm or less, 90 nm or less, 85 nm or less, 80 nm or less, 75 nm or less, 70 nm or less, 65 nm or less, 60 nm or less, 55 nm or less, 50 nm or less, 45 nm or less, 40 nm or less, 35 nm or less, 30 nm or less, 25 nm or less, 20 nm or less, 15 nm or less, 10 nm or less, or 5 nm or less). The average thickness of the insulator layer can range from any of the minimum values described above to any of the maximum values described above. For examples, the average thickness of the insulator layer can be from 2 nm to 1 μm (e.g., from 2 nm to 20 nm, from 20 nm to 100 nm, from 100 nm to 1 μm, from 2 nm to 900 nm, from 20 nm to 1 μm, or from 20 nm to 900 nm). In some examples, the average thickness of the insulator layer can be 20 nanometers (nm) or more.

The top surface 122 and the bottom surface 124 of the insulator layer 120 can, independently, be any shape. In some examples, the top surface 122 and the bottom surface 124 of the insulator layer 120 can, independently, be substantially circular, ovate, ovoid, elliptic, triangular, rectangular, polygonal, etc. In some examples, the top surface 122 and the bottom surface 124 of the insulator layer 120 can be substantially the same shape. In some examples, the top surface 122 and the bottom surface 124 of the insulator layer 120 can be substantially rectangular, as shown in FIG. 1. In some examples, the top surface 122 of the insulator layer 120, the bottom surface 124 of the insulator layer 120, the top surface 112 of the light absorbing layer 110, and the bottom surface 114 of the light absorbing layer 110 can each be substantially the same shape.

The insulator layer 120 has an average lateral dimension (e.g., diameter when the insulator layer 120 is circular; diagonal when the insulator layer 120 is substantially rectangular, etc.) of 1 micrometer (micron, μm) or more (e.g., 2 μm or more, 3 μm or more, 4 μm or more, 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.25 mm or more, 1.5 mm or more, 2 mm or more, 2.5 mm or more, 3 mm or more, 4 mm or more, 5 mm or more, 10 mm or more, 15 mm or more, 20 mm or more, 25 mm or more, 30 mm or more, 40 mm or more, 50 mm or more, 75 mm or more, 100 mm or more, 125 mm or more, 150 mm or more, 200 mm or more, 250 mm or more, 300 mm or more, 400 mm or more, 500 mm or more, 750 mm or more, 1 meter (m) or more, 2 m or more, 3 m or more, 4 m or more, or 5 m or more). In some examples, the average lateral dimension of the insulator layer 120 is 10 meters (m) or less (e.g., 9 m or less, 8 m or less, 7 m or less, 6 m or less, 5 m or less, 4 m or less, 3 m or less, 2 m or less, 1 m or less, 750 mm or less, 500 mm or less, 400 mm or less, 300 mm or less, 250 mm or less, 200 mm or less, 150 mm or less, 125 mm or less, 100 mm or less, 75 mm or less, 50 mm or less, 40 mm or less, 30 mm or less, 25 mm or less, 20 mm or less, 15 mm or less, 10 mm or less, 5 mm or less, 4 mm or less, 3 mm or less, 2.5 mm or less, 2 mm or less, 1.5 mm or less, 1.25 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, 5 μm or less, 4 μm or less, 3 μm or less, or 2 μm or less). The average lateral dimension of the insulator layer 120 can range from any of the minimum values described above to any of the maximum values described above. For example, the average lateral dimension of the insulator layer 120 can be from 1 μm to 10 m (e.g., from 1 μm to 1 mm, from 1 mm to 10 m, from 1 μm to 100 μm, from 100 μm to 10 mm, from 10 mm to 10 m, from 1 μm to 10 μm, from 10 μm to 100 μm, from 100 μm to 1 mm, from 1 mm to 10 mm, from 10 mm to 100 mm, from 100 mm to 1 m, from 1 m to 10 m, from 1 μm to 1 m, from 1 μm to 100 mm, from 1 μm to 50 mm, from 1 μm to 10 mm, from 10 μm to 300 mm, from 100 μm to 300 mm, from 1 mm to 300 mm, from 25 mm to 300 mm, or from 1 centimeter (cm) to 30 cm). In some examples, the insulator layer 120 and the light absorbing layer 110 can have substantially the same average lateral dimension.

The photoelectrodes further comprise a set of protrusions 130, wherein each protrusion 130 penetrates through the insulator layer 120 to the light absorbing layer 110, such that each protrusion 130 is in physical and electrical contact with the light absorbing layer 110. For example, each protrusion 130 can extend from the top surface 122 of the insulator layer 120 to the bottom surface 124 of the insulator layer 120, such that each protrusion 130 is in physical and electrical contact with the top surface 112 of the light absorbing layer 110.

As used herein, "a set of protrusions 130" and "the set of protrusions 130" are meant to include any number of protrusions 130 of any size and in any arrangement. Thus, for example, "a set of protrusions 130" includes one or more protrusions 130 (e.g., 2 or more; 3 or more; 4 or more; 5 or more; 10 or more; 15 or more; 20 or more; 25 or more; 30 or more; 40 or more; 50 or more; 75 or more; 100 or more; 150 or more; 200 or more; 250 or more; 300 or more; 400 or more; 500 or more; 750 or more; 1000 or more; 1500 or more; 2000 or more; 2500 or more; 3000 or more; 4000 or more; 5000 or more; 7500 or more; $1\times10^4$ or more; $2.5\times10^4$ or more; $5\times10^4$ or more; $7.5\times10^4$ or more; $1\times10^5$ or more; $2.5\times10^5$ or more; $5\times10^5$ or more; $7.5\times10^5$ or more; $1\times10^6$ or more; $5\times10^6$ or more; $1\times10^7$ or more; $5\times10^7$ or more; $1\times10^8$ or more; $5\times10^8$ or more; $1\times10^9$ or more; $5\times10^9$ or more; $1\times10^{10}$ or more; $1\times10^{11}$ or more; $1\times10^{12}$ or more; $1\times10^{13}$ or morel $1\times10^{14}$ or more; $1\times10^{15}$ or more; $1\times10^{16}$ or more; $1\times10^{17}$ or more; $1\times10^{18}$ or more; $1\times10^{19}$ or more; or $1\times10^{20}$ or more). In some examples, the set of protrusions 130 comprises a plurality of protrusions 130. In some examples, the set of protrusions 130 comprises a plurality of protrusions 130 arranged in a random or disordered array. In some examples, the set of protrusions 130 comprises a plurality of protrusions 130 arranged in a an ordered array.

The set of protrusions can be dispersed across the insulator layer laterally such that the areal density of the set of protrusions within the plane of the top surface of the insulator layer can be $10^4$ protrusions per $cm^2$ of the insulator layer or more (e.g., $1\times10^4$ protrusions/$cm^2$ or more, $5\times10^4$ protrusions/$cm^2$ or more, $1\times10^5$ protrusions/$cm^2$ or more, $5\times10^5$ protrusions/$cm^2$ or more, $1\times10^6$ protrusions/$cm^2$ or more, $5\times10^6$ protrusions/$cm^2$ or more, $1\times10^7$ protrusions/$cm^2$ or more, $5\times10^7$ protrusions/$cm^2$ or more, $1\times10^8$ protrusions/$cm^2$ or more, $5\times10^8$ protrusions/$cm^2$ or more, $1\times10^9$ protrusions/$cm^2$ or more, $5\times10^9$ protrusions/$cm^2$ or more, $1\times10^{10}$ protrusions/$cm^2$ or more, $5\times10^{10}$ protrusions/$cm^2$ or more, $1\times10^{11}$ protrusions/$cm^2$ or more, $5\times10^{11}$ protrusions/$cm^2$ or more, $1\times10^{12}$ protrusions/$cm^2$ or more, $5\times10^{12}$ protrusions/$cm^2$ or more, $1\times10^{13}$ protrusions/$cm^2$ or more, or $5\times10^{13}$ protrusions/$cm^2$ or more). In some examples, the areal density of the set of protrusions within the plane of the top surface of the insulator layer can be $10^{13}$ protrusions/$cm^2$ or less (e.g., $5\times10^{13}$ protrusions/$cm^2$ or less, $1\times10^{13}$ protrusions/$cm^2$ or less, $5\times10^{12}$ protrusions/$cm^2$ or less, $1\times10^{12}$ protrusions/$cm^2$ or less, $5\times10^{11}$ protrusions/$cm^2$ or less, $1\times10^{11}$ protrusions/$cm^2$ or less, $5\times10^{10}$ protrusions/$cm^2$ or less, $1\times10^{10}$ protrusions/$cm^2$ or less, $5\times10^9$ protrusions/$cm^2$ or less, $1\times10^9$ protrusions/$cm^2$ or less, $5\times10^8$ protrusions/$cm^2$ or less, $1\times10^8$ protrusions/$cm^2$ or less, $5\times10^7$ protrusions/$cm^2$ or less, $1\times10^7$ protrusions/$cm^2$ or less, $5\times10^6$ protrusions/$cm^2$ or less, $1\times10^6$ protrusions/$cm^2$ or less, $5\times10^5$ protrusions/$cm^2$ or less, $1\times10^5$ protrusions/$cm^2$ or less, or $5\times10^4$ protrusions/$cm^2$ or less). The areal density of the set of protrusions within the plane of the top surface of the insulator layer can range from any of the minimum values described above to any of the maximum values described above. For example, the areal density of the set of protrusions within the plane of the top surface of the insulator layer can be from $10^4$ to $10^{13}$ protrusions/$cm^2$ (e.g., from $1\times10^4$ to $1\times10^9$ protrusions/$cm^2$, from $1\times10^9$ to $1\times10^{13}$ protrusions/$cm^2$, from $1\times10^4$ to $1\times10^6$ protrusions/$cm^2$, from $1\times10^6$ to $1\times10^8$ protrusions/$cm^2$, from $1\times10^8$ to $1\times10^{10}$ protrusions/$cm^2$, from $1\times10^{10}$ to $1\times10^{13}$ protrusions/$cm^2$, from $1\times10^4$ to $1\times10^{12}$ protrusions/$cm^2$, from $1\times10^5$ to $1\times10^{13}$ protrusions/$cm^2$, from $1\times10^5$ to $\times10^{12}$ protrusions/$cm^2$, from $1\times10^6$ to $1\times10^{10}$ protrusions/$cm^2$, or from $1\times10^7$ to $\times10^9$ protrusions/$cm^2$). In some examples, the set of protrusions are dispersed throughout the insulator layer such that the areal density of the set of protrusions within the insulator layer is from $2\times10^8$ to $8\times10^8$ protrusions per $cm^2$ of the insulator layer.

The set of protrusions 130 can, independently, be any shape, such as a regular shape, an irregular shape, an isotropic shape, or an anisotropic shape. For example, the set of protrusions 130 can, independently, be a polyhedron (e.g., a platonic solid, a prism, a pyramid), a cylinder, a hemicylinder, an elliptical cylinder, a hemi-elliptical cylinder, a cone, a semicone, etc.

In some examples, each of the protrusions 130 can, independently, have a longitudinal axis, a first surface, and a second surface opposite and axially spaced apart from the first surface. In some examples, the longitudinal axis of each of the protrusions 130 can, independently, extend through the insulator layer 120 at an angle of 90° or less relative to the top surface of the insulator layer (e.g., 85° or less, 80° or less, 75° or less, 70° or less, 65° or less, 60° or less, 55° or less, 50° or less, 45° or less, 40° or less, 35° or less, 30° or less, 25° or less, 20° or less, or 15° or less), wherein an angle of 90° means that the longitudinal axis is disposed perpendicular to the top surface of the insulator layer and 0° is parallel to the top surface of the insulator layer. In some examples, the longitudinal axis of each of the protrusions 130 can, independently, extend through the insulator layer 120 at an angle of 10° or more relative to the top surface of the insulator layer (e.g., 15° or more, 20° or more, 25° or more, 30° or more, 35° or more, 40° or more, 45° or more, 50° or more, 55° or more, 60° or more, 65° or more, 70° or more, 75° or more, 80° or more, or 85° or more). The angle at which the longitudinal axis of each of the protrusions 130 independently extends through the insulator layer 120 can range from any of the minimum values described above to any of the maximum values described above. For example, the longitudinal axis of each of the protrusions 130 can, independently, extend through the insulator layer 120 at an angle of from 10° to 90° relative to the top surface of the insulator layer (e.g., from 10° to 45°, from 45° to 90°, from 10° to 30°, from 30° to 50°, from 50° to 70°, from 70° to 90°, from 30° to 90°, from 10° to 80°, or from 30° to 80°). In some examples, the longitudinal axis of one or more of the protrusions can be disposed at an angle of 90° relative to the top surface of the insulator layer, such that the longitudinal axis is disposed perpendicular to the top surface of the insulator layer. In some examples, the longitudinal axis of each of the protrusions 130 are substantially parallel to each other.

Each of the protrusions 130 can have a cross-sectional shape in a plane parallel to the top surface of the insulator layer, wherein the cross-sectional shape can be any shape, such as a regular shape, an irregular shape, an isotropic shape, or an anisotropic shape. In some examples, the cross-sectional shape of each of the set of protrusions can be substantially circular, ovate, ovoid, elliptic, triangular, rectangular, polygonal, etc. In some examples, the cross-sectional shape of each of the set of protrusions 130 is substantially the same. In some examples, the cross-sectional shape of the set of protrusions 130 can vary with the thickness of the insulator layer 120.

The set of protrusions 130 can have an average characteristic dimension. The term "characteristic dimension," as used herein refers to the largest straight line distance spanning the protrusion 130 in a plane parallel to the top surface 122 of the insulator layer 120. "Average characteristic dimension" and "mean characteristic dimension" are used interchangeably herein, and generally refer to the statistical mean characteristic dimension of the protrusions in a population of protrusions. For example, for a cylindrical set of second protrusions, the cross-sectional shape can be substantially circular and the average characteristic dimension can refer to the average diameter. In some examples, the average characteristic dimension of the set of protrusions 130 can be substantially the same for the entire thickness of the insulator layer 120. In some examples, the average characteristic dimension of the set of protrusions 130 can vary with the thickness of the insulator layer 120 (e.g., tapered or stepped).

The set of protrusions can, for example, have an average characteristic dimension of 0.1 nm or more (e.g., 0.2 nm or more, 0.3 nm or more, 0.4 nm or more, 0.5 nm or more, 1 nm or more, 1.5 nm or more, 2 nm or more, 2.5 nm or more, 3 nm or more, 4 nm or more, 5 nm or more, 10 nm or more, 15 nm or more, 20 nm or more, 25 nm or more, 30 nm or more, 35 nm or more, 40 nm or more, 45 nm or more, 50 nm or more, 55 nm or more, 60 nm or more, 65 nm or more, 70 nm or more, 75 nm or more, 80 nm or more, 85 nm or more, 90 nm or more, 95 nm or more, 100 nm or more, 110 nm or more, 120 nm or more, 130 nm or more, 140 nm or more, 150 nm or more, 175 nm or more, 200 nm or more, 225 nm or more, 250 nm or more, 300 nm or more, 350 nm or more, 400 nm or more, 450 nm or more, 500 nm or more, 600 nm or more, 700 nm or more, 800 nm or more, or 900 nm or more). In some examples, the set of protrusions can have an average characteristic dimension of 1 μm or less (e.g., 900 nm or less, 800 nm or less, 700 nm or less, 600 nm or less, 500 nm or less, 450 nm or less, 400 nm or less, 350 nm or less, 300 nm or less, 250 nm or less, 225 nm or less, 200 nm or less, 175 nm or less, 150 nm or less, 140 nm or less, 130 nm or less, 120 nm or less, 110 nm or less, 100 nm or less, 95 nm or less, 90 nm or less, 85 nm or less, 80 nm or less, 75 nm or less, 70 nm or less, 65 nm or less, 60 nm or less, 55 nm or less, 50 nm or less, 45 nm or less, 40 nm or less, 35 nm or less, 30 nm or less, 25 nm or less, 20 nm or less, 15 nm or less, 10 nm or less, 5 nm or less, 4 nm or less, 3 nm or less, 2.5 nm or less, 2 nm or less, 1.5 nm or less, 1 nm or less, or 0.5 nm or less). The average characteristic dimension of the set of protrusions can range from any of the minimum values described above to any of the maximum values described above. For examples, the average characteristic dimension of the set of protrusions can be from 0.1 nm to 1 μm (e.g., from 0.1 nm to 1 nm, from 1 nm to 10 nm, from 10 nm to 100 nm, from 100 nm to 1 μm, from 0.1 nm to 900 nm, from 1 nm to 1 μm, or from 1 nm to 900 nm). In some examples, the set of protrusions can have an average characteristic dimension of from 50 nm to 100 nm. The average characteristic dimension of the protrusions can be measured using methods known in the art, such as evaluation by electron microscopy.

In some examples, the set of protrusions 130 can comprise a plurality of protrusions 130, wherein the average characteristic dimension of the plurality of protrusions 130 can be substantially monodisperse. "Monodisperse" and "homogeneous characteristic dimension distribution," as used herein, and generally describe a population of protrusions where all of the protrusions have the same or nearly the same characteristic dimension. As used herein, a monodisperse distribution refers to distributions in which 80% of the distribution (e.g., 85% of the distribution, 90% of the distribution, or 95% of the distribution) lies within 25% of the mean characteristic dimension (e.g., within 20% of the mean characteristic dimension, within 15% of the mean characteristic dimension, within 10% of the mean characteristic dimension, or within 5% of the mean characteristic dimension).

The photoelectrodes further comprise a plurality of particles 140 on the insulator layer, wherein at least a portion of the plurality of particles 140 are in physical and electrical contact with at least a portion of the set of protrusions. For example, the plurality of particles 140 can be disposed on the top surface 122 of the insulator layer 120.

As used herein, "a plurality of particles" and "the plurality of particles" are meant to include particles of any size and in any arrangement. Thus, for example, "a plurality of particles" includes two or more particles (e.g., 3 or more; 4 or more; 5 or more; 10 or more; 15 or more; 20 or more; 25 or more; 30 or more; 40 or more; 50 or more; 75 or more; 100 or more; 150 or more; 200 or more; 250 or more; 300 or more; 400 or more; 500 or more; 750 or more; 1000 or more; 1500 or more; 2000 or more; 2500 or more; 3000 or more; 4000 or more; 5000 or more; 7500 or more; $1\times10^4$ or more; $2.5\times10^4$ or more; $5\times10^4$ or more; $7.5\times10^4$ or more; $1\times10^5$ or more; $2.5\times10^5$ or more; $5\times10^5$ or more; $7.5\times10^5$ or more; $1\times10^6$ or more; $5\times10^6$ or more; $1\times10^7$ or more; $5\times10^7$ or more; $1\times10^8$ or more; $5\times10^8$ or more; $1\times10^9$ or more; $5\times10^9$ or more; $1\times10^{10}$ or more; $1\times10^{11}$ or more; $1\times10^{12}$ or more; $1\times10^{13}$ or morel $1\times10^{14}$ or more; $1\times10^{15}$ or more; $1\times10^{16}$ or more; $1\times10^{17}$ or more; $1\times10^{18}$ or more; $1\times10^{19}$ or more; or $1\times10^{20}$ or more). In some examples, the plurality of particles 140 can be arranged in a random or disordered array. In some examples, the plurality of particles 140 can be arranged in an ordered array.

The plurality of particles 140 can have an average particle size. "Average particle size" and "mean particle size" are used interchangeably herein, and generally refer to the statistical mean particle size of the particles in a population of particles. For example, the average particle size for a plurality of particles with a substantially spherical shape can comprise the average diameter of the plurality of particles. As used herein, the size of a particle can refer to the largest linear distance between two points on the surface of the particle. For an anisotropic particle, the average particle size can refer to, for example, the average maximum dimension of the particle (e.g., the length of a rod shaped particle, the diagonal of a cube shape particle, the bisector of a triangular shaped particle, etc.). Mean particle size can be measured using methods known in the art, such as evaluation by electron microscopy.

The plurality of particles 140 can, for example, have an average particle size of 5 nm or more (e.g., 10 nm or more, 15 nm or more, 20 nm or more, 25 nm or more, 30 nm or more, 35 nm or more, 40 nm or more, 45 nm or more, 50 nm or more, 55 nm or more, 60 nm or more, 65 nm or more, 70 nm or more, 75 nm or more, 80 nm or more, 85 nm or more, 90 nm or more, 95 nm or more, 100 nm or more, 125 nm or more, 150 nm or more, 175 nm or more, 200 nm or more, 225 nm or more, 250 nm or more, 300 nm or more, 350 nm or more, 400 nm or more, 450 nm or more, 500 nm or more, 600 nm or more, 700 nm or more, 800 nm or more, 900 nm or more, 1 micrometer (micron, μm) or more, 2 μm or more, 3 μm or more, 4 μm or more, 5 μm or more, 10 μm or more, 15 μm or more, 20 μm or more, 25 μm or more, 30 μm or more, 35 μm or more, 40 μm or more, or μm or more). In some examples, the plurality of particles 140 can have an average particle size of 50 micrometers (micron, μm) or less (e.g., 45 μm or less, 40 μm or less, 35 μm or less, 30 μm or less, 25 μm or less, 20 μm or less, 15 μm or less, 10 μm or less, 5 μm or less, 4 μm or less, 3 μm or less, 2 μm or less, 1 μm or less, 900 nm or less, 800 nm or less, 700 nm or less, 600 nm or less, 500 nm or less, 450 nm or less, 400 nm or less, 350 nm or less, 300 nm or less, 250 nm or less, 225 nm or less, 200 nm or less, 175 nm or less, 150 nm or less, 125 nm or less 95 nm or less, 90 nm or less, 85 nm or less, 80 nm or less, 75 nm or less, 70 nm or less, 65 nm or less, 60 nm or less, 55 nm or less, 50 nm or less, 45 nm or less, 40 nm or less, 35 nm or less, 30 nm or less, 25 nm or less, 20 nm or less, 15 nm or less, or 10 nm or less). The average particle size of the plurality of particles 140 can range from any of the minimum values described above to any of the maximum values described above. For example, the plurality of particles 140 can have an average particle size of from 5 nm to 50 μm (e.g., from 5 nm to 1 μm, from 1 μm to 50 μm, from 5 nm to 50 nm, from 50 nm to 500 nm, from 500 nm to 5 μm, from 5 μm to 50 μm, from 10 nm to 50 μm, from 5 nm to 40 μm, or from 10 nm to 40 μm). In some examples, the particles 140 can have an average particle size of 0.15 to 1.35 micrometers (μm).

In some examples, the particles 140 can have an average particle size of from 0.25 to 0.85 μm. In some examples, the plurality of particles 140 can be substantially monodisperse. "Monodisperse" and "homogeneous size distribution," as used herein, and generally describe a population of particles where all of the particles have the same or nearly the same particle size. As used herein, a monodisperse distribution refers to distributions in which 80% of the distribution (e.g., 85% of the distribution, 90% of the distribution, or 95% of the distribution) lies within 25% of the mean particle size (e.g., within 20% of the mean particle size, within 15% of the mean particle size, within 10% of the mean particle size, or within 5% of the mean particle size).

The plurality of particles 140 can, independently, be of any shape, such as a regular shape, an irregular shape, an isotropic shape, or an anisotropic shape (e.g., a sphere, a rod, a quadrilateral, an ellipse, a triangle, a polygon, etc.). In some examples, the plurality of particles 140 can have an isotropic shape. In some examples, the plurality of particles 140 can have an anisotropic shape.

The plurality of particles 140 and optionally the set of protrusions comprise a catalyst material (e.g., the plurality of particles 140 comprise the catalyst material or the plurality of particles 140 and the set of protrusions comprise the catalyst material). The catalyst material can comprise any material consistent with the methods, devices, and systems disclosed herein. For example, the catalyst material can comprise a metal selected from the group consisting of Ni, Pt, Mo, Co, Ru, Ir, or a combination thereof in any spatial arrangement. In some examples, the catalyst material comprises Ni. In some examples, the catalyst material comprises an oxygen evolution reaction catalyst. In some examples, the catalyst material can comprise NiFe, $NiFeO_x$, NiFe-layered double hydroxide, carbon nitrides, certain polymers, NiMo, $MoS_2$, CoP, $NiCoO_x$, $RuO_2$, $IrO_2$, or a combination thereof in any spatial arrangement.

The particles and/or the protrusions can, for example, cover 1% or more of the top surface of the insulator layer (e.g., 2% or more, 3% or more, 4% or more, 5% or more, 10% or more, 15% or more, 20% or more, 25% or more, 30% or more, 35% or more, 40% or more, 45% or more, 50% or more, 55% or more, 60% or more, 65% or more, 70% or more, 75% or more, 80% or more, 85% or more, 90% or more, or 95% or more). In some examples, the particles and/or protrusions can cover 100% or less of the top surface of the insulator layer (e.g., 95% or less, 90% or less, 85% or less, 80% or less, 75% or less, 70% or less, 65% or less, 60% or less, 55% or less, 50% or less, 45% or less, 40% or less, 35% or less, 30% or less, 25% or less, 20% or less, 15% or less, 10% or less, or 5% or less). The amount of coverage of the top surface of the insulator by the particles and/or the protrusions can range from any of the minimum values described above to any of the maximum values described above. For example, the particles and/or the protrusions can cover from 1% to 100% of the top surface of the insulator layer (e.g., from 1% to 50%, from 50% to 100%, from 1% to 20%, from 20% to 40%, from 40% to 60%, from 60% to 80% from 80% to 100%, from 5% to 100%, from 1% to 90%, from 5% to 90%, or from 5% to 80%). In some examples, the particles and/or the protrusions cover 10% or more, 25% or more, 35% or more, 50% or more, or 70% or more of the top surface of the insulator layer. In some examples, the particles and/or the protrusions cover 35% of the top surface of the insulator layer. The coverage of the top surface of the insulator layer by the catalyst material (e.g., by the particles and/or the protrusions) can, for example, be selected to enable a desired balance between available catalyst surface area and transmission of light into the light absorbing material.

In some examples, the catalyst material can comprise a metal, the light absorbing layer can comprise a semiconductor, and the photoelectrodes described herein comprise metal-insulator-semiconductor photoelectrodes.

Methods of Making

Also disclosed herein are methods of making photoelectrodes, such as any of the photoelectrodes disclosed herein. For example, disclosed herein are methods of making a photoelectrode, the method comprising: forming the insulator layer on the light absorbing layer; depositing a reactive layer comprising a reactive material on the insulator layer, such that the insulator layer is disposed between the light absorbing layer and the reactive layer, thereby forming a precursor electrode; annealing the precursor electrode such that the reactive material reacts with and diffuses through the insulator layer, thereby forming a set of spikes comprising the reactive material, wherein each of the set of spikes penetrates through the insulator layer to the light absorbing layer, such that each of the set of spikes is in physical and electrical contact with the light absorbing layer, thereby forming a spiked electrode; and subsequently depositing a catalyst material; thereby forming the photoelectrode comprising: the insulator layer disposed on the light absorbing layer, s set of protrusions that penetrates through the insulator layer to the light absorbing layer, such that each of the set of protrusions is in physical and electrical contact with the light absorbing layer; and a plurality of particles disposed on the insulator layer, wherein at least a portion of the plurality of particles are in physical and electrical contact with at least a portion of the set of protrusions; and wherein the plurality of particles and optionally the set of protrusions comprise the catalyst material.

In some examples, the methods can further comprise doping the light absorbing layer to form a doped region prior to forming the insulator layer. Doping the light absorbing layer can, for example, comprise annealing the light absorbing layer in the presence of a dopant source, ion implantation, or other methods such as those known in the art. In some examples, doping the light absorbing layer can comprise annealing the light absorbing layer in the presence of a dopant source. The dopant source can, for example, comprise a dopant, such as an n-type dopant or a p-type dopant. In some examples, the dopant source can comprise a compound or molecule that comprises a dopant atom, such as an n-type dopant or a p-type dopant. In some examples, the dopant source comprises a boron source. In some examples, annealing the light absorbing layer in the presence of a dopant source is performed in an inert atmosphere (e.g., nitrogen, argon, etc.).

In some examples, annealing comprises heating the insulator layer at a temperature of 100° C. or more in the presence of the dopant source for an amount of time (e.g., 150° C. or more, 200° C. or more, 250° C. or more, 300° C. or more, 350° C. or more, 400° C. or more, 450° C. or more, 500° C. or more, 550° C. or more, 600° C. or more, 650° C. or more, 700° C. or more, 750° C. or more, 800° C. or more, 850° C. or more, 900° C. or more, 950° C. or more, 1000° C. or more, 1100° C. or more, 1200° C. or more, 1300° C. or more, 1400° C. or more, 1500° C. or more, 1600° C. or more, or 1700° C. or more). In some examples, annealing comprises heating the insulator layer at a temperature of 1800° C. or less in the presence of the dopant source for an amount of time (e.g., 1700° C. or less, 1600° C. or less, 1500° C. or less, 1400° C. or less, 1300° C. or less, 1200° C. or less, 1100° C. or less, 1000° C. or less, 950° C. or less, 900° C. or less, 850° C. or less, 800° C. or less, 750° C. or less, 700° C. or less, 650° C. or less, 600° C. or less, 550° C. or less, 500° C. or less, 450° C. or less, 400° C. or less, 350° C. or less, 300° C. or less, 250° C. or less, 200° C. or less, or 150° C. or less). The temperature at which the insulator layer is annealed in the presence of the dopant source for an amount of time can range from any of the minimum values described above to any of the maximum values described above. For example, annealing can comprise heating the insulator layer at a temperature of from 100° C. to 1800° C. in the presence of the dopant source for an amount of time (e.g., from 100° C. to 950° C., from 950° C. to 1800° C., from 100° C. to 500° C., from 500° C. to 900° C., from 900° C. to 1300° C., from 1300° C. to 1800° C., from 200° C. to 1800° C., from 100° C. to 1700° C., from 200° C. to 1700° C., or from 900° C. to 1000° C.).

In some examples, annealing comprises heating the insulator layer at a temperature in the presence of the dopant source for an amount of time of 10 seconds or more (e.g., 15 seconds or more, 20 seconds or more, 25 seconds or more, 30 seconds or more, 35 seconds or more, 40 seconds or more, 45 seconds or more, 50 seconds or more, 55 seconds or more, 1 minute or more, 1.5 minutes or more, 2 minutes or more, 2.5 minutes or more, 3 minutes or more, 3.5 minutes or more, 4 minutes or more, 4.5 minutes or more, 5 minutes or more, 6 minutes or more, 7 minutes or more, 8 minutes or more, 9 minutes or more, 10 minutes or more, 15 minutes or more, 20 minutes or more, 25 minutes or more, 30 minutes or more, 35 minutes or more, 40 minutes or more, 45 minutes or more, 50 minutes or more, 55 minutes or more, 1 hour or more, 1.5 hours or more, 2 hours or more, 2.5 hours or more, 3 hours or more, 3.5 hours or more, 4 hours or more, 4.5 hours or more, 5 hours or more, 6 hours or more, 7 hours or more, 8 hours or more, 9 hours or more, 10 hours or more, 12 hours or more, 14 hours or more, 16 hours or more, 18 hours or more, 24 hours or more, 30 hours or more, 36 hours or more, 42 hours or more, 48 hours or more, 60 hours or more, 72 hours or more, 84 hours or more, or 96 hours or more). In some examples, annealing comprises heating the insulator layer at a temperature in the presence of the dopant source for an amount of time of 100 hours or less (e.g., 96 hours or less, 84 hours or less, 72 hours or less, 60 hours or less, 48 hours or less, 42 hours or less, 36 hours or less, 30 hours or less, 24 hours or less, 18 hours or less, 16 hours or less, 14 hours or less, 12 hours or less, 10 hours or less, 9 hours or less, 8 hours or less, 7 hours or less, 6 hours or less, 5 hours or less, 4.5 hours or less, 4 hours or less, 3.5 hours or less, 3 hours or less, 2.5 hours or less, 2 hours or less, 1.5 hours or less, 1 hours or less, 55 minutes or less, 50 minutes or less, 45 minutes or less, 40 minutes or less, 35 minutes or less, 30 minutes or less, 25 minutes or less, 20 minutes or less, 15 minutes or less, 10 minutes or less, 9 minutes or less, 8 minutes or less, 7 minutes or less, 6 minutes or less, 5 minutes or less, 4.5 minutes or less, 4 minutes or less, 3.5 minutes or less, 3 minutes or less, 2.5 minutes or less, 2 minutes or less, 1.5 minutes or less, 1 minute or less, 55 seconds or less, 50 seconds or less, 45 seconds or less, 50 seconds or less, 35 seconds or less, 30 seconds or less, 25 seconds or less, 20 seconds or less, or 15 seconds or less). The amount of time for which the insulator layer is annealed in the presence of the dopant source at a temperature can range from any of the minimum values described above to any of the maximum values described above. For example, annealing comprises heating the insulator layer at a temperature in the presence of the dopant source for an amount of time of from 10 seconds to 100 hours (e.g., from 10 seconds to 1 minute, from 1 minute to 1 hour, from 1 hour to 24 hours, from 24 hours to 100 hours, from 10 seconds to 90 hours, from 1 minute to 100 hours, from 1 minute to 90 hours, or from 60 minutes to 1.5 hours).

Forming the insulator layer can, for example, comprise thermal oxidation, electroplating, lithographic deposition, electron beam deposition, thermal deposition, spin coating, drop-casting, zone casting, dip coating, blade coating, spraying, vacuum filtration, chemical vapor deposition (CVD), atomic layer deposition (ALD), physical vapor deposition (PVD), sputtering, pulsed layer deposition, molecular beam epitaxy, evaporation, or combinations thereof.

In some examples, forming the insulator layer comprises thermal oxidation. Thermal oxidation can, for example, comprise heating the light absorbing layer at a temperature of 800° C. or more in the presence of oxygen for an amount of time (e.g., 800° C. or more, 850° C. or more, 900° C. or more, 950° C. or more, 1000° C. or more, 1050° C. or more, 1100° C. or more, or 1150° C. or more). In some examples, forming the insulator layer can comprise heating the light absorbing layer at a temperature of 1200° C. or less in the presence of oxygen for an amount of time (e.g., 1150° C. or less, 1100° C. or less, 1050° C. or less, 1000° C. or less, 950° C. or less, 900° C. or less, or 850° C. or less). The temperature at which the light absorbing layer is heated in the presence of oxygen for an amount of time can range from any of the minimum values described above to any of the maximum values described above. For example, forming the insulator layer can comprise heating the light absorbing layer at a temperature of from 800° C. to 1200° C. in the presence of oxygen for an amount of time (e.g., from 800° C. to 1000° C., from 1000° C. to 1200° C., from 800° C. to 900° C., from 900° C., to 1000° C., from 1000° C. to 1100° C., from 1100° C. to 1200° C., from 850° C. to 1200° C., from 800° C. to 1150° C., or from 850° C. to 1150° C.).

In some examples, forming the insulator layer can comprise heating the light absorbing layer at a temperature in the presence of oxygen for an amount of time of 10 seconds or more (e.g., 15 seconds or more, 20 seconds or more, 25 seconds or more, 30 seconds or more, 35 seconds or more, 40 seconds or more, 45 seconds or more, 50 seconds or more, 55 seconds or more, 1 minute or more, 1.5 minutes or more, 2 minutes or more, 2.5 minutes or more, 3 minutes or more, 3.5 minutes or more, 4 minutes or more, 4.5 minutes or more, 5 minutes or more, 6 minutes or more, 7 minutes or more, 8 minutes or more, 9 minutes or more, 10 minutes or more, 15 minutes or more, 20 minutes or more, 25 minutes or more, 30 minutes or more, 35 minutes or more, 40 minutes or more, 45 minutes or more, 50 minutes or more, 55 minutes or more, 1 hour or more, 1.5 hours or more, 2 hours or more, 2.5 hours or more, 3 hours or more, 3.5 hours or more, 4 hours or more, 4.5 hours or more, 5 hours or more, 6 hours or more, 7 hours or more, 8 hours or more, 9 hours or more, 10 hours or more, 12 hours or more, 14 hours or more, 16 hours or more, 18 hours or more, 20 hours or more, 24 hours or more, 26 hours or more, or 28 hours or more). In some examples, forming the insulator layer can comprise heating the light absorbing layer at a temperature in the presence of oxygen for an amount of time of 30 hours or less (e.g., 28 hours or less, 26 hours or less, 24 hours or less, 20 hours or less, 18 hours or less, 16 hours or less, 14 hours or less, 12 hours or less, 10 hours or less, 9 hours or less, 8 hours or less, 7 hours or less, 6 hours or less, 5 hours or less, 4.5 hours or less, 4 hours or less, 3.5 hours or less, 3 hours or less, 2.5 hours or less, 2 hours or less, 1.5 hours or less, 1 hours or less, 55 minutes or less, 50 minutes or less, 45 minutes or less, 40 minutes or less, 35 minutes or less, 30 minutes or less, 25 minutes or less, 20 minutes or less, 15 minutes or less, 10 minutes or less, 9 minutes or less, 8 minutes or less, 7 minutes or less, 6 minutes or less, 5 minutes or less, 4.5 minutes or less, 4 minutes or less, 3.5 minutes or less, 3 minutes or less, 2.5 minutes or less, 2 minutes or less, 1.5 minutes or less, 1 minute or less, 55 seconds or less, 50 seconds or less, 45 seconds or less, 50 seconds or less, 35 seconds or less, 30 seconds or less, 25 seconds or less, 20 seconds or less, or 15 seconds or less). The amount of time for which the light absorbing layer is heated in the presence of oxygen at a temperature can range from any of the minimum values described above to any of the maximum values described above. For example, forming the insulator layer can comprise heating the light absorbing layer at a temperature in the presence of oxygen for an amount of time of from 10 seconds to 30 hours (e.g., from 10 seconds to 1 minute, from 1 minute to 1 hour, from 1 hour to 30 hours, from 10 seconds to 24 hours, from 1 minute to 30 hours, or from 1 minute to 24 hours, or from 60 minutes to 1.5 hours).

Depositing the reactive layer can, for example, comprise electroplating, lithographic deposition, electron beam deposition, thermal deposition, spin coating, drop-casting, zone casting, dip coating, blade coating, spraying, vacuum filtration, chemical vapor deposition (CVD), atomic layer deposition (ALD), physical vapor deposition (PVD), sputtering, pulsed layer deposition, molecular beam epitaxy, evaporation, or combinations thereof. In some examples, depositing the reactive layer comprises sputtering.

The reactive layer can comprise any material consistent with the methods, devices, and systems disclosed herein. For example, the reactive layer can comprise Al.

The reactive layer can, for example, have an average thickness of 1 nm or more (e.g., 1.5 nm or more, 2 nm or more, 2.5 nm or more, 3 nm or more, 4 nm or more, 5 nm or more, 10 nm or more, 15 nm or more, 20 nm or more, 25 nm or more, 30 nm or more, 35 nm or more, 40 nm or more, 45 nm or more, 50 nm or more, 55 nm or more, 60 nm or more, 65 nm or more, 70 nm or more, 75 nm or more, 80 nm or more, 85 nm or more, 90 nm or more, 95 nm or more, 100 nm or more, 110 nm or more, 120 nm or more, 130 nm or more, 140 nm or more, 150 nm or more, 175 nm or more, 200 nm or more, 225 nm or more, 250 nm or more, 300 nm or more, 350 nm or more, 400 nm or more, 450 nm or more, 500 nm or more, 600 nm or more, 700 nm or more, 800 nm or more, 900 nm or more, 1 μm or more, 1.5 μm or more, 2 μm or more, 2.5 μm or more, 3 μm or more, 3.5 μm or more, or 4 μm or more). In some examples, the reactive layer can have an average thickness of 5 μm or less (e.g., 4.5 μm or less, 4 μm or less, 3.5 μm or less, 3 μm or less, 2.5 μm or less, 2 μm or less, 1.5 μm or less, 1 μm or less, 900 nm or less, 800 nm or less, 700 nm or less, 600 nm or less, 500 nm or less, 450 nm or less, 400 nm or less, 350 nm or less, 300 nm or less, 250 nm or less, 225 nm or less, 200 nm or less, 175 nm or less, 150 nm or less, 140 nm or less, 130 nm or less, 120 nm or less, 110 nm or less, 100 nm or less, 95 nm or less, 90 nm or less, 85 nm or less, 80 nm or less, 75 nm or less, 70 nm or less, 65 nm or less, 60 nm or less, 55 nm or less, 50 nm or less, 45 nm or less, 40 nm or less, 35 nm or less, 30 nm or less, 25 nm or less, 20 nm or less, 15 nm or less, 10 nm or less, 5 nm or less, 4 nm or less, 3 nm or less, 2.5 nm or less, or 2 nm or less). The average thickness of the reactive layer can range from any of the minimum values described above to any of the maximum values described above. For examples, the average thickness of the reactive layer can be from 1 nm to 5 μm (e.g., from 1 nm to 500 nm, from 500 nm to 5 μm, from 1 nm to 10 nm, from 10 nm to 100 nm, from 100 nm to 1 μm, from 1 μm to 5 μm, from 10 nm to 5 μm, from 1 nm to 1 μm, or from 10 nm to 1 μm).

Annealing the precursor electrode can, for example, comprise heating the precursor electrode at a temperature of 300° C. or more (e.g., 350° C. or more, 400° C. or more, 450° C. or more, 500° C. or more, 550° C. or more, 600° C. or more, 650° C. or more, 700° C. or more, 750° C. or more, 800° C. or more, 850° C. or more, 900° C. or more, 950° C. or more, 1000° C. or more, 1100° C. or more, 1200° C. or more, 1300° C. or more, or 1400° C. or more). In some examples, annealing the precursor electrode can comprise heating the precursor electrode at a temperature of 1500° C. or less (e.g., 1400° C. or less, 1300° C. or less, 1200° C. or less, 1100° C. or less, 1000° C. or less, 950° C. or less, 900° C. or less, 850° C. or less, 800° C. or less, 750° C. or less, 700° C. or less, 650° C. or less, 600° C. or less, 550° C. or less, 500° C. or less, 450° C. or less, 400° C. or less, or 350° C. or less). The temperature at which the precursor electrode is annealed can range from any of the minimum values described above to any of the maximum values described above. For example, annealing the precursor electrode can comprise heating the precursor electrode at a temperature of from 300° C. to 1500° C. (e.g., from 300° C. to 900° C., from 900° C. to 1500° C., from 300° C. to 600° C., from 600° C. to 900° C., from 900° C. to 1200° C., from 1200° C. to 1500° C., from 350° C. to 1500° C., from 300° C. to 1400° C., from 350° C. to 1400° C., or from 300° C. to 800° C.).

In some examples, annealing the precursor electrode can comprise heating the precursor electrode at a temperature for an amount of time of 1 minute or more (e.g., 1.5 minutes or more, 2 minutes or more, 2.5 minutes or more, 3 minutes or more, 3.5 minutes or more, 4 minutes or more, 4.5 minutes or more, 5 minutes or more, 6 minutes or more, 7 minutes or more, 8 minutes or more, 9 minutes or more, 10 minutes or more, 15 minutes or more, 20 minutes or more, 25 minutes or more, 30 minutes or more, 35 minutes or more, 40 minutes or more, 45 minutes or more, 50 minutes or more, 55 minutes or more, 1 hour or more, 1.5 hours or more, 2 hours or more, 2.5 hours or more, 3 hours or more, 3.5 hours or more, 4 hours or more, 4.5 hours or more, 5 hours or more, 6 hours or more, 7 hours or more, 8 hours or more, 9 hours or more, 10 hours or more, 12 hours or more, 14 hours or more, 16 hours or more, 18 hours or more, 24 hours or more, 30 hours or more, 36 hours or more, or 42 hours or more). In some examples, annealing the precursor electrode can comprise heating the precursor electrode at a temperature for an amount of time of 48 hours or less (e.g., 42 hours or less, 36 hours or less, 30 hours or less, 24 hours or less, 18 hours or less, 16 hours or less, 14 hours or less, 12 hours or less, 10 hours or less, 9 hours or less, 8 hours or less, 7 hours or less, 6 hours or less, 5 hours or less, 4.5 hours or less, 4 hours or less, 3.5 hours or less, 3 hours or less, 2.5 hours or less, 2 hours or less, 1.5 hours or less, 1 hours or less, 55 minutes or less, 50 minutes or less, 45 minutes or less, 40 minutes or less, 35 minutes or less, 30 minutes or less, 25 minutes or less, 20 minutes or less, 15 minutes or less, 10 minutes or less, 9 minutes or less, 8 minutes or less, 7 minutes or less, 6 minutes or less, 5 minutes or less, 4.5 minutes or less, 4 minutes or less, 3.5 minutes or less, 3 minutes or less, 2.5 minutes or less, 2 minutes or less, or 1.5 minutes or less). The amount of time for which the precursor electrode is annealed at a temperature can range from any of the minimum values described above to any of the maximum values described above. For example, annealing the precursor electrode can comprise heating the precursor electrode at a temperature for an amount of time of from 1 minute to 48 hours (e.g., from 1 minute to 1 hour, from 1 hour to 48 hours, from 1 minute to 42 hours, from 10 minutes to 48 hours, from 10 minutes to 42 hours, or from 1 hour to 24 hours). For example, annealing the precursor electrode can comprise heating the precursor electrode at a temperature of from 450° C. to 650° C. for an amount of time of from 1 hour to 24 hours.

The precursor electrode can, for example, be annealed in vacuum or an atmosphere comprising nitrogen, argon, forming gas, etc.

In some examples, the methods can further comprise removing the reactive material from the spiked electrode before depositing the catalyst material, thereby forming an intermediate electrode. Removing the reactive material can, for example, comprise etching the reactive material. Etching the reactive material can, for example, comprise contacting the reactive material with an etchant. In some examples, the etchant can comprise $H_3PO_4$.

Depositing the catalyst material can, for example, comprise electroplating, lithographic deposition, electron beam deposition, thermal deposition, spin coating, drop-casting, zone casting, dip coating, blade coating, spraying, vacuum filtration, chemical vapor deposition (CVD), atomic layer deposition (ALD), physical vapor deposition (PVD), sputtering, pulsed layer deposition, molecular beam epitaxy, evaporation, or combinations thereof. In some examples, depositing the catalyst material comprises electroplating.

Electroplating the catalyst material can, for example, comprise contacting light absorbing layer of the spiked electrode or the intermediate electrode with a plating solution and subsequently applying a voltage for an amount of time. The plating solution can, for example, comprise a salt of the metal. In some examples, the plating solution comprises $NiCl_2$, $NiSO_4$, or a combination thereof. Different plating solutions can, for example, be used sequentially during an electroplating process.

The applied voltage can, for example, be −5 Volts (V) or more vs Ag/AgCl (e.g., −4.5 V or more, −4 V or more, −3.5 V or more, −3 V or more, −2.5 V or more, −2 V or more, −1.5 V or more, −1 V or more, −0.5 V or more, 0 V or more, 0.5 V or more, 1 V or more, 1.5 V or more, 2 V or more, 2.5 V or more, 3 V or more, 3.5 V or more, 4 V or more, or 4.5 V or more). In some examples, the applied voltage can be 5 V or less vs. Ag/AgCl (e.g., 4.5 V or less, 4 V or less, 3.5 V or less, 3 V or less, 2.5 V or less, 2 V or less, 1.5 V or less, 1 V or less, 0.5 V or less, 0 V or less, −0.5 V or less, −1 V or less, −1.5 V or less, −2 V or less, −2.5 V or less, −3 V or less, −3.5 V or less, −4 V or less, or −4.5 V or less). The applied voltage can range from any of the minimum values described above to any of the maximum values described above. For example, the applied voltage can be from −5 V to +5 V (e.g., from −5 V to 0 V, from 0 V to 5 V, from −5 V to −2.5 V, from −2.5 V to 0 V, from 0 V to 2.5 V, from 2.5 V to 5 V, from −5 V to 4 V, from −4 V to 5 V, from −4 V to 4 V, or from −0.5 V to −3.0 V). In some examples, the applied voltage is from −0.5 V to −3.0 V vs. Ag/AgCl.

In some examples, the voltage is applied for an amount of time of 10 seconds or more (e.g., 15 seconds or more, 20 seconds or more, 25 seconds or more, 30 seconds or more, 35 seconds or more, 40 seconds or more, 45 seconds or more, 50 seconds or more, 55 seconds or more, 1 minute or more, 1.5 minutes or more, 2 minutes or more, 2.5 minutes or more, 3 minutes or more, 3.5 minutes or more, 4 minutes or more, 4.5 minutes or more, 5 minutes or more, 6 minutes or more, 7 minutes or more, 8 minutes or more, 9 minutes or more, 10 minutes or more, 15 minutes or more, 20 minutes or more, 25 minutes or more, 30 minutes or more, 35 minutes or more, 40 minutes or more, 45 minutes or more, 50 minutes or more, 55 minutes or more, 1 hour or more, 1.5 hours or more, 2 hours or more, 2.5 hours or more, 3 hours or more, 3.5 hours or more, 4 hours or more, 4.5 hours or more, 5 hours or more, 6 hours or more, 7 hours or more, 8 hours or more, 9 hours or more, or 10 hours or more). In some examples, the voltage is applied for an amount of time of 12 hours or less (e.g., 11 hours or less, 10 hours or less, 9 hours or less, 8 hours or less, 7 hours or less, 6 hours or less, 5 hours or less, 4.5 hours or less, 4 hours or less, 3.5 hours or less, 3 hours or less, 2.5 hours or less, 2 hours or less, 1.5 hours or less, 1 hours or less, 55 minutes or less, 50 minutes or less, 45 minutes or less, 40 minutes or less, 35 minutes or less, 30 minutes or less, 25 minutes or less, 20 minutes or less, 15 minutes or less, 10 minutes or less, 9 minutes or less, 8 minutes or less, 7 minutes or less, 6 minutes or less, 5 minutes or less, 4.5 minutes or less, 4 minutes or less, 3.5 minutes or less, 3 minutes or less, 2.5 minutes or less, 2 minutes or less, 1.5 minutes or less, 1 minute or less, 55 seconds or less, 50 seconds or less, 45 seconds or less, 50 seconds or less, 35 seconds or less, 30 seconds or less, 25 seconds or less, 20 seconds or less, or 15 seconds or less). The amount of time for which the voltage is applied can range from any of the minimum values described above to any of the maximum values described above. For example, the voltage can be applied for an amount of time of from 10 seconds to 12 hours (e.g., from 10 seconds to 2 hours, from 2 hours to 12 hours, from 10 seconds to 1 minute, from 1 minute to 1 hour, from 1 hour to 12 hours, from 1 minute to 12 hours, from 10 seconds to 10 hours, from 1 minute to 10 hours, or from 1 minute to 6 hours). In some examples, voltage is applied for an amount of time of from 1 minute to 120 minutes. In some examples, the morphology and/or composition of the deposited catalyst material can be controlled by varying the applied bias and deposition time for electrodeposition during the electrodeposition process.

Devices and Methods of Use

Also disclosed herein are devices comprising any of the photoelectrodes described herein and methods of use of any of the photoelectrodes or devices described herein.

For example, also disclosed herein are methods of use of any of the photoelectrodes disclosed herein. The methods can, for example, comprise using the photoelectrode as an electrode in a photoelectrochemical reaction. In some examples, the methods can comprise using the photoelectrode as an electrode in an energy conversion device, a charge storage device, an electronic device, an optoelectronic device, or a combination thereof. In some examples, the methods can comprise using the photoelectrode as an electrode in an energy conversion device, wherein the energy conversion device comprises a solar cell, a fuel cell, a photovoltaic cell, another type of voltage or current source. or a combination thereof Also disclosed herein are devices comprising any of the photoelectrodes described herein. For example, the device can comprise an energy conversion device, a charge storage device, an electronic device, an optoelectronic device, or a combination thereof. In some examples, the device can comprise an energy conversion device, such as a solar cell, a fuel cell, a photovoltaic cell, another type of voltage or current source, or a combination thereof.

Also disclosed herein are photoelectrochemical cells comprising any of the photoelectrodes described herein and methods of use thereof. For example, also disclosed herein are photoelectrochemical cells comprising: a working electrode in electrochemical contact with a fluid and one or more additional electrodes in electrochemical contact with the fluid, wherein the working electrode can comprise any of the photoelectrodes disclosed herein.

In some examples, the fluid can comprise a fuel precursor. Examples of fuel precursors include, but are not limited to, water, carbon dioxide, and combinations thereof. In some examples, the fuel precursor comprises water in the form of an aqueous solution, such as, for example, contaminated water, nonpurified water, saline water, sea water, etc.

Also disclosed herein are methods of use of any of the photoelectrochemical cells disclosed herein. In some examples, the fluid comprises a fuel precursor and the method can comprise photoelectrochemical fuel generation. The method can, for example, comprise illuminating the photoelectrode in contact with the fuel precursor with electromagnetic radiation that overlaps at least a portion of the photon energy range absorbed by the light absorbing, thereby providing photogenerated electrons or holes in the light absorbing which are transported to the catalyst material at the interface between the photoelectrode and the fuel precursor which participate in the desired electrochemical reaction to thereby convert the fuel precursor to a fuel. In some examples, the methods can further comprise collecting the fuel.

The electromagnetic radiation can, for example, comprise light and the light can be provided by a light source. The light source can be any type of light source. Examples of suitable light sources include natural light sources (e.g., sunlight) and artificial light sources (e.g., incandescent light bulbs, light emitting diodes, gas discharge lamps, arc lamps, lasers, etc.). In some examples, the electromagnetic radiation comprises sunlight. In some examples, the method comprises solar powered photoelectrochemical fuel production.

In some examples, the fuel precursor comprises water and the method comprises photoelectrochemical water splitting. In some examples, the fuel precursor comprise water, the electromagnetic radiation comprises sunlight, and the method comprises solar water splitting.

In some examples, the fuel comprises $H_2$ and the method comprises photoelectrochemical hydrogen generation.

In some examples, the photoelectrode participates in an oxygen evolution reaction and exhibits an onset potential of 1.5 V or less vs. RHE (e.g., 1.4 V or less, 1.3 V or less, 1.2 V or less, 1.1 V or less, 1.0 V or less, 0.9 V or less, 0.8 V or less, 0.7 V or less, 0.6 V or less, 0.5 V or less, 0.4 V or less, 0.3 V or less, 0.2 V or less, or 0.1 V or less) and a saturation current density of 1 mA/cm$^2$ or more (e.g., 2 mA/cm$^2$ or more, 3 mA/cm$^2$ or more, 4 mA/cm$^2$ or more, 5 mA/cm$^2$ or more, 10 mA/cm$^2$ or more, 15 mA/cm$^2$ or more, 20 mA/cm$^2$ or more, 25 mA/cm$^2$ or more, 30 mA/cm$^2$ or more, 35 mA/cm$^2$ or more, 40 mA/cm$^2$ or more, 45 mA/cm$^2$ or more, or 50 mA/cm$^2$ or more) for AM1.5G solar illumination. In some examples, the onset potential is 1.5 V or less, 1.1 V or less, 1.0 V or less, 0.9 V or less, 0.7 V or less vs. RHE. In some examples, the saturation current density is 1 mA/cm$^2$ or more, 5 mA/cm$^2$ or more, 10 mA/cm$^2$ or more, 15 mA/cm$^2$ or more, 25 mA/cm$^2$ or more, or 30 mA/cm$^2$ or more. In some examples, the onset potential is 0.7 V or less vs. RHE and the saturation current density of 32 mA/cm$^2$ or more.

In some examples, the oxygen evolution reaction produces $O_2$ at the photoelectrode at a rate of 1 micromoles/hour or more (e.g., 2 micromoles/hour or more, 3 micromoles/hour or more, 4 micromoles/hour or more, 5 micromoles/hour or more, 10 micromoles/hour or more, 15 micromoles/hour or more, 20 micromoles/hour or more, 25 micromoles/hour or more, 30 micromoles/hour or more, 35 micromoles/hour or more, 40 micromoles/hour or more, or 45 micromoles/hour or more). In some examples, the oxygen evolution reaction produces $O_2$ at the photoelectrode at a rate of 50 micromoles/hour or less (e.g., 45 micromoles/hour or less, 40 micromoles/hour or less, 35 micromoles/hour or less, 30 micromoles/hour or less, 25 micromoles/hour or less, 20 micromoles/hour or less, 15 micromoles/hour or less, 10 micromoles/hour or less, or 5 micromoles/hour or less). The rate at which the oxygen evolution reaction produces $O_2$ at the photoelectrode can range from any of the minimum values described above to any of the maximum values described above. For example, the oxygen evolution reaction can produce $O_2$ at the photoelectrode at a rate of from 1 micromoles/hour to 50 micromoles/hour (e.g., from 1 micromoles/hour to 25 micromoles/hour, from 25 micromoles/hour to 50 micromoles/hour, from 1 micromoles/hour to 10 micromoles/hour, from 10 micromoles/hour to 20 micromoles/hour, from 20 micromoles/hour to 30 micromoles/hour, from 30 micromoles/hour to 40 micromoles/hour, from 40 micromoles/hour to 50 micromoles/hour, from 5 micromoles/hour to 50 micromoles/hour, from 1 micromoles/hour to 40 micromoles/hour, or from 5 micromoles/hour to 40 micromoles/hour).

In some examples, $H_2$ is produced at another electrode in the photoelectrochemical cell at a rate of 1 micromoles/hour or more (e.g., 2 micromoles/hour or more, 3 micromoles/hour or more, 4 micromoles/hour or more, 5 micromoles/hour or more, 10 micromoles/hour or more, 15 micromoles/hour or more, 20 micromoles/hour or more, 25 micromoles/hour or more, 30 micromoles/hour or more, 35 micromoles/ hour or more, 40 micromoles/hour or more, 45 micromoles/hour or more, 50 micromoles/hour or more, 55 micromoles/hour or more, 60 micromoles/hour or more, 65 micromoles/hour or more, 70 micromoles/hour or more, 75 micromoles/hour or more, 80 micromoles/hour or more, 85 micromoles/hour or more, 90 micromoles/hour or more, or 95 micromoles/hour or more). In some examples, $H_2$ is produced at another electrode in the photoelectrochemical cell at a rate of 100 micromoles/hour or less (e.g., 95 micromoles/hour or less, 90 micromoles/hour or less, 85 micromoles/hour or less, 80 micromoles/hour or less, 75 micromoles/hour or less, 70 micromoles/hour or less, 65 micromoles/hour or less, 60 micromoles/hour or less, 55 micromoles/hour or less, 50 micromoles/hour or less, 45 micromoles/hour or less, 40 micromoles/hour or less, 35 micromoles/hour or less, 30 micromoles/hour or less, 25 micromoles/hour or less, 20 micromoles/hour or less, 15 micromoles/hour or less, 10 micromoles/hour or less, or 5 micromoles/hour or less). The rate at which $H_2$ is produced at another electrode in the photoelectrochemical cell can range from any of the minimum values described above to any of the maximum values described above. For example, $H_2$ can be produced at another electrode in the photoelectrochemical cell at a rate of from 1 micromoles/hour to 100 micromoles/hour (e.g., from 1 micromoles/hour to 50 micromoles/hour, from 50 micromoles/hour to 100 micromoles/hour, from 1 micromoles/hour to 20 micromoles/hour, from 20 micromoles/hour to 40 micromoles/hour, from 40 micromoles/hour to 60 micromoles/hour, from 60 micromoles/hour to 80 micromoles/hour, from 80 micromoles/hour to 100 micromoles/hour, from 1 micromoles/hour to 90 micromoles/hour, from 10 micromoles/hour to 100 micromoles/hour, or from 10 micromoles/hour to 90 micromoles/hour).

In some examples, the fuel precursor comprises carbon dioxide and the method comprises photoelectrochemical reduction of $CO_2$.

In some examples, the fluid has a pH of 8 or more and the photoelectrode is stable for 24 hours or more. As used herein, the photoelectrode being "stable" means that the photoelectrode has a photocurrent that is stable, e.g. wherein the photocurrent varies by 10% or less (e.g., 9% or less, 8% or less, 7% or less, 6% or less, 5% or less, 4% or less, 3% or less, 2% or less, or 1% or less) over the selected time period. In some examples, the fluid has a pH of 14 and the photoelectrode is stable for 48 hours or more (e.g., 72 hour or more, 96 hours or more, 120 hours or more, 144 hours or more, or 168 hours or more).

In some examples, the photoelectrochemical fuel generation has a Faradaic efficiency of 10% or more (e.g., 15% or more, 20% or more, 25% or more, 30% or more, 35% or more, 40% or more, 45% or more, 50% or more, 55% or more, 60% or more, 65% or more, 70% or more, 75% or more, 80% or more, 85% or more, 90% or more, 95% or more, or 99% or more). In some examples, the photoelectrochemical fuel generation has a Faradaic efficiency of 100% or less (e.g., 99% or less, 95% or less, 90% or less, 85% or less, 80% or less, 75% or less, 70% or less, 65% or less, 60% or less, 55% or less, 50% or less, 45% or less, 40% or less, 35% or less, 30% or less, 25% or less, 20% or less, or 15% or less). The Faradaic efficiency of the photoelectrochemical fuel generation can range from any of the minimum values described above to any of the maximum values described above. For example, the photoelectrochemical fuel generation can have a Faradaic efficiency of from 10% to 100% (e.g., from 10% to 55%, from 55% to 100%, from 10% to 40%, from 40% to 70%, from 70% to 100%, from 20% to 100%, from 10% to 95%, from 20% to 95%, from 30% to 100%, from 50% to 100%, or from 80% to 100%).

A number of embodiments of the invention have been described. Nevertheless, it will be understood that various modifications may be made without departing from the spirit and scope of the invention. Accordingly, other embodiments are within the scope of the following claims.

The examples below are intended to further illustrate certain aspects of the systems and methods described herein, and are not intended to limit the scope of the claims.

EXAMPLES

The following examples are set forth below to illustrate the methods and results according to the disclosed subject matter. These examples are not intended to be inclusive of all aspects of the subject matter disclosed herein, but rather to illustrate representative methods and results. These examples are not intended to exclude equivalents and variations of the present invention which are apparent to one skilled in the art.

Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of measurement conditions, e.g., component concentrations, temperatures, pressures and other measurement ranges and conditions that can be used to optimize the described process.

Example 1—Enhancing Si-Based Metal-Insulator-Semiconductor Photoanodes for Water Oxidation Using Thin Film Reactions and Electrodeposition Abstract. Metal-insulator-semiconductor (MIS) structures have been widely used in Si-based photoelectrodes to protect the Si absorbing layer from corrosion in aqueous environments. Typically, there is a tradeoff between efficiency and stability when optimizing insulator thickness. Moreover, lithographic patterning is often required for fabricating metal-insulator-semiconductor photoelectrodes. In this study, improved Si-based metal-insulator-semiconductor photoanodes with thick insulating layers are demonstrated. The improved Si-based metal-insulator-semiconductor photoanodes with thick insulating layers are fabricated using thin-film reactions to create localized conduction paths through the insulator and electrodeposition to form metal catalyst islands. This approach yielded metal-insulator-semiconductor photoanodes with low onset potential, high saturation current density, and excellent stability. By combining this approach with a $p^+n$-Si buried junction, further improved oxygen evolution reaction (OER) performance was achieved with an onset potential of 0.7 V versus RHE and saturation current density of 32 mA/cm$^2$.

Introduction. Photoelectrochemical (PEC) water splitting is a promising technology for converting solar energy into clean and storable chemical energy. In photoelectrochemical cells, semiconductors play a key role in absorbing photons from the light source to create mobile charge carriers. Various semiconductor materials have been studied for high performance photoelectrochemical cells, including metal oxides, nitrides, Si, III-V compound semiconductor materials, and others. Among these, Si-based photoelectrodes have attracted substantial interest due to silicon's moderate band-gap (1.12 eV), high charge mobility and diffusion lengths, and well established technological infrastructure. However, Si-based photoanodes for the oxygen evolution reaction (OER) remain challenging to engineer due to the complex four-electron reaction mechanism, which requires a large overpotential, and low chemical stability in alkaline solutions. To improve the oxygen evolution reaction performance of Si-based photoanodes, metal-insulator-semiconductor (MIS) structures have been widely used for Si-based photoanodes due to their high efficiency and good stability (Laskowski F A L et al. *Nature Materials* 2020, 19, 69-76, Ji L et al *Nature Materials* 2017, 16, 127-131; Loget G et al. *ACS Energy Letters* 2017, 2, 569-573; Scheuermann A G et al. *ACS Applied Materials & Interfaces* 2016, 8, 14596-14603). An efficient metal catalyst at the surface can improve the reaction kinetics of photoanodes, reducing the overpotential for the oxygen evolution reaction. Corrosion of Si in aqueous electrolytes can be prevented in metal-insulator-semiconductor photoelectrode structures by protecting the Si surface with thin layers of insulators such as $TiO_2$ (Chuang C H et al. *ACS Applied Energy Materials* 2020, 3, 3902-3908; Scheuermann A G et al. *ACS Applied Materials & Interfaces* 2016, 8, 14596-14603: Liu B et al. *Energy & Environmental Science* 2020, 13, 221-228), $NiO_x$ (Laskowski F A L et al. *Nature Materials* 2020, 19, 69-76; Loget G et al. *ACS Energy Letters* 2017, 2, 569-573; Zhao J et al. *Nano Research* 2018, 11, 3499-3508), $SrTiO_3$ (Ji L et al. *Nature Nanotechnology* 2015, 10, 84-90), $SiN_x$ (Kumar P et al. *Communications Chemistry* 2019, 2, 4), and $SiO_x$ (Laskowski F A L et al. *Nature Materials* 2020, 19, 69-76; Ji L et al. *Nature Materials* 2017, 16, 127-131: Loget G et al. *ACS Energy Letters* 2017, 2, 569-573).

Figure 2:
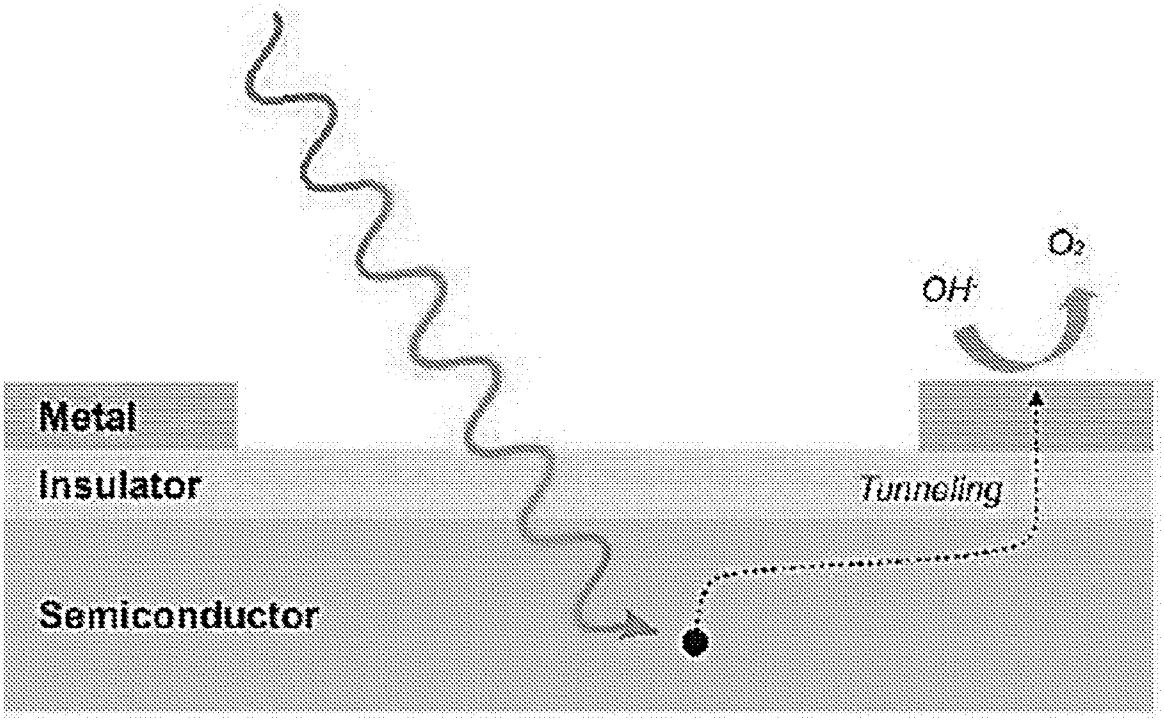
FIG. 2. Schematic of a metal-insulator-semiconductor photoanode for oxygen evolution reaction process by tunneling through a thin insulator.

Typically, for a Si-based metal-insulator-semiconductor photoanode, minority carriers are generated under illumination in the semiconductor and extracted to the metal layer by tunneling through the insulator, as shown in FIG. 2. The tunneling current density decreases exponentially with increasing insulator layer thickness, so that, with few exceptions (Ji L et al. *Nature Materials* 2017, 16, 127-131), ultrathin insulators (e.g., under 5 nm) are needed for efficient metal-insulator-semiconductor photoanodes (Maity N P et al. *Superlattices and Microstructures* 2017, 111, 628-641). However, it has also been reported that metal-insulator-semiconductor photoelectrodes with thin insulator layers can be susceptible to corrosion of the semiconductor in alkaline solutions, so that insulator layer thicknesses above 50 nm are required for long-term stability in alkaline solutions (Shan C X et al. *Surface and Coatings Technology* 2008, 202, 2399-2402). Optimizing the insulating layer thickness can therefore be key to the oxygen evolution reaction performance of metal-insulator-semiconductor photoanodes, due to this trade-off between efficiency and stability.

Previous work has demonstrated improvements in effective conductivity of a thick insulating layer in metal-insulator-semiconductor photoelectrodes by electrically inducing localized dielectric breakdown of the insulating region below metal catalyst islands (Ji L et al. *Nature Materials* 2017, 16, 127-131). Since the breakdown process resulted in formation of localized conductive paths through the thick oxide layer, photogenerated minority carriers are easily transported via the conductive path instead of by tunneling. Using this approach, improved photocurrents were observed with good long-term stability due to the thick insulating layers. Nevertheless, this method requires complex and time-consuming processing techniques for the formation of localized breakdown paths and lithographic patterning of the top metal layer. Recently, the deposition of Ni catalysts for the metal layer of metal-insulator-semiconductor photoanodes using electrodeposition and electroless deposition have been reported (Loget G et al. *ACS Energy Letters* 2017, 2, 569-573; Zhao J et al. *Nano Research* 2018, 11, 3499-3508). These methods yielded well defined Ni deposition for the metal-insulator-semiconductor photoanode and enabled efficient oxygen evolution reaction performance without using complex lithographic techniques (Loget G et al. *ACS Energy Letters* 2017, 2, 569-573; Zhao J et al. *Nano Research* 2018, 11, 3499-3508). However, there was still a limitation in the long-term stability in high pH aqueous solutions (Loget G et al. *ACS Energy Letters* 2017, 2, 569-573; Zhao J et al. *Nano Research* 2018, 11, 3499-3508).

Figure 3:
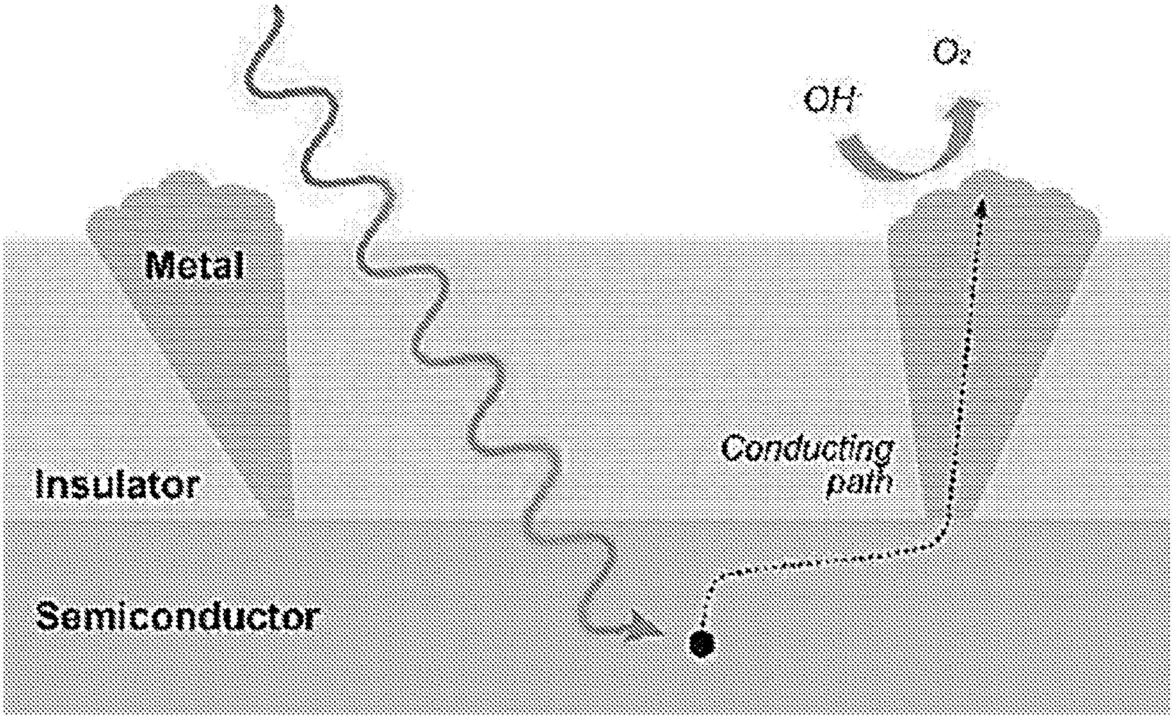
FIG. 3. Schematic of a metal-insulator-semiconductor photoanode for oxygen evolution reaction process by passing along the conductive path through the localized metal spike.

Herein, a low cost and highly scalable method for improving Si-based metal-insulator-semiconductor photoanodes by exploiting a thin-film reaction of Al through an insulating oxide layer followed by Ni-electrodeposition, and not requiring any lithographic patterning is demonstrated. The thin-film reaction of Al with $SiO_2$ or Si, leading to localized penetration of Al "spikes" into the underlying material, has been studied extensively since it can cause an electrical short in silicon pn-junction structures with Al contact metallization. Al spiking can also occur through an insulating $SiO_2$ layer, and has been exploited to form Ohmic contacts through an oxide passivation layer on Si (Bierhals A et al. *Journal of Applied Physics* 1998, 83, 1371-1378; Ho AWY et al. *Progress in Photovoltaics: Research and Applications* 2004, 12, 297-308). In a metal-insulator-semiconductor photoelectrode structure with Al as the metal layer, annealing of the Al/$SiO_2$/Si structure above 300° C. causes Al to penetrate the underlying $SiO_2$ and induces formation of localized metal spikes in the metal-insulator-semiconductor structure. As shown in FIG. 3, each metal spike provides a conductive path through the thick $SiO_2$ layer. The surrounding regions of oxide remain electrically insulating and retain their protective functionality. In this work, after the formation of localized Al spikes through the $SiO_2$ layer, the Al is etched and replaced, via electrodeposition, by Ni, which serves as the oxygen evolution reaction catalyst. During the electrodeposition process, Ni covers the exposed Si surface resulting in growth of dispersed Ni nano-islands on the $SiO_2$ surface at the corresponding locations. The remaining exposed thick $SiO_2$ and the electrodeposited Ni have good corrosion resistance in alkaline aqueous solutions. This process results in formation of Si-based metal-insulator-semiconductor photoanodes with high efficiency, good long-term stability, low cost, and high manufacturability without using any complex and costly lithographic patterning techniques.

Al Thin-Film Reaction on Si-Based Metal-Insulator-Semiconductor Photoanode

Figure 4:
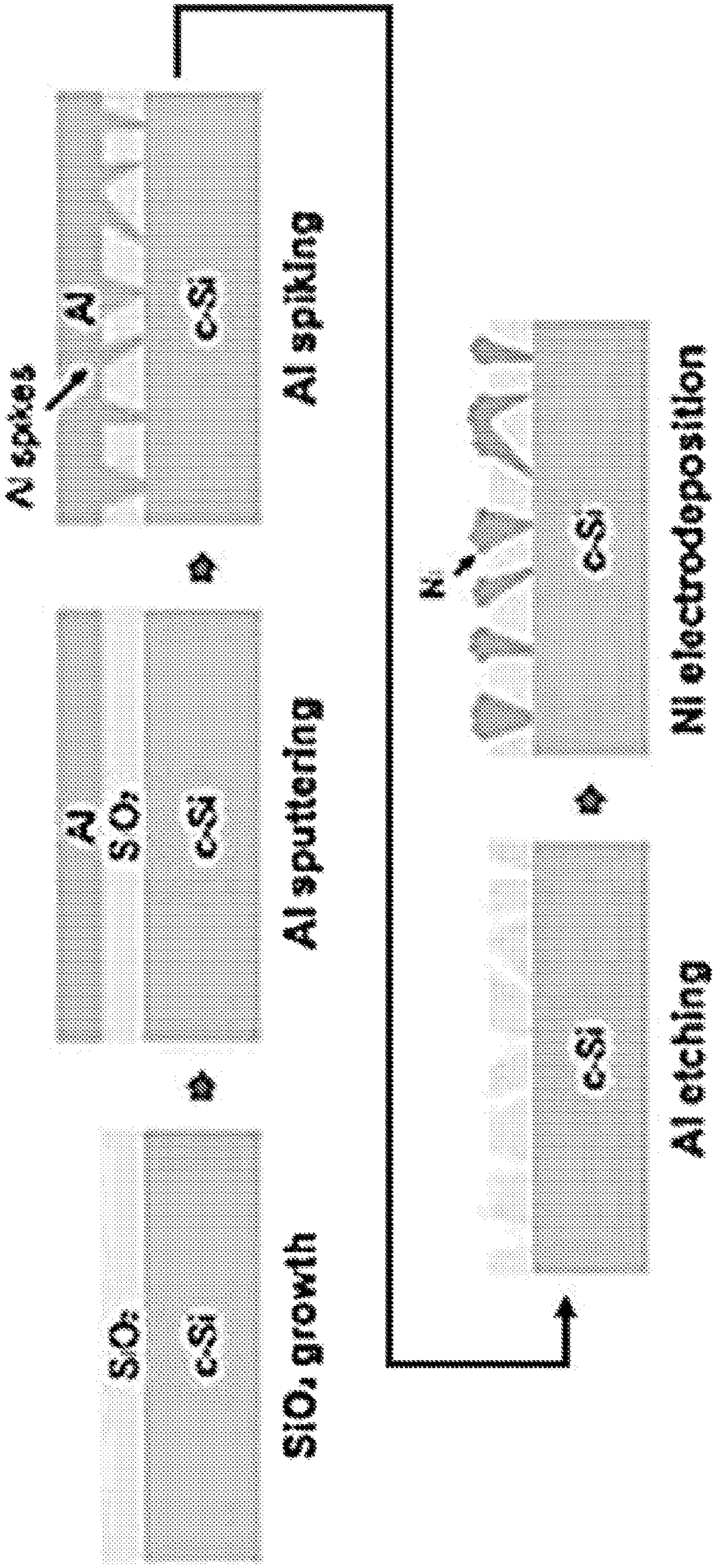
FIG. 4. Schematics of the fabrication methods for the spiked Ni/$SiO_2$/Si metal-insulator-semiconductor photoanode structure.

FIG. 4 shows the fabrication process of the Si metal-insulator-semiconductor photoanode using the Al/$SiO_2$ thin-film reaction to form localized Al spikes. As shown in FIG. 3, to help ensure long-term stability of the photoanode, 90 nm thick $SiO_2$ layers were formed by thermal oxidation to serve as the insulator of the metal-insulator-semiconductor structure (Shan C X et al. *Surface and Coatings Technology* 2008, 202, 2399-2402). A 90 nm thick $SiO_2$ layer also provides low reflectance in water in the 400~600 nm wavelength range. To form localized Al paths through the $SiO_2$ insulating layer, 100 nm Al was deposited by DC sputtering, followed by annealing. During the annealing process, the Al penetrates locally through the $SiO_2$ layer and contacts the Si substrate. Since this Al spiking thin-film reaction occurs in localized areas across the whole surface, an array of localized contacts between the metal and semiconductor layers is formed within the $Al/SiO_2/Si$ structure. Since the Al film is easily corroded in solution, however, it is not suitable for the metal layer of an metal-insulator-semiconductor photoanode. Therefore, the Al was replaced by Ni, which shows good stability and act as a catalyst for the oxygen evolution reaction (OER). The Al layer was first etched by Al etchant, leaving the corresponding areas of the Si surface exposed with little porosity in the other regions of the $SiO_2$ layer. After etching the Al, Ni was deposited on the resulting surface by electrodeposition. During this process, Ni fills the exposed Si area first and then forms nano-islands, since higher electric fields are present at the exposed Si surface. As a result, a $Ni/SiO_2/Si$ metal-insulator-semiconductor photoanode with localized Ni conductive paths through the oxide can be fabricated using the Al thin-film reaction followed by etching and Ni electrodeposition without requiring any lithographic processes.

Figure 5:
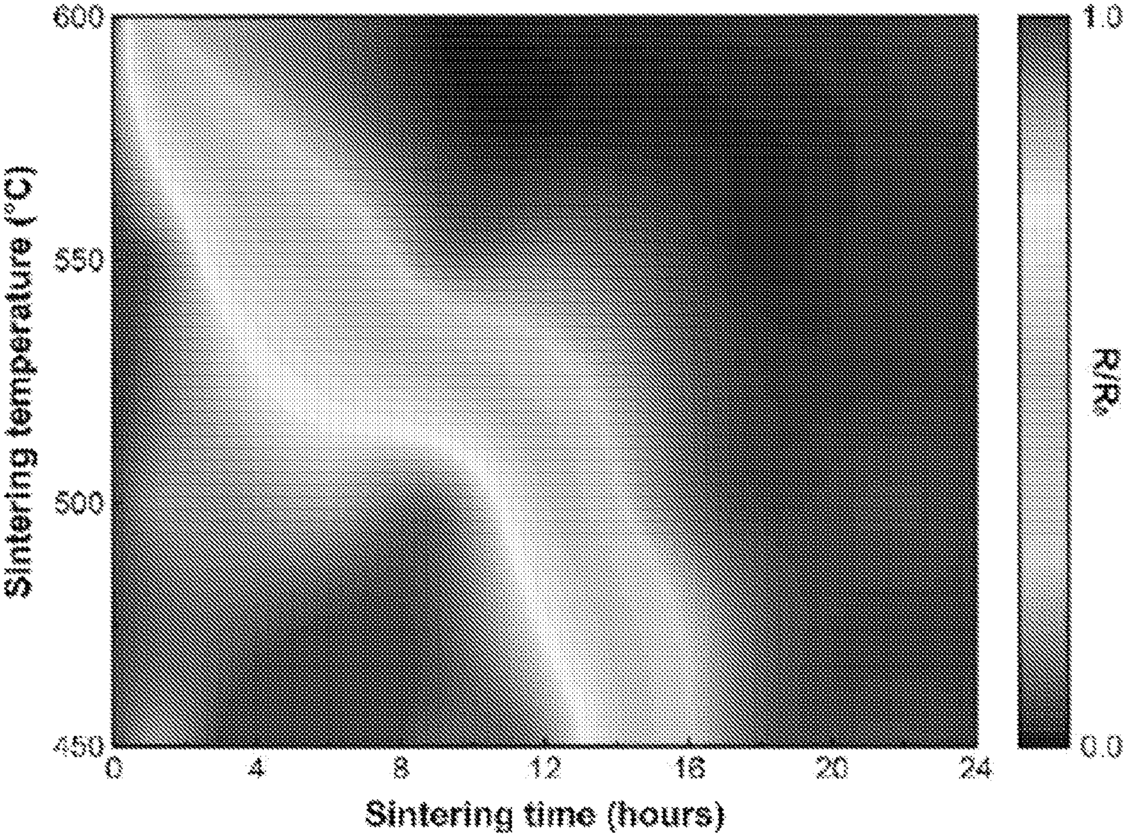
FIG. 5. Measured resistance changes of Al/$SiO_2$/Si/$SiO_2$/Al samples after annealing processes as varying the temperature and duration.
Figure 6:
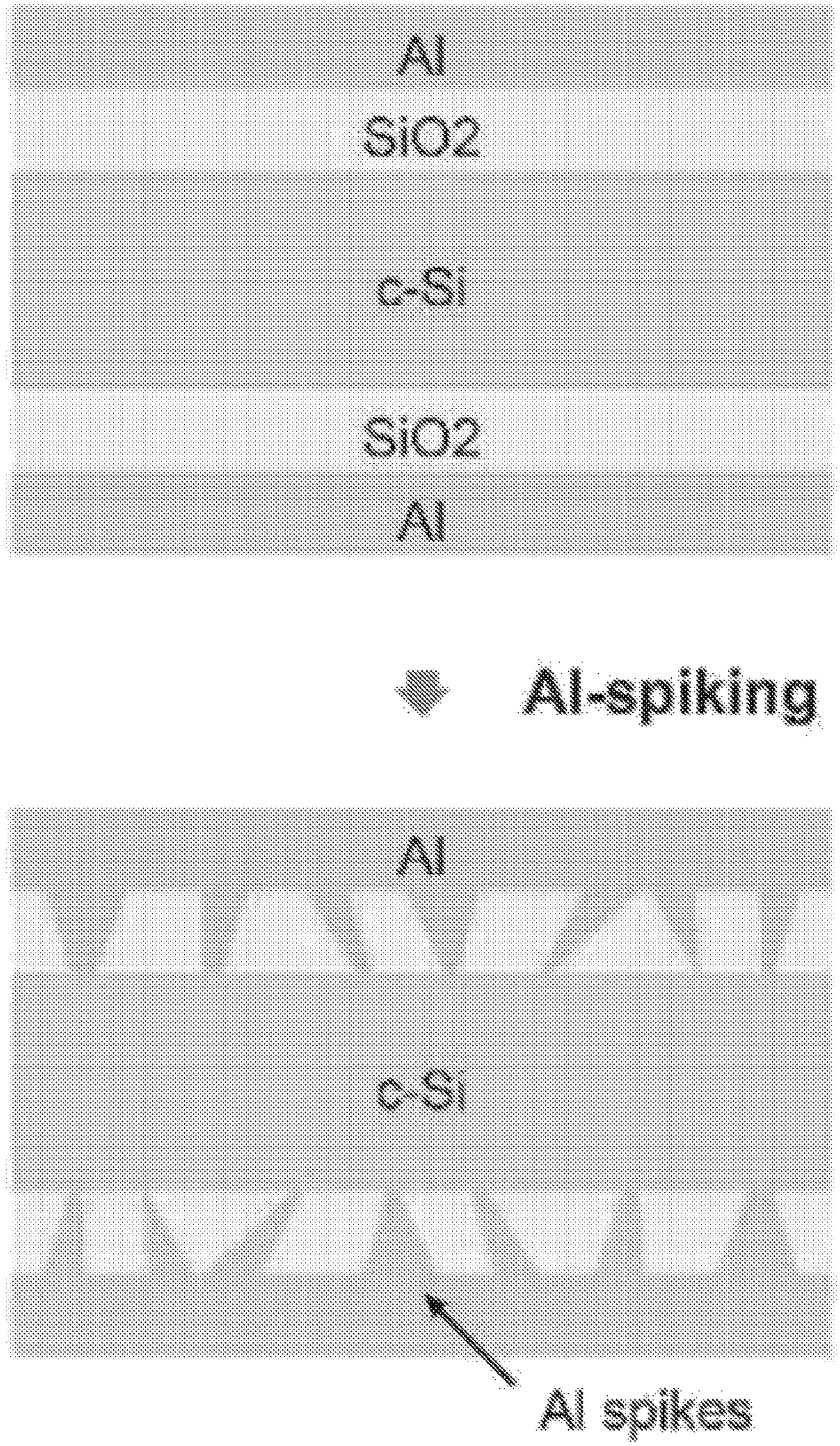
FIG. 6. Schematics of Al/$SiO_2$/Si/$SiO_2$/Al sample before and after the formation of localized Al spikes by annealing process.
Figure 7:
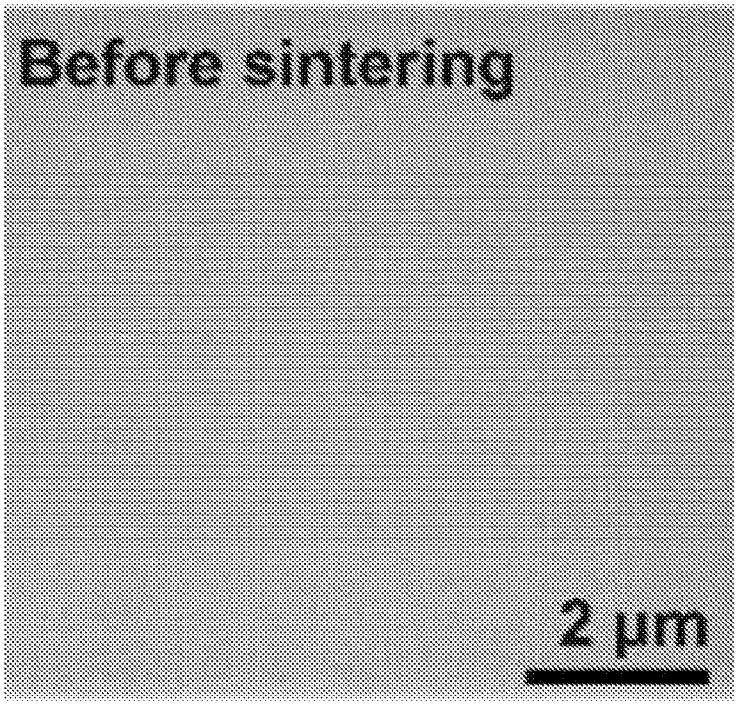
FIG. 7. Typical SEM image of the top views of the Al etched $SiO_2$/Si surfaces before the annealing process.
Figure 8:
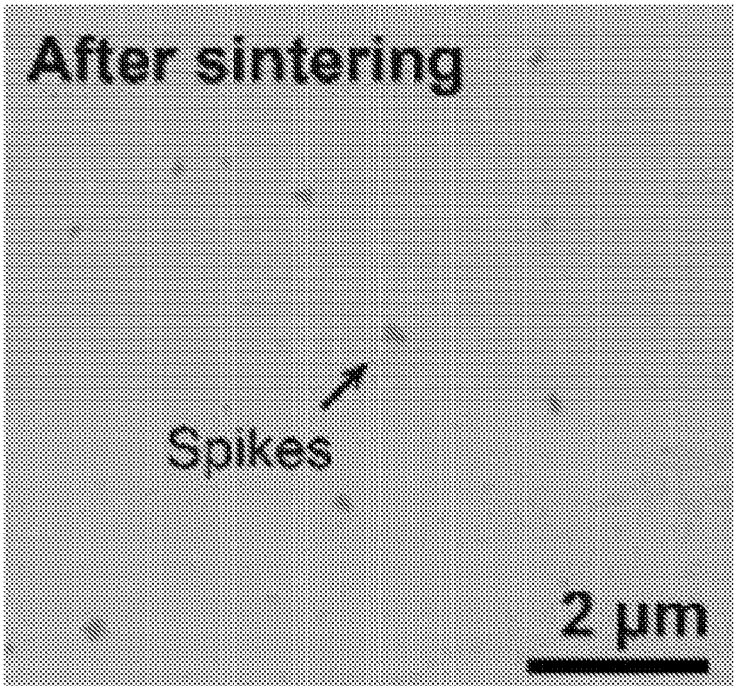
FIG. 8. Typical SEM image of the top views of the Al etched $SiO_2$/Si surfaces after the annealing process at 550° C. for 24 hours.

To optimize the Al thin-film reaction and spiking process, a series of $Al/SiO_2/Si/SiO_2/Al$ samples was prepared by 90 nm $SiO_2$ growth and 100 nm Al deposition on both sides of Si substrates, and their series resistance from top to bottom (top-bottom resistance) was measured before and after different annealing processes. It has been reported that, in an $Al/SiO_2/Si$ structure, Al reduces the underlying $SiO_2$ layer and penetrates to the Si layer during annealing, the phenomenon referred to as Al spiking (Bierhals A et al. *Journal of Applied Physics* 1998, 83, 1371-1378; Ho A W Y et al. *Progress in Photovoltaics: Research and Applications* 2004, 12, 297-308; Godfrey R B et al. *Applied Physics Letters* 1979, 34, 860-861). The formation of Al spikes requires around 2.56 eV of activation energy for the $SiO_2$ reduction process, and can occur at temperature above 300° C. (Godfrey R B et al. *Applied Physics Letters* 1979, 34, 860-861). The top-bottom resistance changes were measured for annealing temperatures of 450~600° C. and durations of 0~24 hours as shown in FIG. 5. Before the annealing process, the top-bottom resistances of the $Al/SiO_2/Si/SiO_2/Al$ substrates were relatively high (20~30 $\Omega cm^2$) due to the thick $SiO_2$ insulating layers. For all annealing temperatures, the top-bottom resistances decreased with increasing annealing duration. For the first several hours, a moderate decrease of top-bottom resistance was observed at all temperatures. However, as the temperature and duration of annealing increased, there was a sharp transition to ~0.5% of its initial value. With increasing annealing temperature, the transition points occur for shorter times—15 hours, 12 hours, 3 hours, and 1 hour for 450° C., 500° C., 550° C., and 650° C., respectively. During the annealing process, Al penetrates locally through the $SiO_2$ layers and reaches the underlying Si substrate, forming a metallic path and Ohmic contact between the Al and Si layers as shown in FIG. 6. Formation of these structures causes the abrupt drop of top-bottom resistance at the transition points. After etching the Al layer from the $Al/SiO_2/Si$ substrate, $SiO_2/Si$ surfaces before and after the annealing process were characterized by scanning electron microscopy (SEM). As shown in FIG. 7, without the annealing process, a uniform $SiO_2$ surface was observed after removing the Al layer. After annealing an $Al/SiO_2/Si$ structure at 550° C. for 24 hours, and subsequently etching away the Al, random localized voids in the $SiO_2$ layer, corresponding to areas where Al spiking occurred, were observed on the Al-etched $SiO_2/Si$ surface with 1.7% surface coverage by the void regions and with void diameters ranging from 50 to 100 nm, corresponding to an areal density of voids of ~$2\text{-}8\times10^8/cm^2$ (FIG. 8).

Electrodeposition of Ni Catalyst

Figure 9:
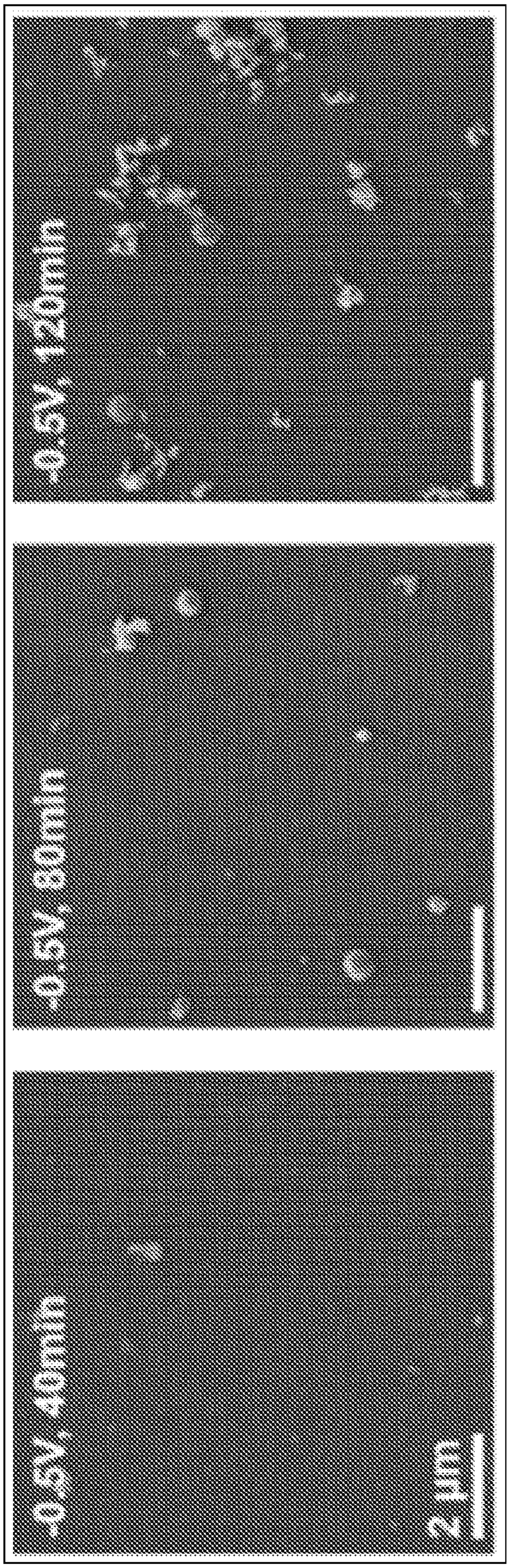
FIG. 9. Typical SEM images of the top views of the Ni-electrodeposited $SiO_2$/Si surfaces with an applied voltage of −0.5 V for the electrodeposition times of 40 minutes (left panel), 80 minutes (middle panel), and 120 minutes (right panel). Scale bar=2 μm.
Figure 10:
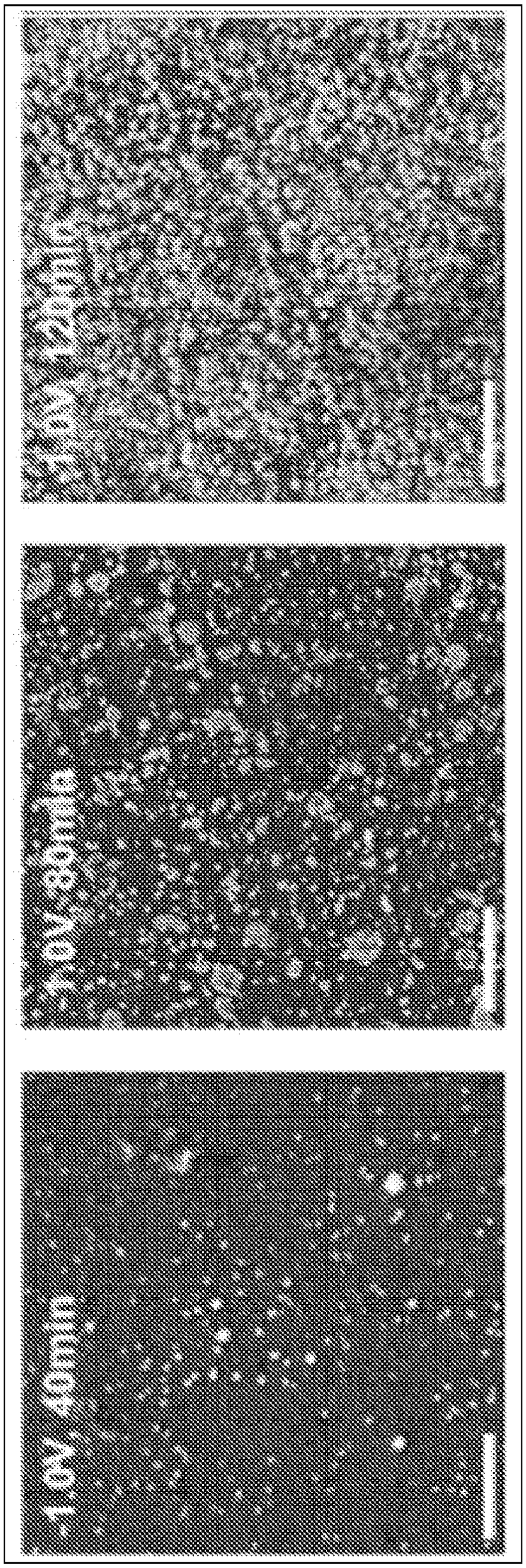
FIG. 10. Typical SEM images of the top views of the Ni-electrodeposited $SiO_2$/Si surfaces with an applied voltage of −1.0 V for the electrodeposition times of 40 minutes (left panel), 80 minutes (middle panel), and 120 minutes (right panel). Scale bar=2 μm.
Figure 11:
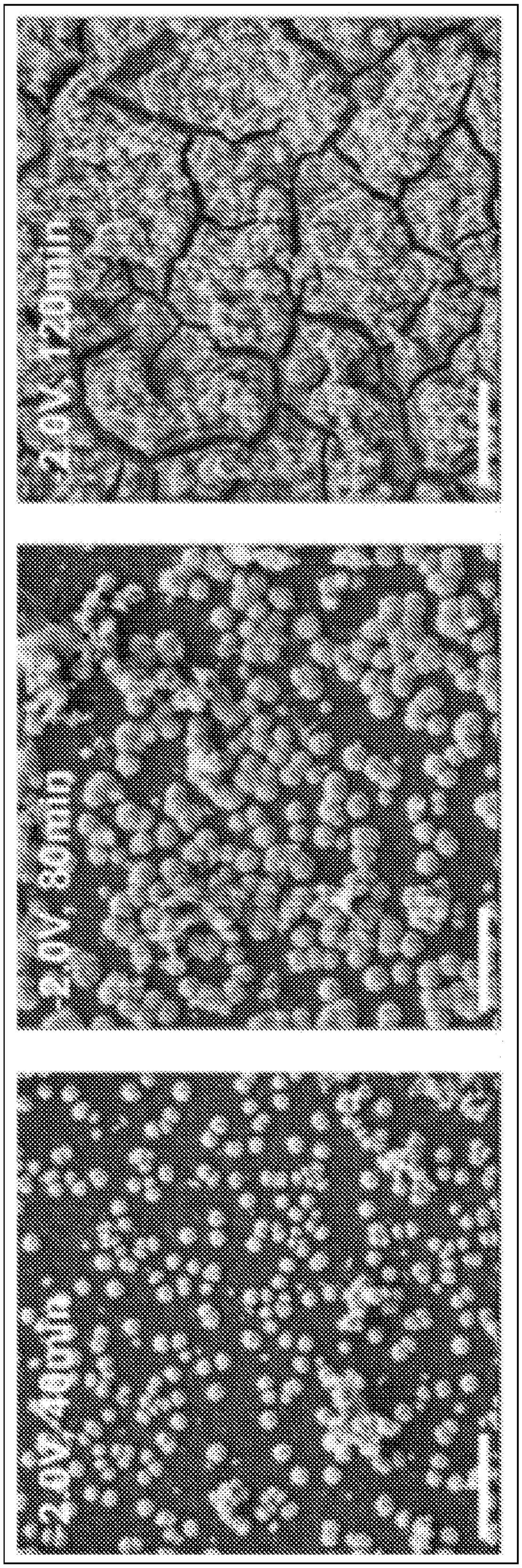
FIG. 11. Typical SEM images of the top views of the Ni-electrodeposited $SiO_2$/Si surfaces with an applied voltage of −2.0 V for the electrodeposition times of 40 minutes (left panel), 80 minutes (middle panel), and 120 minutes (right panel). Scale bar=2 μm.
Figure 12:
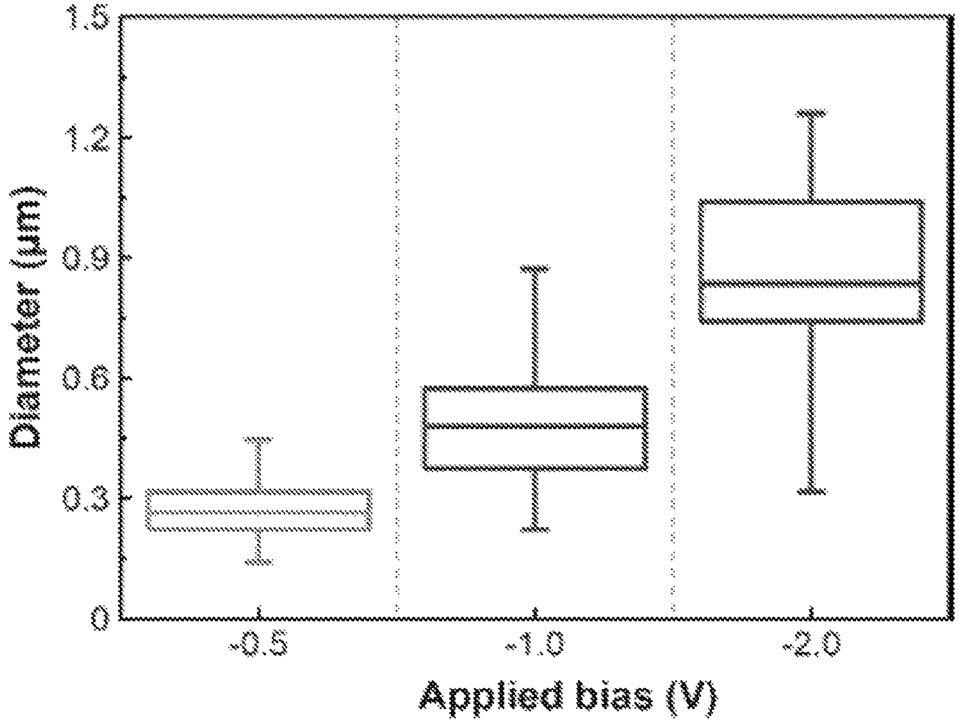
FIG. 12. The size distribution of Ni nanoparticles (NPs) on the $SiO_2$/Si surface after 60 min electrodeposition at different applied voltages of −0.5, −1.0, and −2.0 V.
Figure 13:
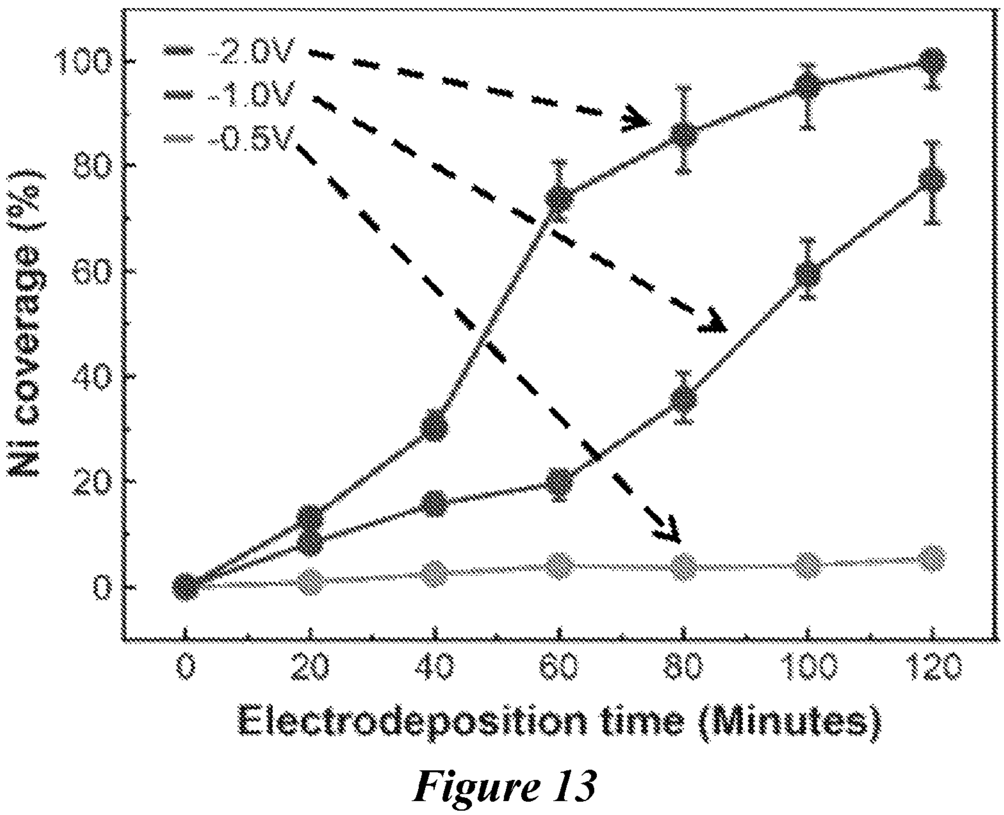
FIG. 13. The Ni coverage on the $SiO_2$/Si surface as a function of electrodeposition time at −0.5, −1.0, and −2.0 V.

For metal-insulator-semiconductor photoanodes, the catalyst on the metal layer is essential in enhancing overall reaction rate, reducing the onset voltage, and increasing the current density. Typically, Ni has been used as the oxygen evolution reaction catalyst due to its good electrical conductivity, efficient catalytic effect, and corrosion resistance at high pH (Loget G et al. *ACS Energy Letters* 2017, 2, 569-573). In this study, Ni was incorporated as a catalyst for the photoanode using electrodeposition, following the formation of localized voids in the $SiO_2$ protective layer by Al thin-film reaction and etching. Other catalyst materials could readily be employed using this approach. The morphology of Ni deposited on the surface can be controlled by varying the applied bias and deposition time for electrodeposition. When negative bias is applied to the substrate, Ni deposition begins by filling the voids in the $SiO_2$ layer, since the highest electric fields are present at the interface between the aqueous solution and the exposed Si surface. Ni is nucleated at these locations and eventually forms larger islands on the surface. FIG. 9-FIG. 11 show SEM images of Ni electrodeposited on the $SiO_2/Si$ surface for different electrodeposition conditions. When low electrodeposition bias (−0.5 V) was applied, Ni nano-islands were observed on the surface and their number and size increased with increasing applied bias and electrodeposition time. Shown in FIG. 12 is a box plot of the diameters of the Ni nano-islands after 80 min of electrodeposition at applied bias voltages of −0.5 V, −1.0 V, and −2.0 V. The mean diameter of the Ni nano-islands increased from 0.26 μm to 0.83 μm as the applied bias increased from −0.5 V to −2.0 V. In addition, a broader diameter distribution was observed for the Ni nano-islands deposited at higher magnitude applied bias. Growth and eventually coalescence of the Ni nano-islands occurs with increasing Ni coverage. FIG. 13 shows the Ni coverage on the $SiO_2$ layer as a function of electrodeposition time. At −0.5 V applied bias, the Ni coverage increased very slowly, not exceeding 5% after 120 min electrodeposition time. When higher bias was applied, clearer increases in Ni coverage were observed with increasing electrodeposition time and, after 120 min, ~78% and ~100% Ni coverage was obtained at −1.0 V and −2.0 V, respectively. As shown in FIG. 11, after 120 min electrodeposition at −2.0 V, the Ni aggregates form a continuous Ni film with a thickness of ~0.3 μm that covers almost the whole surface of the $SiO_2$ layer. Photoanodes fabricated in this manner, with Ni metal catalysts penetrating the $SiO_2$ protective layer via voids created by the Al spiking and etching processes, are referred to herein as spiked $Ni/SiO_2/Si$ photoanodes.

Photoelectrochemical Performance for the $Ni/SiO_2/Si$ Photoanodes

Figure 14:
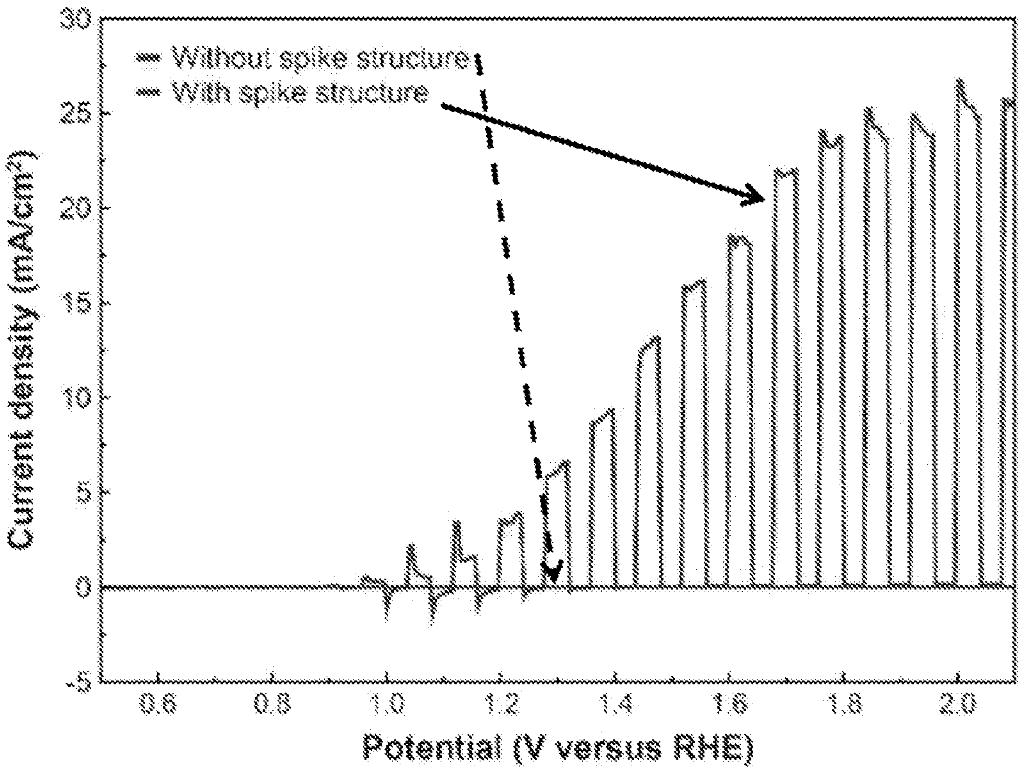
FIG. 14. Linear sweep voltammetry curves with chopped illumination in 1 M KOH solutions for the Ni/$SiO_2$/Si photoanodes with and without spike structure caused by Al spiking.

Photoelectrochemical performance was measured for the spiked $Ni/SiO_2/Si$ photoanodes fabricated using various Ni electrodeposition processes in 1 M KOH (pH=14) aqueous solution with a standard three-electrode system under standard AM 1.5 G 1 sun illumination. FIG. 14 shows linear sweep voltammetry (LSV) measurements with chopped illumination for $Ni/SiO_2/Si$ photoanodes fabricated with and without the Al thin-film reaction process. Both photoanodes were fabricated with the same Ni coverage on the surface. For the spiked structures, the Ni layer was deposited by electrodeposition at −2.0 V applied bias for 60 min yielding ~75% surface coverage with electrodeposited Ni. For the photoanode fabricated without Al spiking, the Ni layer was deposited using e-beam evaporation with the same 75% coverage as the electrodeposited Ni layer using a lithographically defined pattern comprising 60 μm diameter dots in a square array with 60 μm pitch. As shown in FIG. 14, the $Ni/SiO_2/Si$ photoanode without spiking showed very low current density, under 10 $\mu A/cm^2$. Clear oxygen evolution reaction activity was observed with the spiked structure, which showed a low onset potential of 1.0 V versus reversible hydrogen electrode (RHE) and a high saturation current density of 25 $mA/cm^2$. This result confirms that the spiked structure dramatically improves the performance in aqueous solution of the $Ni/SiO_2/Si$ photoanode by providing conductive paths through the $SiO_2$ layer. All results reported below are for spiked $Ni/SiO_2/Si$ photoanode structures fabricating using the Al thin-film reaction process.

Figure 15:
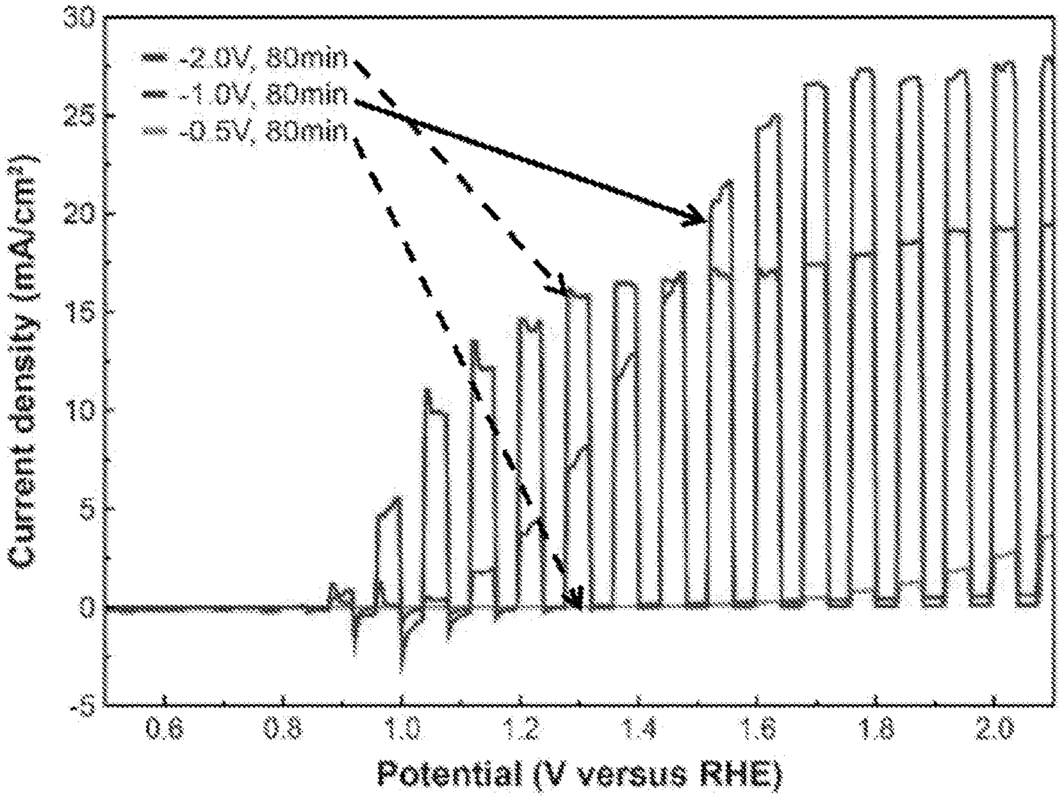
FIG. 15. Linear sweep voltammetry of Ni/$SiO_2$/Si photoanodes with spike structures for different Ni electrodepositions at −0.5, −1.0, and −2.0 V of applied biases.

FIG. 15 shows the photoelectrochemical performance of spiked $Ni/SiO_2/Si$ photoanode for different electrodeposited Ni morphologies on the surface. Three spiked $Ni/SiO_2/Si$ photoanodes were prepared with different electrodeposition recipes. The measured Ni coverages of the photoanodes were 3.9%, 34.4%, and 80.2% for 80 min of Ni electrodeposition at −0.5 V, −1.0 V, and −2.0 V applied biases, respectively. The spiked $Ni/SiO_2/Si$ photoanode with 3.9% Ni coverage showed poor photoelectrochemical performance due to insufficient Ni coverage on the surface. The highest saturation photocurrent density (27 $mA/cm^2$) was observed for 34.4% Ni coverage, achieved by Ni electrodeposition at −1.0 V bias. For the spiked $Ni/SiO_2/Si$ photoanode with 80.2% Ni coverage, a lower saturation photocurrent density (16 $mA/cm^2$) was observed compared to the photoanode with 34.4% of Ni coverage, a reduction that can be attributed to blocking of incident light by the Ni layer. However, an enhancement in onset potential for oxygen evolution reaction was observed, from 1.1 V to 0.9 V versus RHE, for 80.2% Ni coverage on the surface compared to that for 34.4%. This result indicates that the catalytic effect of Ni was improved with increasing Ni coverage, leading to lower onset potential. However, excessive Ni coverage limits light absorption in the underlying Si absorber, so that the photocurrent density was degraded.

Figure 16:
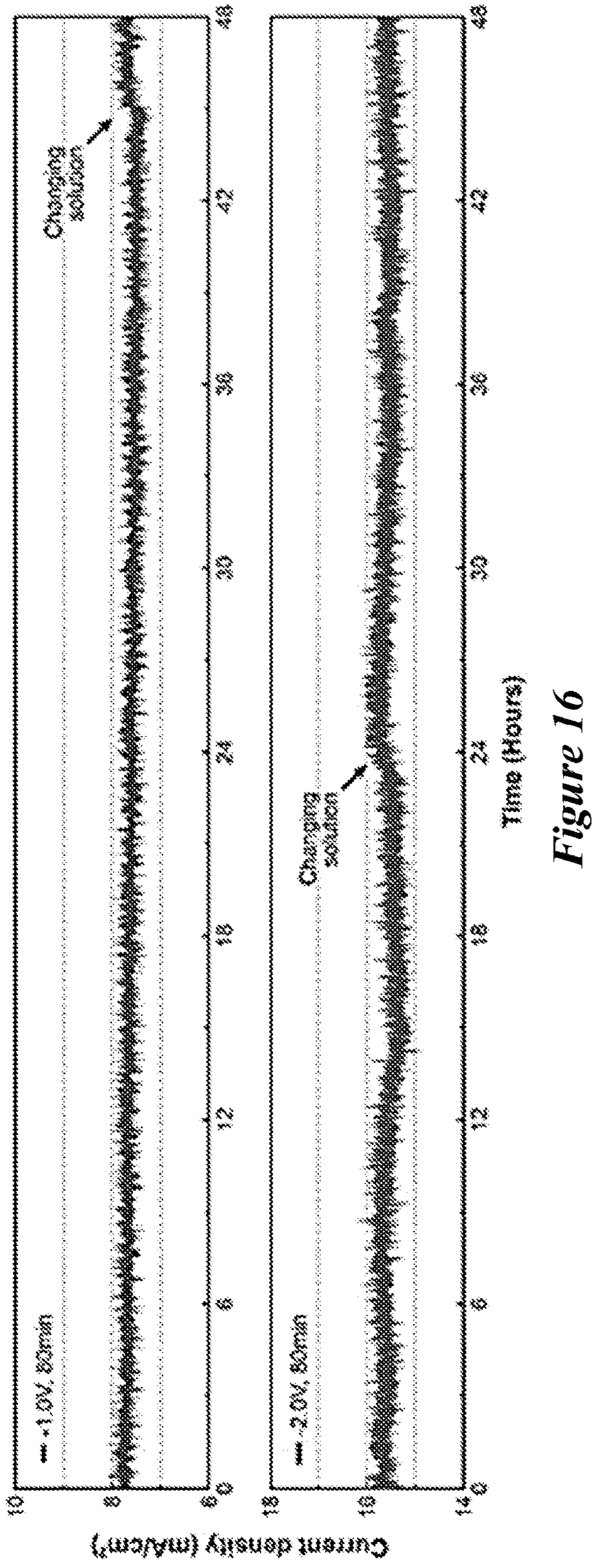
FIG. 16. 48 hours of chronoamperometry stability tests at −1.3 V versus RHE in 1 M KOH solutions for spiked Ni/$SiO_2$/Si photoanodes with 80 min Ni electrodepositions at −1.0 V (upper panel) and −2.0 V (lower panel).

The corrosion resistance of the spiked $Ni/SiO_2/Si$ photoanodes at high pH was assessed by chronoamperometry (CA). As shown in FIG. 16, a chronoamperometry test for spiked $Ni/SiO_2/Si$ photoanodes with different Ni electrodepositions at −1.0 and −2.0 V was performed in 1 M KOH (pH=14) aqueous solution at 1.3 V versus RHE for 48 hours. Due to the 90 nm thick $SiO_2$ layer and the high corrosion resistance of Ni for high pH solutions, both spiked $Ni/SiO_2/Si$ photoanodes showed excellent stability for 48 hours. Due to the higher rate of gas evolution for the photoanode with Ni electrodeposition at −2.0 V, more fluctuations in photocurrent density were observed during the stability test. A small decrease in photocurrent density was observed for both photoanodes during the stability test, since some of the produced $O_2$ bubbles remain attached to the surface and suppress the oxygen evolution reaction. After drying the surface using Ar dry gas and changing to a new 1 M KOH aqueous solution, the photocurrent density recovered to the initial values, indicating that there was no chemical corrosion on the surface.

Numerical Analysis of Photoanode Potential Distributions

Figure 17:
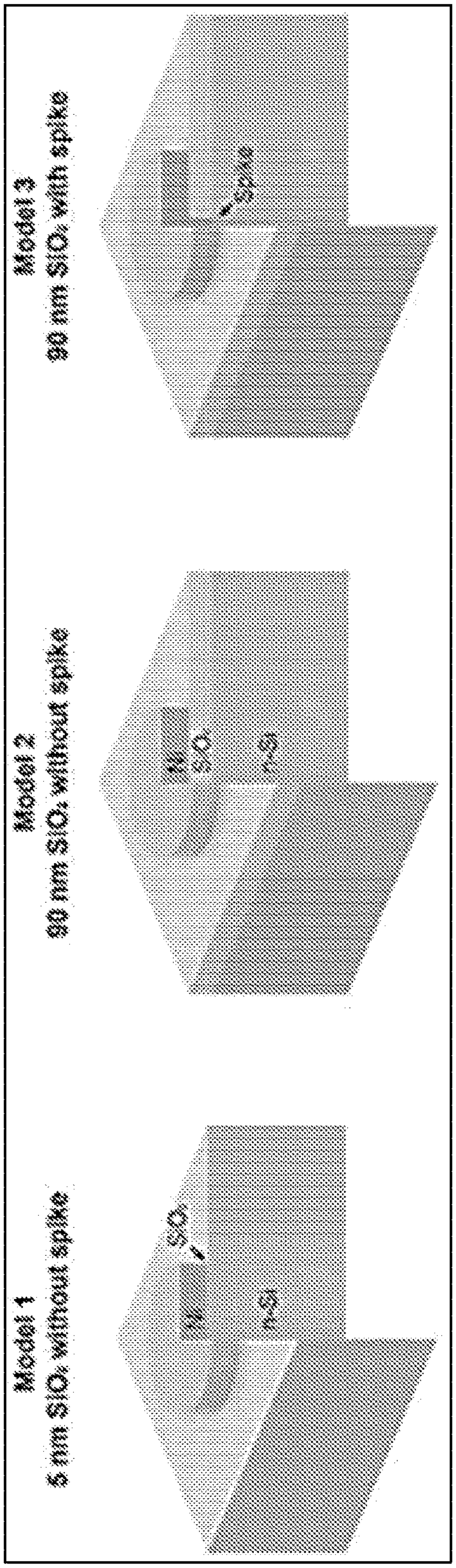
FIG. 17. Schematic illustration of 3D simulation models for metal-insulator-semiconductor photoanodes: Ni/5 nm $SiO_2$/n-Si without spike for Model 1 (left panel_, Ni/90 nm $SiO_2$/n-Si without spike for Model 2 (middle panel), and Ni/90 nm $SiO_2$/n-Si with a spike for Model 3 (right panel).
Figure 18:
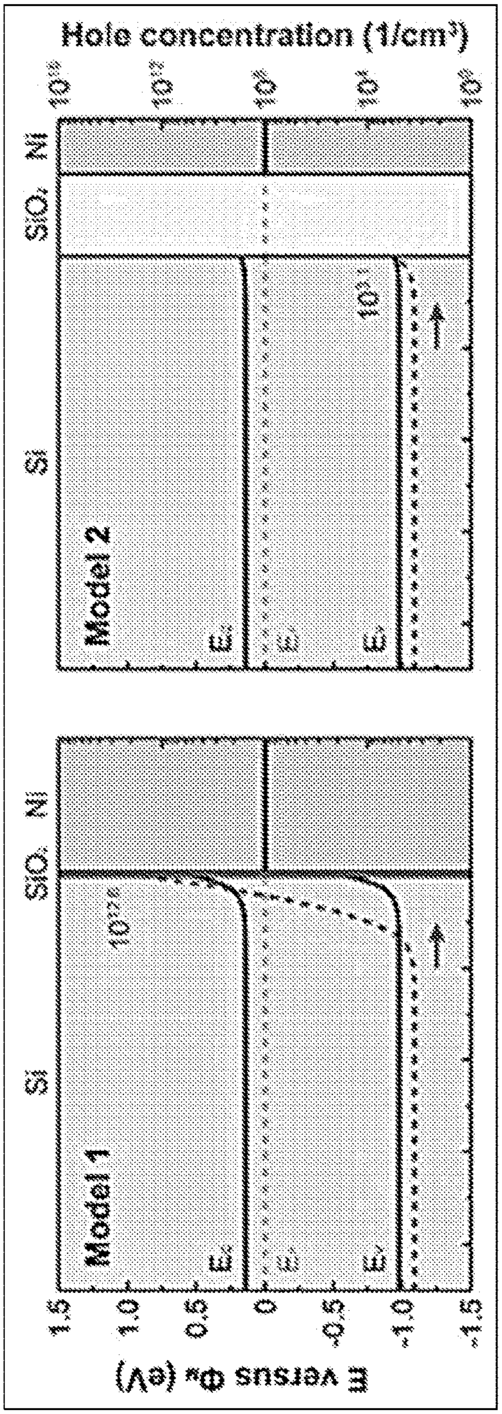
FIG. 18. Simulated band diagrams and hole concentrations at the interface area for Model 1 (left panel) and Model 2 (right panel).
Figure 19:
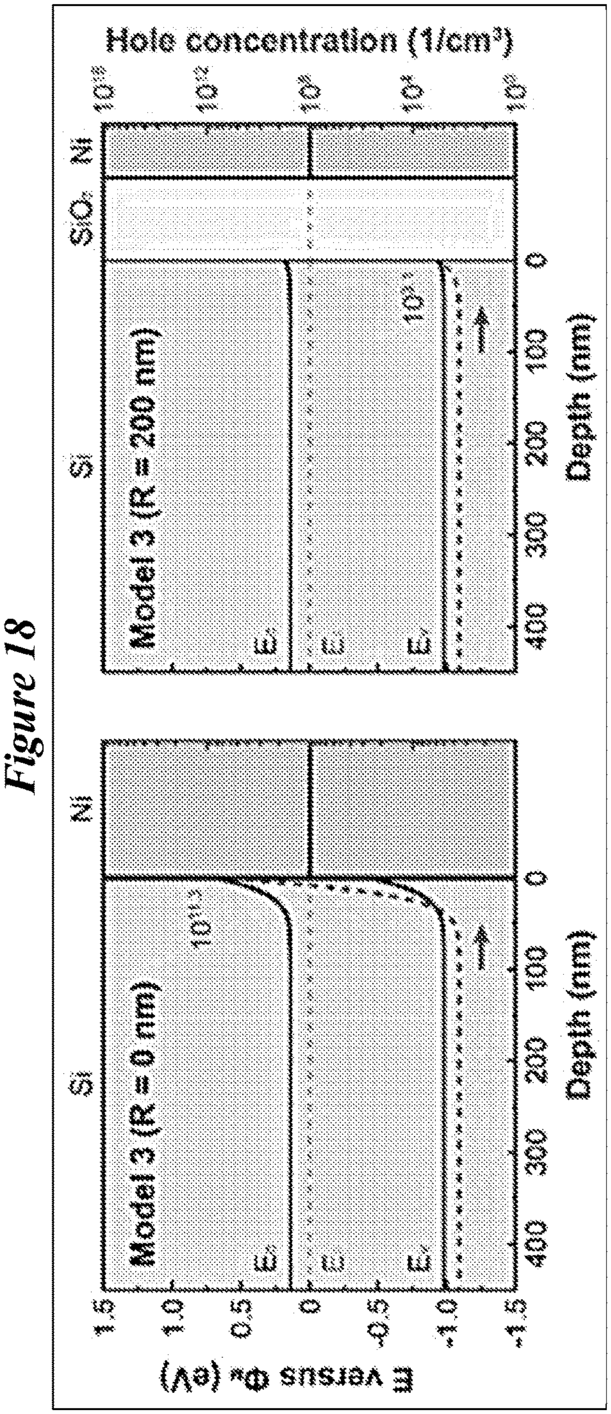
FIG. 19. Simulated band diagrams and hole concentrations at the interface area for Model 3 at R=0 (left panel) and R=200 nm (right panel).
Figure 20:
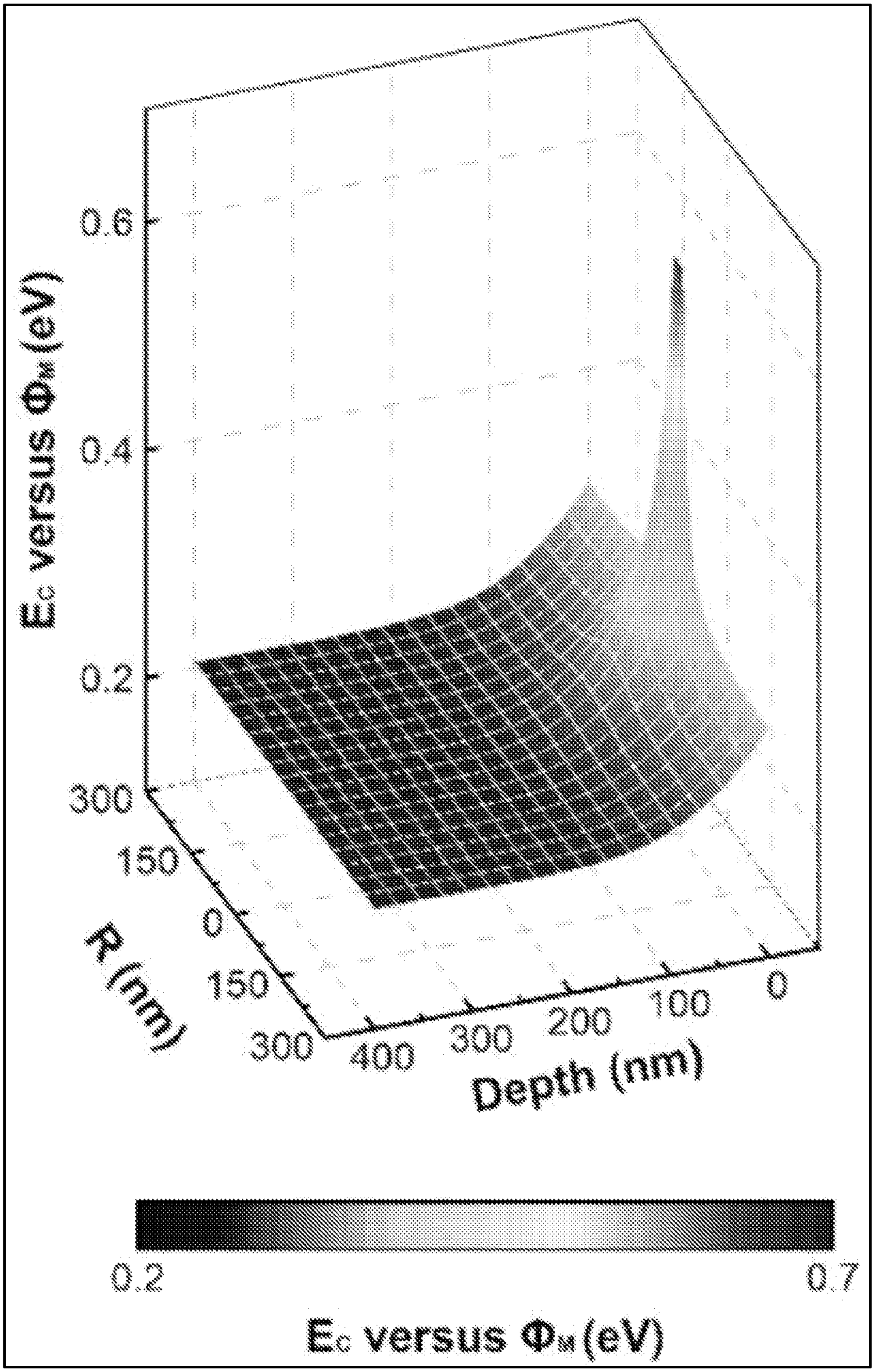
FIG. 20. Simulated conduction-band energy (EC) distribution near the spiked area in Model 3.

The effects of localized contacts in the spiked $Ni/SiO_2/Si$ photoanode were also analyzed computationally using a commercial numerical solver, COMSOL Multiphysics, to help explain the favorable onset potentials observed. Three different models were simulated, comprising different $Ni/SiO_2/Si$ structures with metal back contacts (FIG. 17). Model 1 and Model 2 were designed as typical metal-insulator-semiconductor structures without metal spikes, with $SiO_2$ thicknesses of 5 nm and 90 nm, respectively. Model 3 had a similar structure to Model 2, but also included a cylindrical metal spike with a diameter of 60 nm and a Schottky contact between Ni and Si at the bottom of the spike. FIG. 18 and FIG. 19 show the simulated band structures and hole concentrations of Models 1, 2, and 3. The electrical behavior of Model 1 and Model 2 can be explained by the metal-insulator-semiconductor capacitor model (Scheuermann A G et al. *Nat. Mater.* 2016, 15, 99-105). The band structure of a typical metal-insulator-semiconductor contact with a very thin insulating layer exhibits Schottky behavior, as shown in FIG. 18. Due to the high work function of Ni (5.0 eV) and small potential difference across the thin $SiO_2$ layer, there is a surface inversion on the Si surface and a favorable onset potential would be expected. With increasing thickness of the $SiO_2$ layer, weaker surface inversion is observed with less band bending in Si layer. Therefore, a lower concentration of holes accumulates at the Si surface for Model 2 which has thicker $SiO_2$ layer, causing decreased photovoltage (Scheuermann A G et al. *Nat. Mater.* 2016, 15, 99-105). As shown in FIG. 19, two types of interfaces are present in Model 3 depending on radial distance (R) from the spiked area: Si/Ni at R=0 nm and $Si/SiO_2/Ni$ at R=200 nm. For R=200 nm in Model 3, the simulated band structure is almost same as Model 2. In the case of R=0 nm, Ni is directly in contact with Si, with an 0.67 eV Schottky barrier, leading to stronger surface inversion and higher local hole concentration at the Si surface. FIG. 20 shows the simulated conduction-band edge energy (EC) profile as a function of the radial distance (R) from the center of the spiked area and the depth from Si surface. The Schottky barrier decreased from 0.67 eV to 0.17 eV with increasing R from the spiked area, so that higher hole concentrations are present in the $Si/SiO_2/Ni$ structures near the spiked area. In the metal-insulator-semiconductor photoanode with localized spike structure, the localized high hole concentration on the Si surface leads to a photovoltage improvement of the photoanode compared to that expected for structures with no spiking.

Spiked $Ni/SiO_2/Si$ Photoanode With $p^+n$-Si

Figure 21:
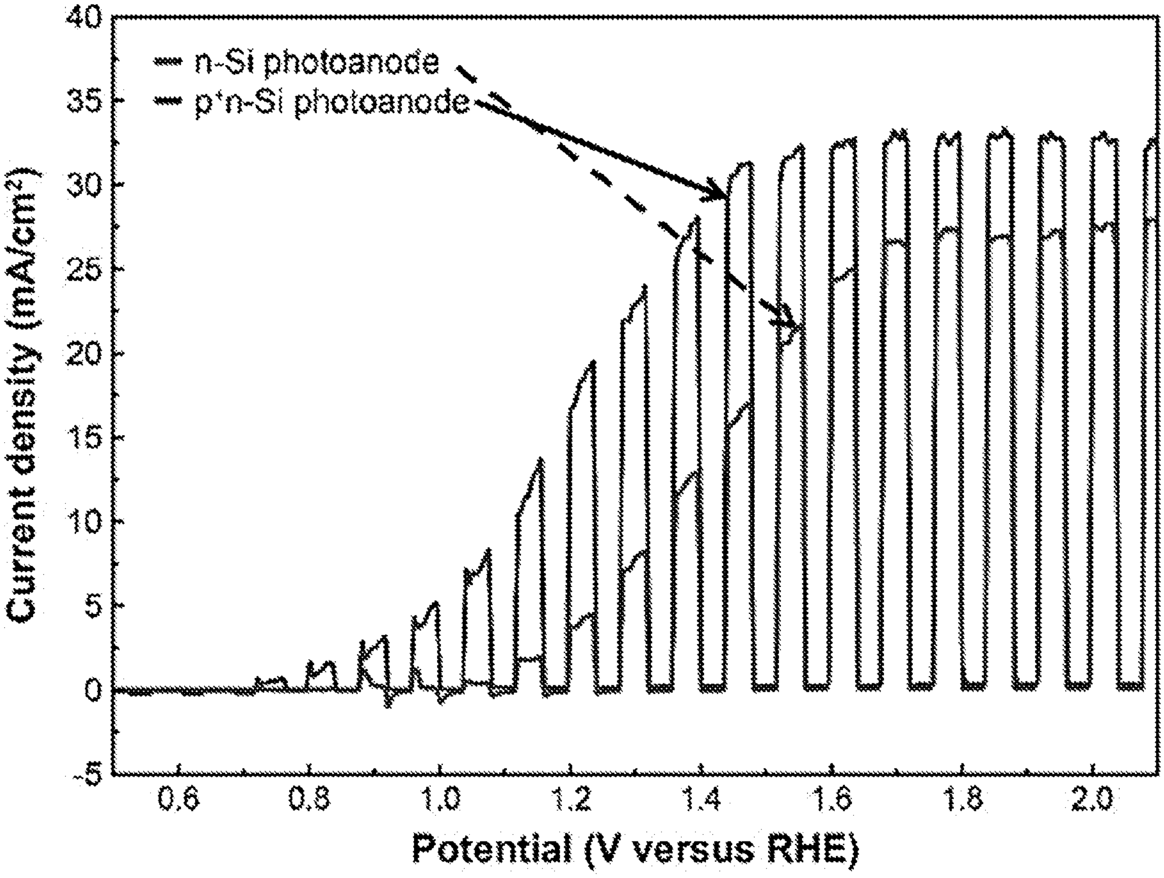
FIG. 21. Linear sweep voltammetry curves with chopped illumination in 1 M KOH solutions for spiked Ni/$SiO_2$/n-Si and Ni/$SiO_2$/$p^+$n-Si photoanodes.
Figure 22:
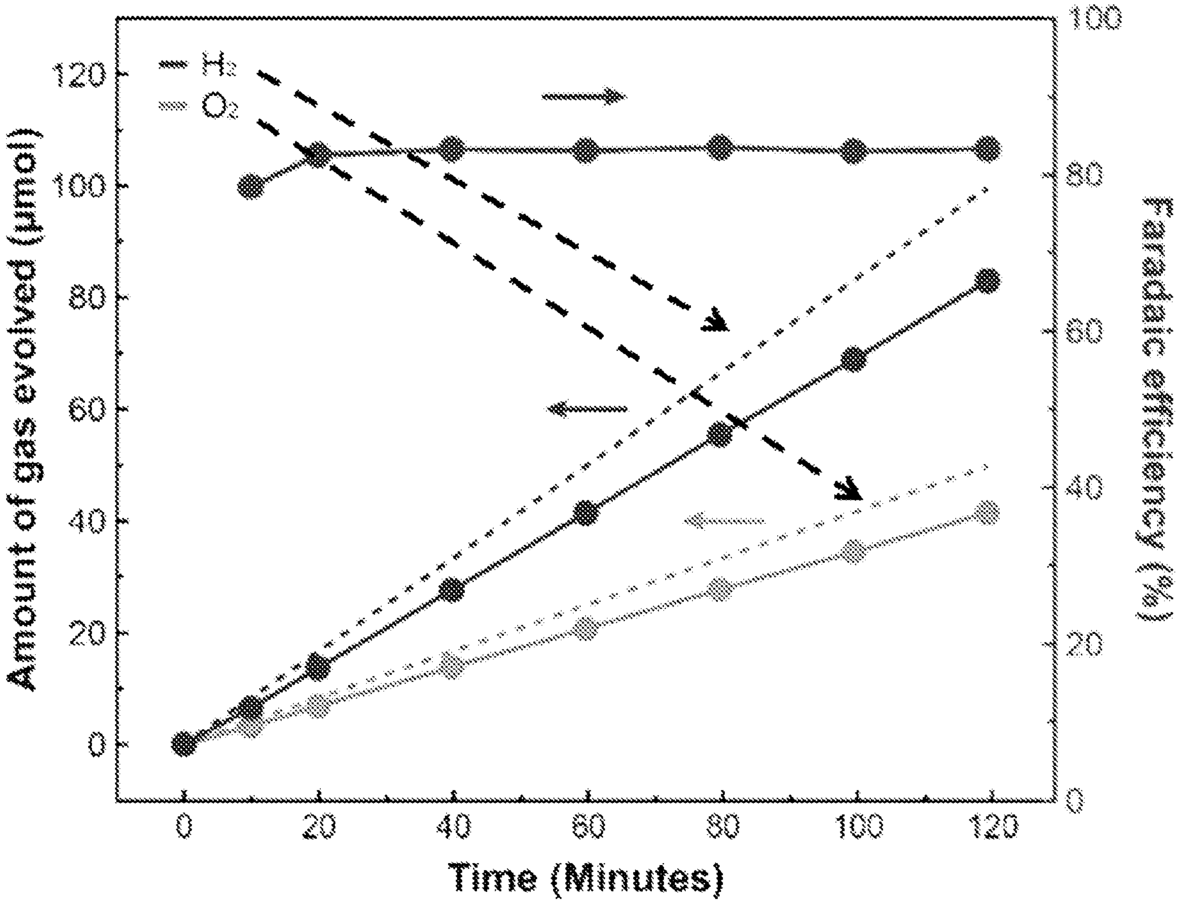
FIG. 22. Theoretical (Dotted lines) and Measured (Solid lines) evolution of $H_2$ and $O_2$ gases during oxygen evolution reaction activity for the spiked Ni/$SiO_2$/$p^+$n-Si photoanode with 1.23 V versus RHE for 120 min. The Faradaic efficiency was calculated for $O_2$ gas evolution.
Figure 23:
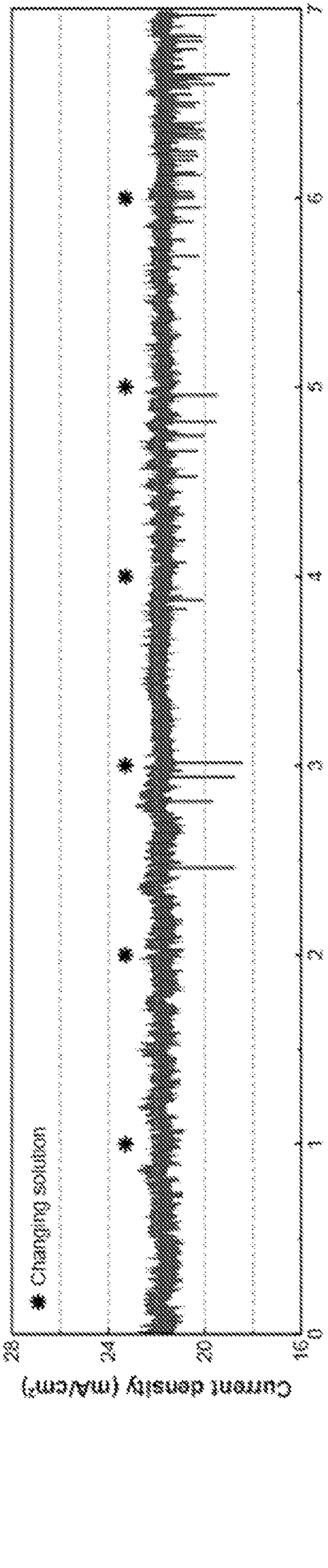
FIG. 23. 7 days of chronoamperometry stability test for the spiked Ni/$SiO_2$/$p^+$n-Si photoanode at −1.3 V versus RHE in 1 M KOH solutions.

To further improve the photochemical onset potential, a $p^+n$-Si substrate was used for the spiked $Ni/SiO_2/Si$ photoanode. It has been reported that thin $p^+$ doping on the n-Si surface improves the oxygen evolution reaction performance of metal-insulator-semiconductor photoanodes due to the higher hole density at the Si surface (Scheuermann A G et al. *Nat. Mater.* 2016, 15, 99-105; Green M A et al. *Solar Cells* 1983, 8, 3-16). The $p^+$ doping on the surface was performed by boron diffusion with an expected junction depth of ~300 nm, since a junction depth above 1 μm is expected to increase interface recombination (Scheuermann A G et al. *Nat. Mater.* 2016, 15, 99-105). FIG. 21 shows linear sweep voltammetry measurements with chopped illumination for the $p^+n$-Si and n-Si substrates with similar Ni coverage on the surface (~35%). The spiked $Ni/SiO_2/p^+n$-Si photoanode showed enhanced oxygen evolution reaction performance compared to the spiked $Ni/SiO_2/n$-Si photoanode, with a lower onset potential of 0.7 V versus RHE and higher saturation current density of 32 $mA/cm^2$. In addition, as shown in FIG. 23, highly stable photocurrent density was observed in a chronoamperometry measurement for the spiked $Ni/SiO_2/p^+n$-Si photoanode in 1 M KOH aqueous solution at 1.3 V versus RHE for 7 days. For the calculation of Faradaic efficiency, the evolved $H_2$ and $O_2$ gases were measured for the spiked $Ni/SiO_2/p^+n$-Si photoanode at 1.23 V versus RHE (FIG. 22). The generation rates of $H_2$ and $O_2$ gases exhibited the expected stoichiometric ratio (2:1) (FIG. 22). The calculated Faradaic efficiency started at 72.7% and saturated near 86% at 20 min, indicating good stability for the 120 min measurement (FIG. 22).

Figure 24:
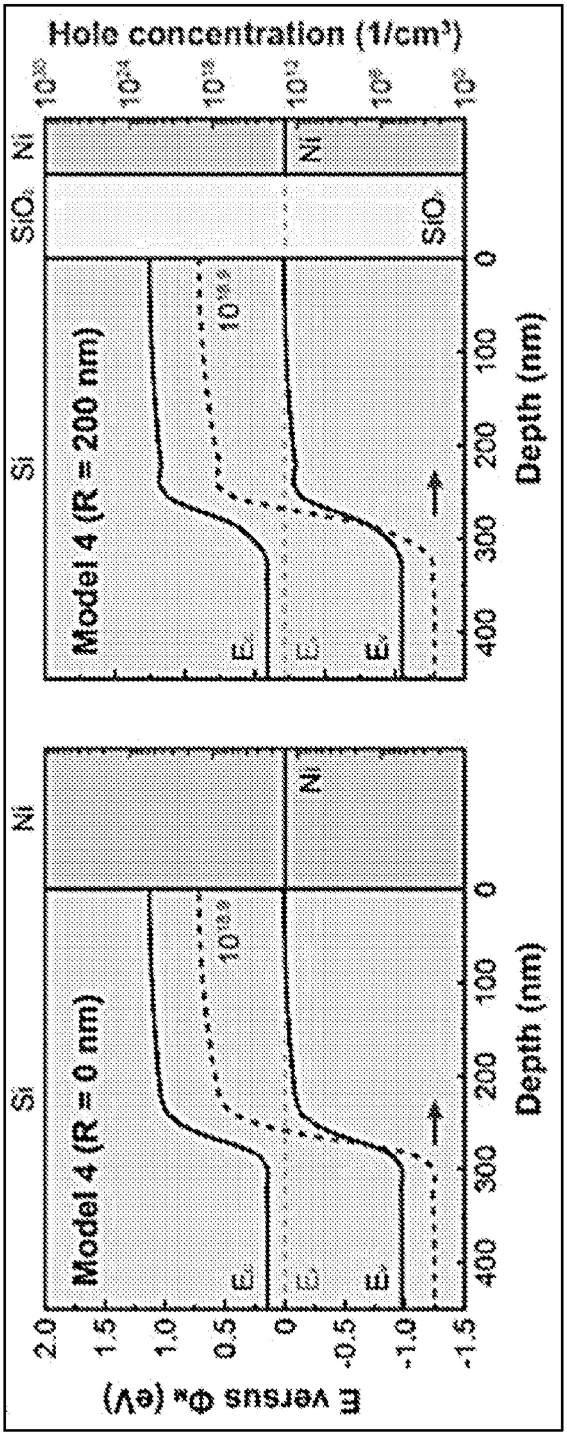
FIG. 24. Simulated band diagrams and hole concentrations for Model 4 at the interface of R=0 nm (left panel) and R=200 nm (right panel).
Figure 25:
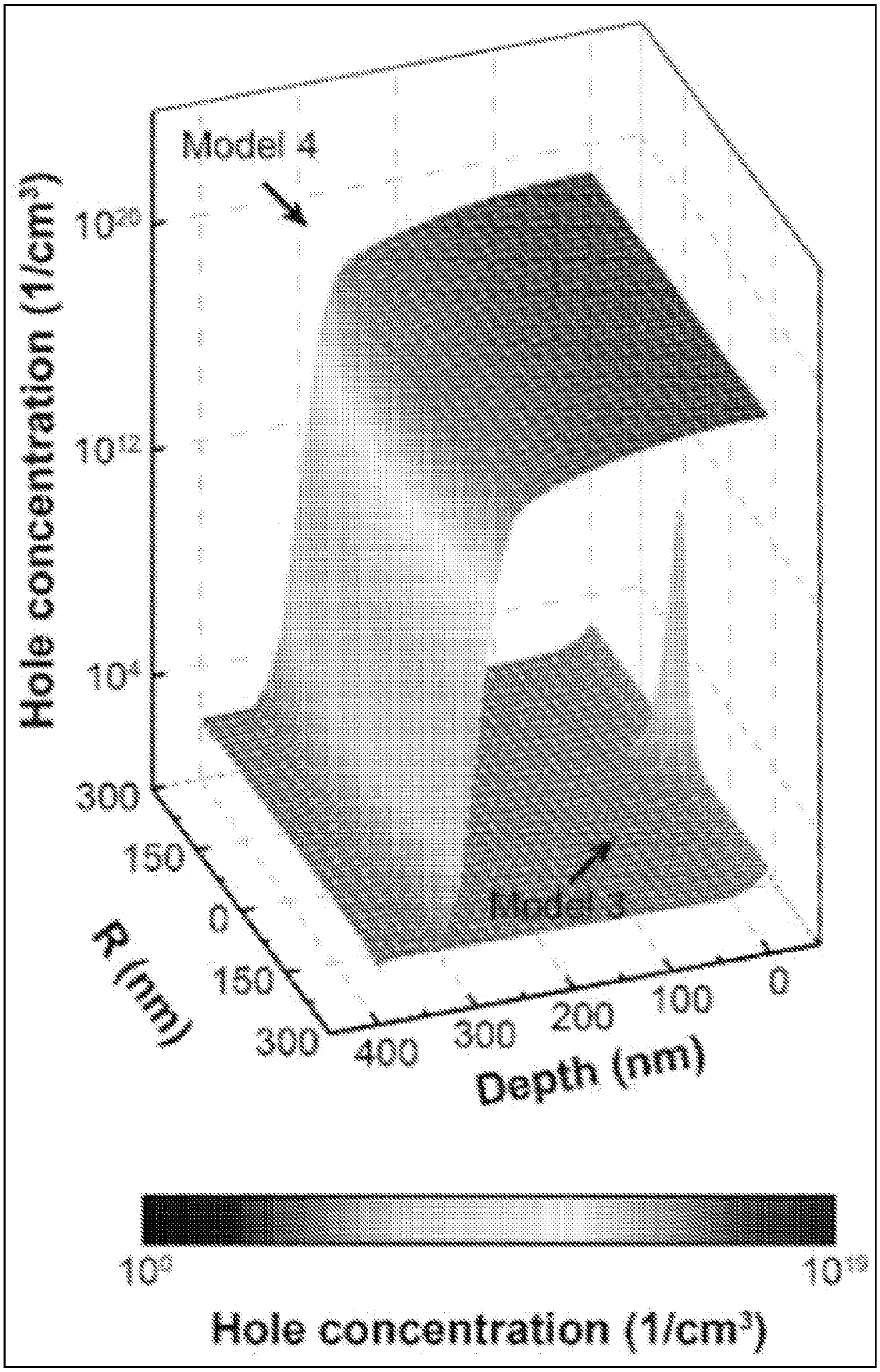
FIG. 25. Simulated hole concentration near the spiked area for Model 2 and Model 4.
Figure 26:
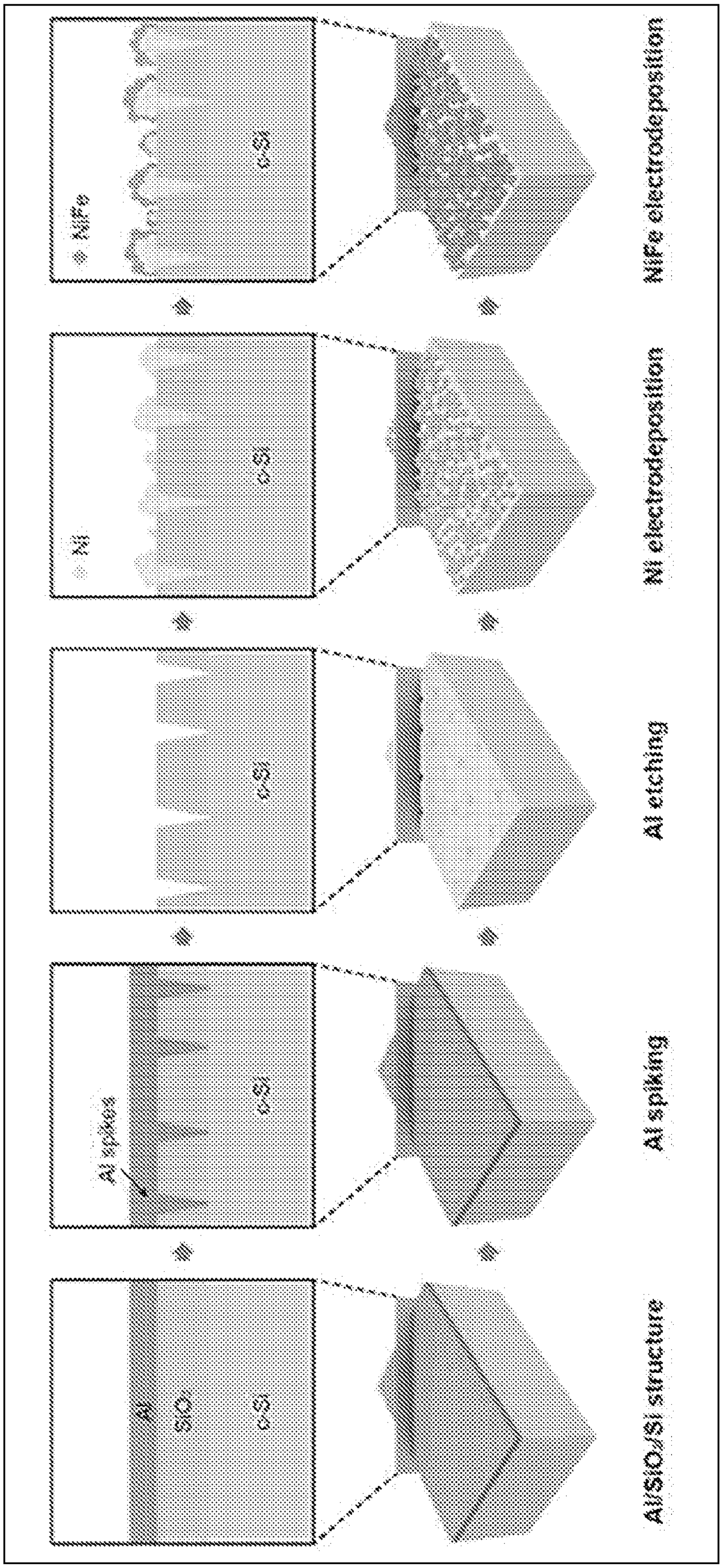
FIG. 26. Schematic illustration of process for fabrication of spiked NiFe/Ni/$SiO_2$/n-Si photoanode with multilayer catalyst.
Figure 27:
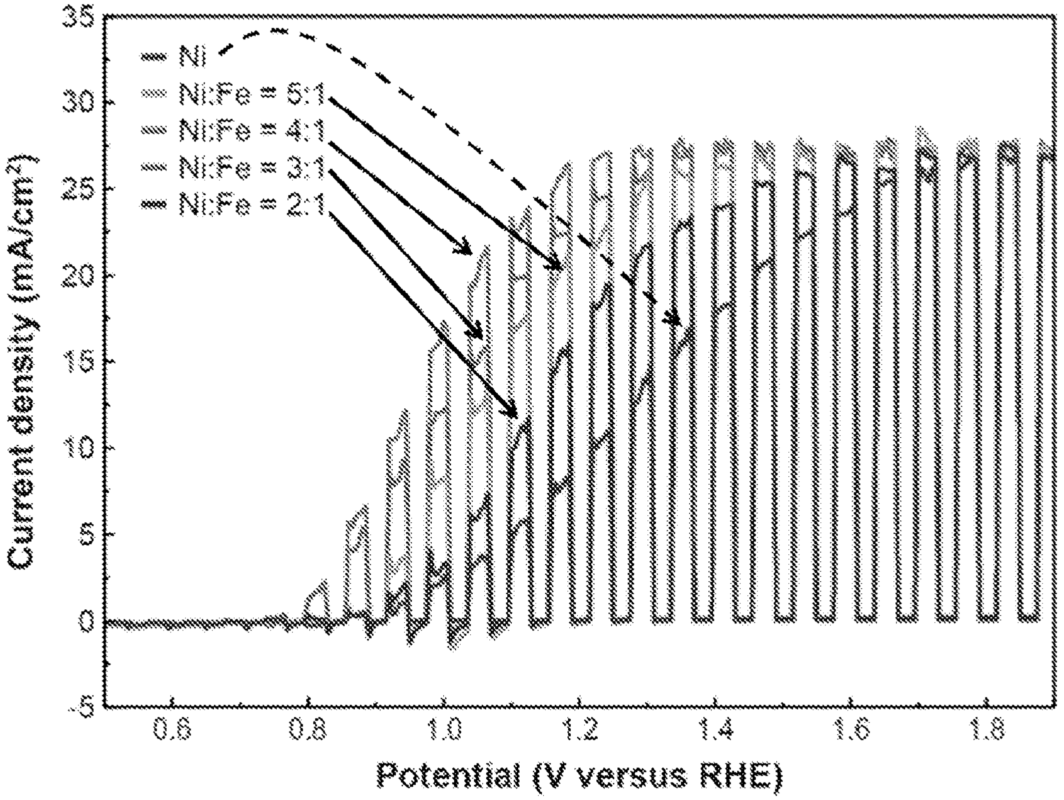
FIG. 27. Linear sweep voltammetry curves with chopped illumination in 1 M KOH solutions for spiked NiFe/Ni/$SiO_2$/n-Si with different NiFe compositions.
Figure 28:
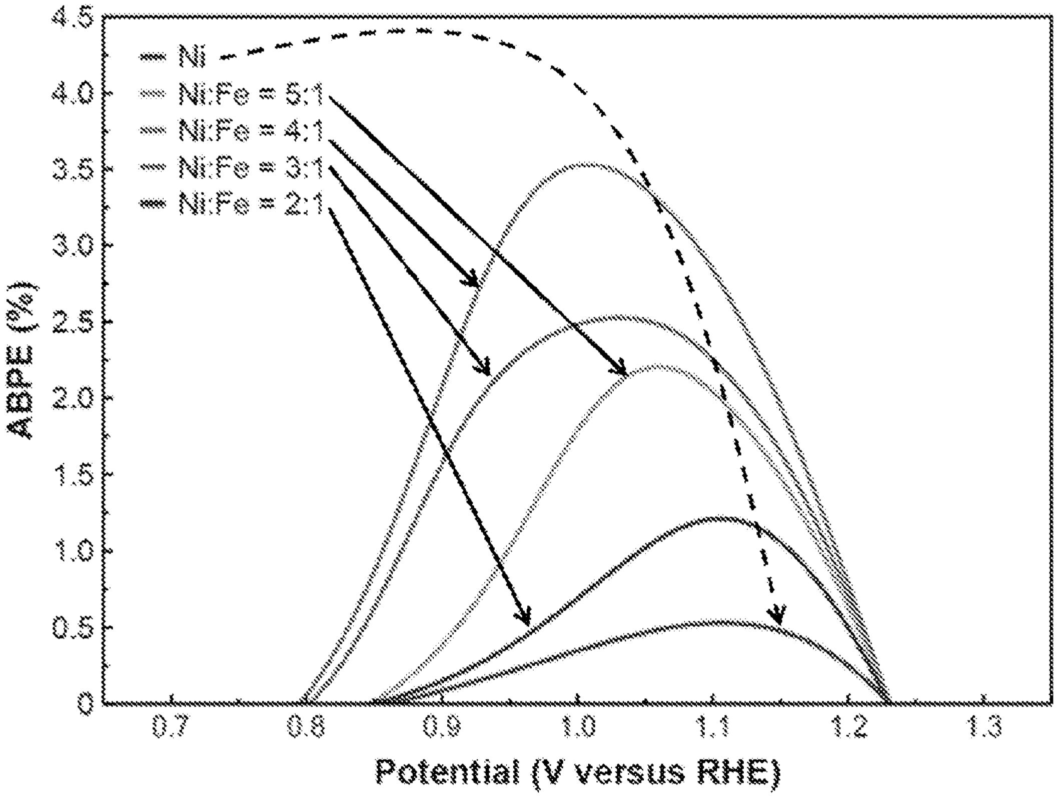
FIG. 28. Applied bias photon to current conversion efficiencies corresponding to FIG. 27.

The improvement in oxygen evolution reaction performance for the spiked $Ni/SiO_2/p^+n$-Si photoanode was analyzed by simulating its band structure for a gaussian acceptor doping profile corresponding to boron diffusion process from the surface with junction depth of 300 nm, referred to as Model 4. FIG. 24 shows the simulated band structures of Model 4 with R=0 nm and R=200 nm. The spiked (R=0 nm) and non-spiked (R=200 nm) areas in Model 4 showed almost the same band structures, since the $p^+$-Si and Ni form an Ohmic contact and band bending in the Si is dominated by the $p^+n$ junction. The $p^+$ doping at the n-Si surface enables a higher hole density to accumulate at the Si surface, as shown in FIG. 25, leading to improved onset potential compared to the spiked $Ni/SiO_2$/n-Si photoanode.

CONCLUSION

In summary, a general method for low cost, lithography-free, and scalable fabrication of Si-based metal-insulator-semiconductor photoanodes by employing an Al thin-film reaction process combined with Ni electrodeposition was demonstrated. This approach allows a thick $SiO_2$ insulator (90 nm) to be employed, which provides antireflection functionality on Si and high long-term stability in alkaline solutions. Optimization of the Al thin-film reaction process to create a suitable density of openings in the $SiO_2$ layer, and the Ni electrodeposition process to achieve optimal Ni surface coverage, leads to favorable onset potentials and high photocurrent densities. The enhancement in oxygen evolution reaction performance was analyzed by photoelectrochemical measurements and numerical simulations using metal-insulator-semiconductor Schottky contact models. In photoelectrochemical measurements, the optimized Si-based metal-insulator-semiconductor photoanode with a buried $p^+n$-Si junction showed low onset potential and high saturation photocurrent density around 0.7 V versus RHE and 32 $mA/cm^2$, respectively. Furthermore, the high photocurrent density was maintained for a 168 hour stability test in 1 M KOH aqueous solution. These results demonstrate a simple approach for highly efficient photoanodes, without using any complex and costly techniques, which is suitable for large-scale commercial fabrication.

METHODS

Fabrication of Si-Based Metal-Insulator-Semiconductor Photoanode With Localized spike structure. Four inch n-type (100) c-Si wafers (thickness t~550 μm and resistivity ρ=0.3-0.5 Ωcm) were used for fabrication of photoanodes. Each wafer was cleaved into 2×2 $cm^2$ samples and cleaned with piranha solution (5:1:1 $H_2O$:$H_2SO_4$:$H_2O_2$). Cleaned Si substrates were dipped into a 5% HF aqueous solution for 1 min to remove the native oxide. For the back contact, 5 nm Cr and 100 nm Au were deposited on the backside of the Si substrates by e-beam evaporation. High quality $SiO_2$ films were thermally grown on the front side of each Si wafer using an oxidation furnace (MRL 8' furnace, Sandvik Thermal Process Inc.) at 950° C. in dry $O_2$ ambient. In this work, all photoanodes were fabricated with 90 nm $SiO_2$ layers. Then, the Al layers were deposited onto the $SiO_2$/Si surface by DC magnetron sputtering (UNIVEX 450B) under $1\times10^{-6}$ Torr of base pressure. The use of Si-doped Al suppresses penetration of the Al metallization into the Si layers. For the formation of localized Al spikes through the $SiO_2$ layer, the $Al/SiO_2$/Si substrate was annealed at 550° C. for 24 hours in a vacuum chamber. To replace the top Al layer with the Ni catalyst, Al was etched using an 10% $H_3PO_4$ aqueous solution for 6 hours. After Al etching, the surface was rinsed by DI water and dried under $N_2$ flow. The Ni catalyst was deposited by electrodeposition. The Ni plating solution was prepared by mixing 0.1 M boric acid and 0.1 M $NiCl_2$ aqueous solution. During electrodeposition, only the $SiO_2$/Si surface from which Al was etched was exposed to the Ni plating solution. The working electrode was connected the back contact and both Pt counter electrode and Ag/AgCl (3 M KCl) reference electrode were dipped in the Ni plating solution. The Ni electrodeposition was performed with different applied biases (−0.5, −1.0, and −2.0 V versus Ag/AgCl) with deposition times ranging from 0 to 120 min. The resulting spiked $Ni/SiO_2$/Si metal-insulator-semiconductor photoanode was rinsed in DI water and dried naturally under ambient condition.

Fabrication of $Ni/SiO_2/p^+n$-Si photoanode. $p^+$ doping on the surface of 4 inch n-type (100) c-Si wafers was performed by annealing n-Si substrates with boron solid-state source (BoronPlus™) at 950° C. for 70 min with $N_2$ flow rate 3.5 L/min. The $p^+$ doping was maintained until the boron diffusion profile with 300 nm junction depth. The 5 nm Cr/100 nm Au back contact, thermally grown 90 nm $SiO_2$ layer, and 100 nm Al layer were obtained using the same methods with other photoanodes. After the fabrication of $Al/SiO_2/p^+n$-Si structure, Al spiking was processed by annealing at 550° C. for 24 hours in a vacuum chamber, followed by Al etching Subsequently, 35% Ni coverage was obtained by electrodeposition at −3.0 V versus Ag/AgCl for 30 min.

Measurements of resistance change after Al spiking. To evaluate the resistance change after Al spiking, dual-sided $Al/SiO_2/Si/SiO_2/Al$ metal-insulator-semiconductor samples were prepared. At first, 90 nm $SiO_2$ layers were grown on both sides of prepared 2×2 $cm^2$ n-type Si substrates using a thermal oxidation furnace at 950° C. in dry $O_2$ ambient. Then, 100 nm Al films were also deposited on both sides of $SiO_2/Si/SiO_2$ substrates using DC magnetron sputtering. To induce localized Al spiking, $Al/SiO_2/Si/SiO_2/Al$ samples were annealed at 450° C., 500° C., 550° C., and 650° C. for annealing times ranging from 0 to 24 hours. Before and after each annealing process, the top and bottom Al layers were connected to anode and cathode, respectively, and linear sweep voltammetry (LSV) was performed for evaluating the resistance between top and bottom.

Photoelectrochemical measurements. All oxygen evolution reaction performances were measured using a CHI 760E electrochemical workstation (CH Instruments, Austin, United States) with a standard three-electrode electrochemical cell comprising Pt wire as a counter electrode and an Ag/AgCl reference electrode. The alkaline solution (pH=14) for the oxygen evolution reaction characterization comprised a 1 M KOH aqueous solution (semiconductor grade, Sigma-Aldrich, 99.99% trace metal basis). The measured potentials versus Ag/AgCl were converted to potential versus reversible hydrogen electrode (RHE) using the following equation:

$$E_{RHE}=E_{Ag/AgCl}+0.197\text{V}+0.059\times\text{pH} \quad (1)$$

The linear sweep voltammetry and chronoamperometry (CA) measurements were carried out for the photoanodes under 100 $mW/cm^2$ light illumination using Xenon arc lamp (66475, Newport) for characterization of oxygen evolution reaction efficiency and long-term stability tests. The $H_2$ and $O_2$ gas evolution were measured by $H_2$ and $O_2$ microsensors connected to a picoammeter (Unisense A/S, Denmark), respectively, in 1 M KOH solution at 1.23 V versus RHE under illumination. The faradaic efficiency (FE) of photoanode was calculated using the following equation (Jiang C et al. *Chemical Society Reviews* 2017, 46, 4645-4660):

$$FE = \frac{\text{Measured gas evolution}}{\text{Theoretical gas evolution}} = \frac{\text{Measured } O_2 \text{ evolution}}{\left(\frac{J_{photo} \times A \times T}{e} / 4\right) / N_A} \times 100\% \quad (2)$$

where $J_{photo}$ is the current density (A/cm$^2$), A is the illumination area (cm$^2$), T is the measurement time (sec), e is the charge of an electron ($1.602 \times 10^{-19}$ C), and $N_A$ is the Avogadro constant ($6.02 \times 10^{23}$ mol$^{-1}$).

Characterization. The surface morphologies of spiked $SiO_2$ and electrodeposited Ni surfaces were characterized using field emission scanning electron microscopy (Zeiss, USA). To evaluate the Ni electrodeposited surface, the diameters and surface coverage of Ni NPs were calculated using the "Image J" platform. The numerical simulations for the photoanodes were performed using the semiconductor module of a commercial numerical finite-element solver (COMSOL Multiphysics).

Example 2—Manufacturable Processes for Si-Based Metal-Insulator-Semiconductor Photoanodes for Solar-Driven Water Oxidation Si-based photoelectrodes have attracted substantial interest due to their potential for cost-effective conversion of water into clean fuel using solar energy. However, Si-based photoanodes for the oxygen evolution reaction (OER) are still challenging due to the requirements of large overpotential and low stability in alkaline solutions. To achieve high efficiency and long-term stability, metal-insulator-semiconductor (MIS) structures have been widely explored. In Si-based metal-insulator-semiconductor photoanodes, the insulator needs to prevent Si corrosion in alkaline solutions and also transport carriers efficiently. In this work, a series of highly manufacturable processes for fabricating Ni/$SiO_2$/Si metal-insulator-semiconductor photoanodes with $SiO_2$ insulating layers up to 90 nm thick and localized, non-lithographically fabricated Ni catalyst contacts are demonstrated. The resulting photoanode structures show high efficiency and long-term stability in alkaline solutions. Specifically, a Ni/$SiO_2$/n-Si photoanode yielded onset potential and photocurrent density of ~1.0 V versus RHE and ~25 mA/cm$^2$, respectively, while a Ni/$SiO_2$/$p^+$n-Si photoanode yielded an onset potential of 0.7 V versus RHE and saturation current density of 32 mA/cm$^2$, all in 1 M KOH alkaline solutions. Moreover, in stability testing in 1 M KOH aqueous solution, a constant photocurrent density of ~22.0 mA/cm$^2$ was maintained at 1.3 V versus RHE for 168 hours. This approach yields an enhancement in oxygen evolution reaction performance of Si-based metal-insulator-semiconductor photoanodes with highly manufacturable fabrication processes that are amenable to large-scale commercial fabrication.

Example 3—Process for Fabrication of Metal-Insulator-Semiconductor Photoelectrodes Described herein are devices, and methods for their fabrication, that can serve as stable, high performance photoelectrodes for electrochemical reactions powered by solar or other illumination sources. In brief, the device structure comprises a semiconductor (e.g., silicon, gallium arsenide, etc.) that serves as an efficient absorber of incident illumination, on top of which is an electrically insulating layer (e.g., silicon dioxide, titanium dioxide, etc.) through which local electrical contacts are created non-lithographically, and a catalyst material (e.g., nickel and nickel oxides, platinum, etc.) that electrically contacts or serves as the electrical contact through the electrically insulating layer and is also in contact with a liquid (typically aqueous) solution in which the electrochemical reaction is occurring. The prototypical application scenario is oxidation or reduction of water molecules to form oxygen or hydrogen, respectively, powered by solar illumination, but other reactions and illumination sources are possible. In this application, the semiconductor layer enables efficient absorption of illumination and conversion to mobile charge carriers (electrons and/or holes). An appropriate electrically insulating layer protects the semiconductor from corrosion or other degradation by the liquid solution in which the desired electrochemical reactions take place. The local electrical contacts through the insulating layer transport charge carriers from the semiconductor to the catalyst. The catalyst increases the rate at which the desired electrochemical reaction occurs.

The process for fabrication of the device structure comprises the following steps. (i) Selection of an appropriate semiconductor substrate material and, if desired, doping of a near-surface layer of the substrate to form a semiconductor pn junction using standard semiconductor doping processes. (ii) Formation of an electrically insulating layer atop the semiconductor by a standard process such as thin-film deposition or thermal oxidation. (iii) Deposition of a reactive material (e.g., aluminum or an aluminum-silicon alloy) as a thin film on top of the electrically insulating layer, and subsequent annealing to enable localized diffusion of the reactive material through the electrically insulating layer. The diffused reactive material creates a local electrical contact to the underlying semiconductor material. This process has been reported previously for formation of ohmic contacts to oxide-passivated silicon surfaces, but has not previously been applied for photoelectrochemical devices. (iv) Creation of the catalyst structure at localized regions either atop or in place of the local electrical contacts formed in step (iii). The catalyst structure can be formed by chemical reaction, electrodeposition, selective-area deposition, or another process. If replacement of the diffused reactive material by catalyst material is desired, e.g., to improve stability under operation, this can be accomplished by initial removal of the diffused reactive species followed by introduction of catalyst material, a chemical reaction in which the catalyst material replaces the diffused reactive material, or another process. Coverage of the device surface by the catalyst material is optimized to enable the optimal balance between available catalyst surface area and transmission of light into the semiconductor material for absorption and carrier generation.

Once fabricated, this device operates as follows. The device is placed with the oxide/catalyst surface in contact with the liquid solution in which the desired electrochemical reaction will occur. The oxide/catalyst surface is illuminated by light with an appropriate wavelength distribution (most commonly from the sun or a solar simulator). This illumination is absorbed in the semiconductor and the resulting photogenerated electrons or holes are transported to the catalyst at the device-liquid interface to participate in the desired electrochemical reaction, e g., generation of $H^+$ ions from $H_2O$ for reduction of $H_2O$, or generation of $OH^-$ ions from $H_2O$ for oxidation of $H_2O$. The complementary reaction then takes place at a counter electrode in the same solution or in an alternate solution, as is standard in electrochemical processes. The product atoms or molecules, e.g., $H_2$ or $O_2$ for water reduction or oxidation, can then be collected as an evolved gas.

The development and demonstration of a device structure and corresponding low-cost, highly scalable fabrication process for creating a stable, high-performance metal-insulator-semiconductor photoelectrode for electrochemical reactions powered by illumination is described herein. In particular, the device structure incorporates a thick insulating layer that provides excellent stability and allows the insulating layer to serve as an antireflective coating. The device and fabrication process are compatible with the use of silicon as the semiconductor, enabling low cost and leveraging the established technological base for silicon electronics. The fabrication process does not require any lithographic or other capital-intensive processes, enabling its implementation at very low cost, and is highly scalable to large manufacturing volumes. The fabrication process also yields a spatial distribution of electrical contacts through the insulating layer that is consistent with typical carrier diffusion and scattering lengths in crystalline semiconductors, and permits adequate transmission of light across the catalyst layer and into the semiconductor.

A fundamental issue plaguing conventional semiconductor photoelectrodes is that semiconductor materials that are efficient absorbers of solar illumination, e.g., silicon, are easily corroded in the liquid environment in which solar-driven photoelectrochemical reactions typically must occur. Incorporation of a wide-bandgap electrically insulating protective layer atop the semiconductor to separate the semiconductor from the solution has been explored quite extensively as an approach to improve stability, resulting in the development of metal-insulator-semiconductor (MIS) photoelectrodes. However, metal-insulator-semiconductor photoelectrodes must contend with the challenge of providing efficient transport of photogenerated carriers across the insulator to the catalyst (typically metal) at the device-liquid interface. The most typical solution is to use an extremely thin (few nanometers or less in thickness) insulating layer to facilitate tunneling by photogenerated carriers, but thin insulating layers are extremely likely to compromise stability, particularly over the long term. The approach reported herein enables the use of thick insulating layers with only localized carrier transport paths across the oxide, and in which those localized transport paths are protected from the solution by the catalyst material atop the transport path. This thick insulating layer provides excellent stability, and is promising for very long term stability.

The devices and methods described herein combine low cost and easily scalable fabrication processes with a high performance device structure that can exhibit excellent stability compared to more conventional metal-insulator-semiconductor photoelectrode structures.

The devices and methods have been have demonstrated for oxidation of water molecules. However, the devices and methods could also be used for realization of photoelectrodes for other electrochemical reactions powered by illumination, e.g., reduction of $CO_2$ to CO, or generation of other fuel molecules from suitable precursors via oxidation or reduction reactions.

The devices described herein can convert solar energy to a clean fuel source ($H_2$). In addition, the devices can enable clean production of hydrogen gas (in contrast to the standard process involving steam reforming of methane) so that it can be used by chemical processing companies.

Example 4—Low-Cost, High-Performance Silicon Metal-Insulator-Semiconductor Photoelectrode for Solar Water Splitting and Other Photoelectrochemical Reactions Solar powered water splitting and other photoelectrochemical reactions offer routes to the generation of hydrogen or other high-value chemicals using renewable energy sources. Commercially viable technologies for solar water splitting have been hampered by cost and the tendency of efficient solar absorbing materials, e.g., silicon or gallium arsenide, to degrade in the presence of water splitting reactions. Metal-insulator-semiconductor (MIS) photoelectrodes for solar water splitting offer a route to addressing the latter issue by covering the semiconductor with a chemically stable protective layer, but these layers are typically electrically insulating and block the flow of photogenerated electrons and/or holes to the surface of the device at which the water splitting reactions take place. The use of low-cost materials, such as silicon, combined with low-cost, scalable processes for photoelectrode fabrication offers a route to addressing the former issue. Successfully addressing these issues would provide a foundation for the development of a clean, economically viable technology for generation of hydrogen and other high-value chemicals for energy storage, transport, and chemical synthesis applications.

Described herein are device designs and fabrication processes that enable the creation of silicon-based metal-insulator-semiconductor photoelectrodes for solar water splitting with thick, extremely stable protective insulating layers, high photocurrent density, and favorable onset voltages using non-lithographic, low cost, highly scalable fabrication processes that are well established in semiconductor manufacturing.

This invention leverages established, low-cost, highly scalable silicon semiconductor process technology for fabrication of low cost, highly stable, high performance metal-insulator-semiconductor photoelectrodes for solar driven water splitting and other photoelectrochemical reactions. Photoanode devices demonstrated experimentally herein are fabricated from standard silicon wafers and incorporate thick (~90 nm) $SiO_2$ insulator layers and Ni-based catalysts, and with minimal optimization yield, in 1 M KOH aqueous solution under AM 1.5 G illumination from a solar simulator, photocurrent density of over 30 mA/cm$^2$ and onset voltage of 0.7 vs. RHE.

Experimentally demonstrated photoanodes to date yield excellent stability (no discernible degradation for maximum duration tests to date, ~168 hrs) and high performance (photocurrent density of over 30 mA/cm$^2$ and onset voltage of 0.7 vs. RHE under AM 1.5 G illumination from a solar simulator). Fabrication processes are low cost, based on established semiconductor manufacturing technologies with no need for any lithographic patterning, and easily scalable to high volumes.

Other advantages which are obvious and which are inherent to the invention will be evident to one skilled in the art. It will be understood that certain features and sub-combinations are of utility and may be employed without reference to other features and sub-combinations. This is contemplated by and is within the scope of the claims. Since many possible embodiments may be made of the invention without departing from the scope thereof, it is to be understood that all matter herein set forth or shown in the accompanying drawings is to be interpreted as illustrative and not in a limiting sense.

The methods of the appended claims are not limited in scope by the specific methods described herein, which are intended as illustrations of a few aspects of the claims and any methods that are functionally equivalent are intended to fall within the scope of the claims. Various modifications of the methods in addition to those shown and described herein are intended to fall within the scope of the appended claims. Further, while only certain representative method steps disclosed herein are specifically described, other combinations of the method steps also are intended to fall within the scope of the appended claims, even if not specifically recited. Thus, a combination of steps, elements, components, or constituents may be explicitly mentioned herein or less, however, other combinations of steps, elements, components, and constituents are included, even though not explicitly stated.

What is claimed is:

1. A photoelectrode comprising:

a light absorbing layer;

an insulator layer disposed on the light absorbing layer, wherein the insulator layer has an average thickness of 20 nanometers (nm) or more;

a set of protrusions, wherein each protrusion penetrates through the insulator layer to the light absorbing layer, such that each protrusion is in physical and electrical contact with the light absorbing layer; and a plurality of particles disposed on the insulator layer, wherein at least a portion of the plurality of particles are in physical and electrical contact with at least a portion of the set of protrusions;

wherein the plurality of particles and optionally the set of protrusions comprise a catalyst material;

wherein:

each of the protrusions in the set of protrusions has an average characteristic dimension that varies with the thickness of the insulator layer;

the set of protrusions are dispersed across the insulator layer laterally such that the set of protrusions within the insulator layer have an areal density of from $10^4$ to $10^{13}$ protrusions per $cm^2$ of the insulator layer;

the set of protrusions are dispersed throughout the insulator layer such that the set of protrusions within the insulator layer have an areal density of from $2\times10^8$ to $8\times10^8$ protrusions per $cm^2$ of the insulator layer;

or a combination thereof.

2. The photoelectrode of claim 1, wherein the light absorbing layer comprises silicon, gallium arsenide, AlGaAs, InP, InGaP, InAlP, AlP, InGaAsN, InGaAs, GaN, InGaN, AlInGaN, AlGaN, SiGe, SiC, CdTe, CdSe, ZnO, ZnSe, ZnTe, CdZnTe, $SnS_2$, $Zn_3P_2$, $ZnP_2$, $Zn_3As_2$, $TiO_2$, hybrid organic-inorganic perovskite compounds, copper oxides, $SrTiO_3$, $MoS_2$, GaSe, SnS, $CuInGaSe_2$, a-Si:H (hydrogenated amorphous silicon), bismuth vanadate ($BiVO_4$), iron oxide ($Fe_2O_3$), or a combination thereof.

3. The photoelectrode of claim 1, wherein the light absorbing layer comprises silicon.

4. The photoelectrode of claim 1, wherein the light absorbing layer has an average thickness of from 100 nanometers (nm) to 500 micrometers (microns, μm).

5. The photoelectrode of claim 1, wherein the light absorbing layer further comprises a doped layer having an average thickness of from 10 nm to 500 μm.

6. The photoelectrode of claim 1, wherein the light absorbing layer comprises Si with a buried pn junction.

7. The photoelectrode of claim 1, wherein the insulator layer comprises $SiO_2$, $TiO_2$, silicon nitride, silicon oxynitride, aluminum oxide, strontium titanate, tungsten oxide ($WO_3$), aluminum nitride, boron nitride, aluminum gallium nitride, or a combination thereof.

8. The photoelectrode of claim 1, wherein the insulator layer comprises $SiO_2$.

9. The photoelectrode of claim 1, wherein the insulator layer has an average thickness of 50 nm or more.

10. The photoelectrode of claim 1, wherein the catalyst material comprises a metal selected from the group consisting of Ni, Pt, Mo, Co, Ru, Ir, or a combination thereof.

11. The photoelectrode of claim 1, wherein the catalyst material comprises Ni.

12. The photoelectrode of claim 1, wherein the catalyst material comprises an oxygen evolution reaction catalyst.

13. The photoelectrode of claim 1, wherein each of the protrusions in the set of protrusions has an average characteristic dimension of from 0.1 nm to 1 μm.

14. The photoelectrode of claim 1, wherein each of the protrusions in the set of protrusions has an average characteristic dimension that varies with the thickness of the insulator layer.

15. The photoelectrode of claim 1, wherein the set of protrusions are dispersed across the insulator layer laterally such that the set of protrusions within the insulator layer have an areal density of from $10^4$ to $10^{13}$ protrusions per $cm^2$ of the insulator layer.

16. The photoelectrode of claim 1, wherein the set of protrusions are dispersed throughout the insulator layer such that the set of protrusions within the insulator layer have an areal density of from $2\times10^8$ to $8\times10^8$ protrusions per $cm^2$ of the insulator layer.

17. The photoelectrode of claim 1, wherein the plurality of particles have an average particle size of from 5 nm to 50 μm.

18. The photoelectrode of claim 1, wherein the plurality of particles and/or the set of protrusions cover from 5% to 80% of a top surface of the insulator layer.

19. A device comprising the photoelectrode of claim 1.

* * * * *